US012009283B2

(12) United States Patent
Agonafer et al.

(10) Patent No.: US 12,009,283 B2
(45) Date of Patent: Jun. 11, 2024

(54) METHODS AND SYSTEMS FOR EVAPORATION OF LIQUID FROM DROPLET CONFINED ON HOLLOW PILLAR

(71) Applicant: Washington University, St. Louis, MO (US)

(72) Inventors: Damena Agonafer, St. Louis, MO (US); Binjian Ma, St. Louis, MO (US); Li Shan, St. Louis, MO (US); Patricia Weisensee, St. Louis, MO (US); John Mark Meacham, St. Louis, MO (US)

(73) Assignee: Washington University, St. Louis, MO (US)

( * ) Notice: Subject to any disclaimer, the term of this patent is extended or adjusted under 35 U.S.C. 154(b) by 486 days.

(21) Appl. No.: 17/267,539

(22) PCT Filed: Aug. 23, 2019

(86) PCT No.: PCT/US2019/047982
§ 371 (c)(1),
(2) Date: Feb. 10, 2021

(87) PCT Pub. No.: WO2020/041749
PCT Pub. Date: Feb. 27, 2020

(65) Prior Publication Data
US 2021/0313247 A1    Oct. 7, 2021

Related U.S. Application Data

(60) Provisional application No. 62/863,055, filed on Jun. 18, 2019, provisional application No. 62/826,293, (Continued)

(51) Int. Cl.
*H01L 23/427*    (2006.01)
*H05K 7/20*    (2006.01)
(Continued)

(52) U.S. Cl.
CPC ........ *H01L 23/427* (2013.01); *H01L 23/3735* (2013.01); *H01L 25/0655* (2013.01); *H05K 7/20318* (2013.01); *H05K 7/20327* (2013.01)

(58) Field of Classification Search
CPC .................................................... H01L 23/467
See application file for complete search history.

(56) References Cited

U.S. PATENT DOCUMENTS 5,239,443 A * 8/1993 Fahey ................. H01L 23/4735
361/689
6,196,307 B1    3/2001 Ozmat
(Continued)

FOREIGN PATENT DOCUMENTS

WO    2014141071 A1    9/2014
WO    2018013562 A1    1/2018

OTHER PUBLICATIONS

Adera, S. et al., "Hotspot thermal management via thin-film evaporation," 2016 15th IEEE Intersociety Conference on Thermal and Thermomechanical Phenomena in Electronic Systems (ITherm), Las Vegas, NV, 2016, pp. 364-371, DOI: 10.1109/ITHERM.2016. 7517572.
(Continued)

*Primary Examiner* — Robert J Hoffberg
(74) *Attorney, Agent, or Firm* — Armstrong Teasdale LLP

(57) ABSTRACT

A heat exchanger for thermal management of an electronic device includes a liquid delivery layer thermally coupled to the electronic device and configured to receive a liquid from a source. The heat exchanger also includes an evaporation layer comprising hollow pillars configured to receive a continuous flow of the liquid from the liquid delivery layer and evaporate the continuous flow of the liquid from droplets maintained on the hollow pillars. Each hollow pillar has an evaporation surface and a pore configured to channel the continuous flow of the liquid through the hollow pillar to the
(Continued)

evaporation surface. The evaporation surface being configured to maintain a droplet on the respective hollow pillar within a contact line. The evaporation surface has a wetting efficiency of at least about 95% and the contact line has a length of less than about 0.0314 mm.

13 Claims, 39 Drawing Sheets

Related U.S. Application Data filed on Mar. 29, 2019, provisional application No. 62/722,469, filed on Aug. 24, 2018.

(51) Int. Cl.
*H01L 23/373* (2006.01)
*H01L 25/065* (2023.01)

(56) References Cited

U.S. PATENT DOCUMENTS

| | | | |
|---|---|---|---|
| 6,903,929 B2 | 6/2005 | Prasher et al. | |
| 7,806,168 B2 | 10/2010 | Upadhya et al. | |
| 7,940,527 B2 * | 5/2011 | Krause | H01L 23/473 |
| | | | 174/15.1 |
| 8,272,431 B2 | 9/2012 | Campagna et al. | |
| 8,464,781 B2 | 6/2013 | Kenny et al. | |
| 8,701,927 B2 | 4/2014 | Rubner et al. | |
| 8,780,558 B2 | 7/2014 | Miller et al. | |
| 8,797,741 B2 | 8/2014 | Altman | |
| 8,807,203 B2 * | 8/2014 | MacDonald | F28D 15/046 |
| | | | 165/104.21 |
| 9,352,500 B2 | 5/2016 | Lee et al. | |
| 9,423,192 B2 | 8/2016 | Tsoi et al. | |
| 9,437,372 B1 | 9/2016 | Zhamu et al. | |
| 9,646,735 B2 | 5/2017 | Adamson et al. | |
| 9,835,363 B2 | 12/2017 | Xiao et al. | |
| 9,945,027 B2 | 4/2018 | Farquhar et al. | |
| 2011/0277491 A1 | 11/2011 | Wu et al. | |
| 2012/0137718 A1 | 6/2012 | Uchida et al. | |
| 2012/0328789 A1 | 12/2012 | Lu et al. | |
| 2015/0375997 A1 | 12/2015 | Chu et al. | |
| 2016/0019995 A1 | 1/2016 | Zhamu et al. | |
| 2016/0033212 A1 | 2/2016 | Wang et al. | |
| 2016/0141866 A1 | 5/2016 | Bromberg et al. | |
| 2016/0295742 A1 | 10/2016 | Moghaddam et al. | |
| 2016/0322143 A1 | 11/2016 | Staines et al. | |
| 2017/0145561 A1 | 5/2017 | Farquhar et al. | |
| 2017/0145562 A1 | 5/2017 | Farquhar et al. | |
| 2017/0200565 A1 | 7/2017 | Zhamu et al. | |
| 2017/0373044 A1 | 12/2017 | Das et al. | |
| 2018/0031330 A1 | 2/2018 | Roberts et al. | |
| 2021/0303760 A1 * | 9/2021 | Agonafer | G06F 30/23 |

OTHER PUBLICATIONS

Agonafer, D. et al., "Porous Micropillar Structures for Retaining Low Surface Tension Liquids,", Journal of Colloid and Interface Science, 514: 316-327 (2018) DOI: 10.1016/j.jcis.2017.12.011.

Agonafer, D. et al. "Burst behavior at a capillary tip: Effect of low and high surface tension." Journal of Colloid and Interface Science 455: 1-5 (2015), DOI 10.1016/j.jcis.2015.05.033.

Lu, Z. et al. "An Ultrathin Nanoporous Membrane Evaporator." Nano Letters, 17(10): 6217-6220 (2017), https://doi.org/10.1021/acs.nanolett.7b02889.

Palko, J. et al. "Extreme Two-Phase Cooling from Laser-Etched Diamond and Conformal, Template-Fabricated Microporous Copper," Advanced Functional Materials, 27(45), 8 pages (2017), DOI: 10.1002/adfm.201703265.

Palko, J. et al. Supporting Information "Extreme Two-Phase Cooling from Laser-Etched Diamond and Conformal, Template-Fabricated Microporous Copper," Advanced Functional Materials, 27(45), 8 pages (2017), DOI: 10.1002/adfm.201703265.

Raj, R. et al., "High-Resolution Liquid Patterns via Three-Dimensional Droplet Shape Control," Nature Communications, 5: 4975, 8 pages (2014). DOI: 10.1038/ncomms5975.

Saenz, P. et al., "Dynamics and Universal Scaling Law in Geometrically-Controlled Sessile Drop Evaporation," Nature Communications, 8(1): 1-9 (2017).

Schultz, M. et al. "Embedded two-phase cooling of large 3D compatible chips with radial channels." Proceedings of ASME InterPACK/ICNMM2015-48348, 6 pages (2015).

Shuai, S. et al., "Numerical Investigation of Shape Effect on Microdroplet Evaporation," Proceedings of the ASME 2018 International Technical Conference and Exhibition on Packaging and and Integration of Electronic and Photonic Microsystems, IPACK 2018-8311, Inter PACK2018, Aug. 28-30, 2018, San Francisco, CA.

International Search Report and Written Issued for Application No. PCT/US2019/047982 dated Nov. 14, 2019 (7 pages).

\* cited by examiner

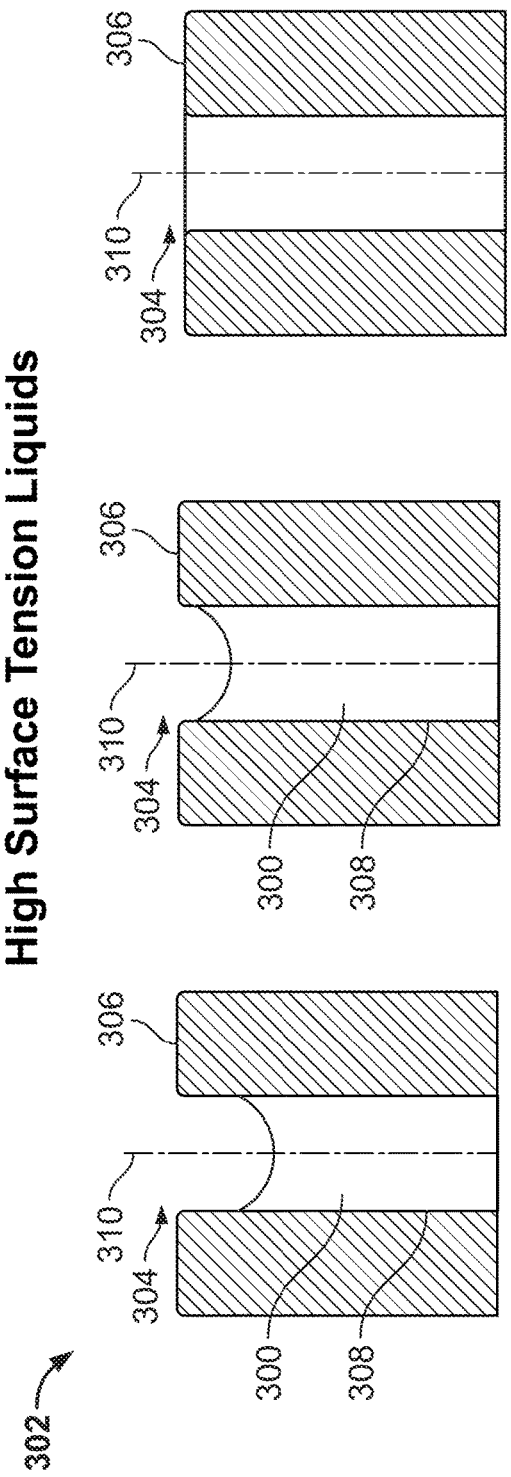

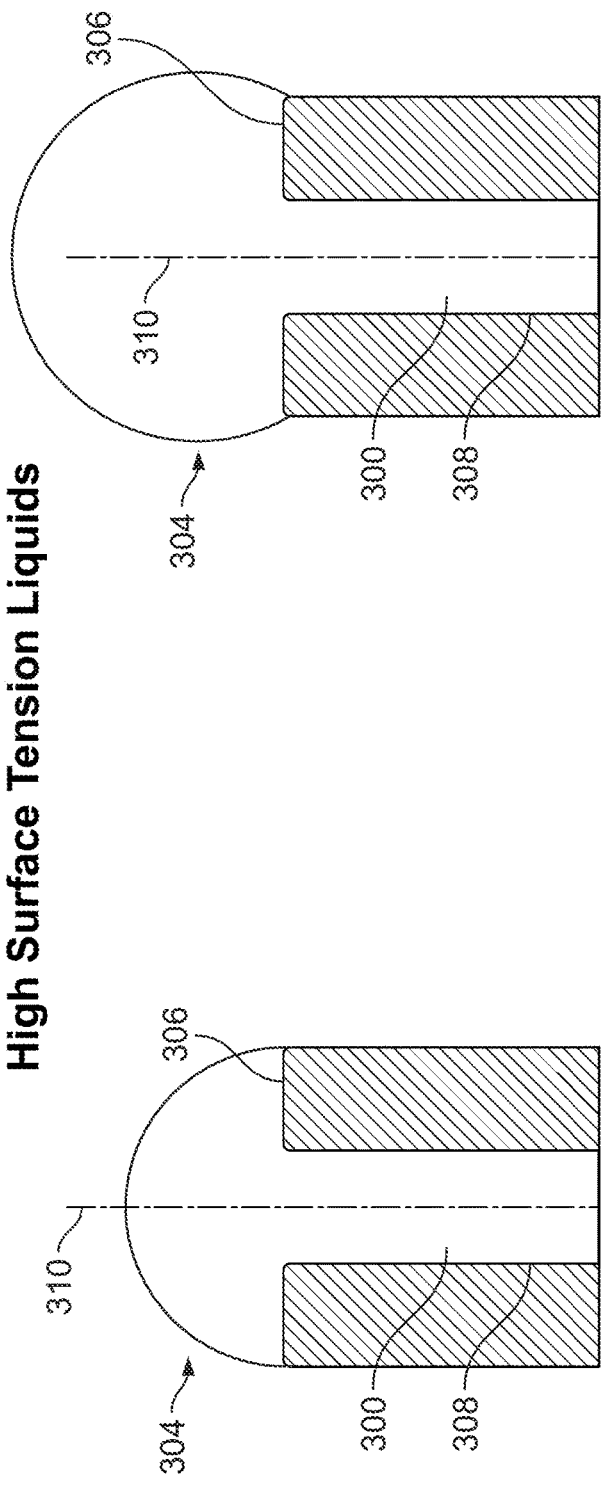
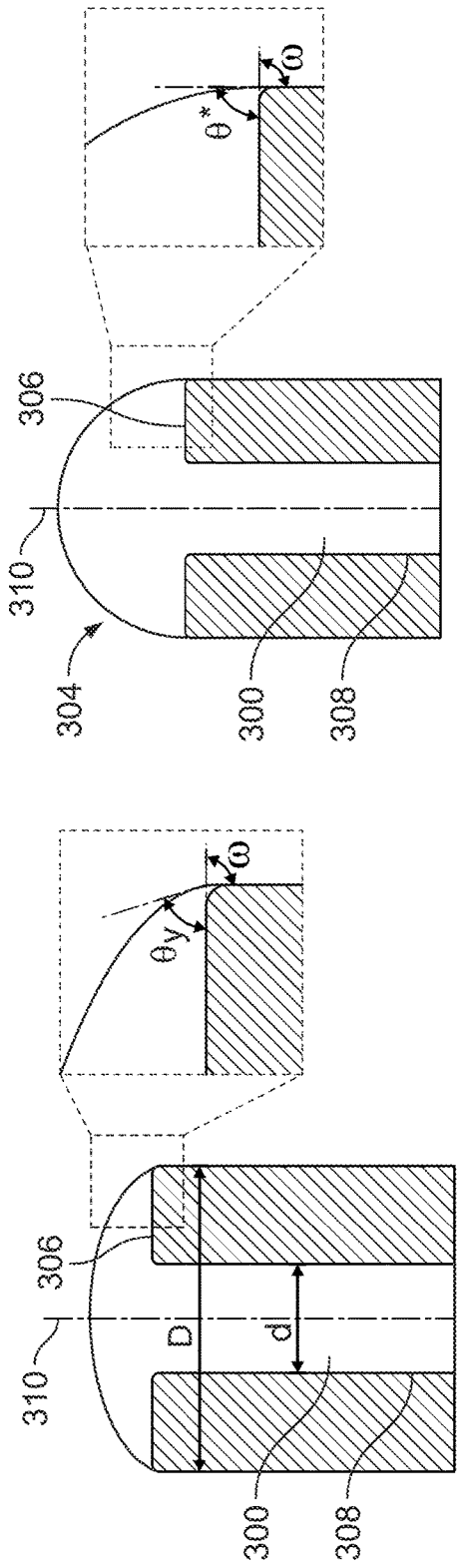

Low Surface Tension Liquids

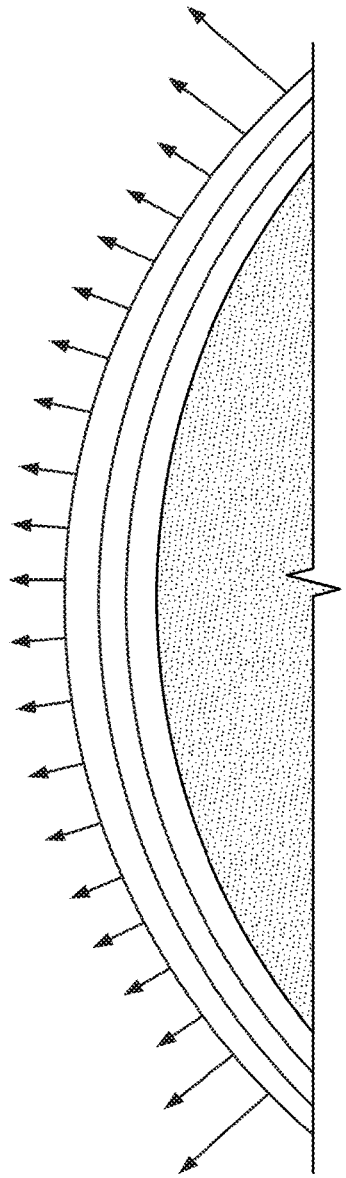
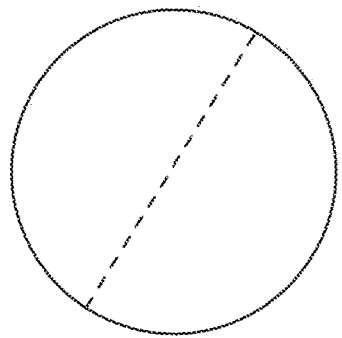
Circular Droplet
FIG. 11
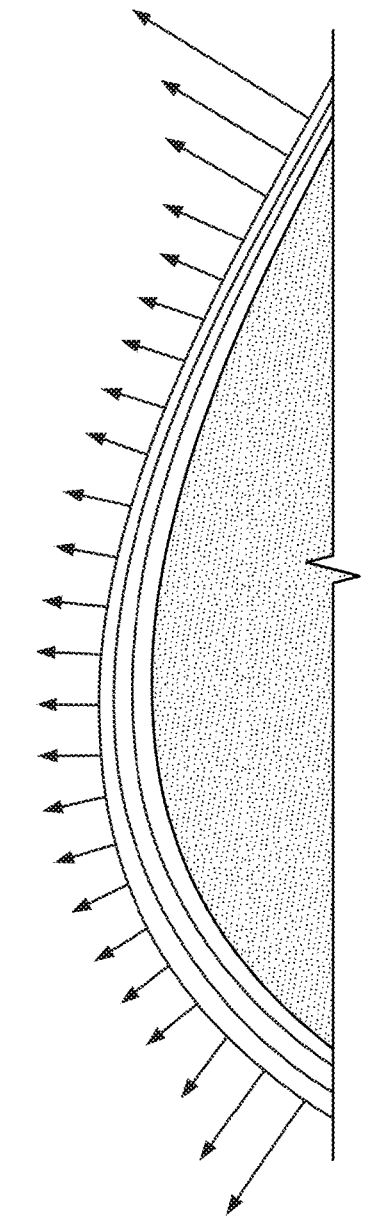
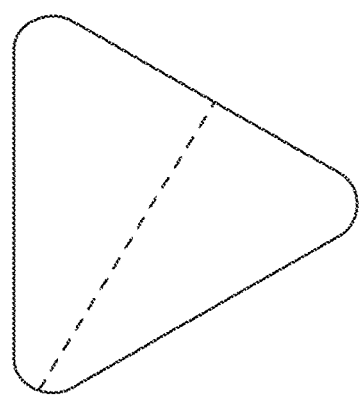
Triangular Droplet
FIG. 12

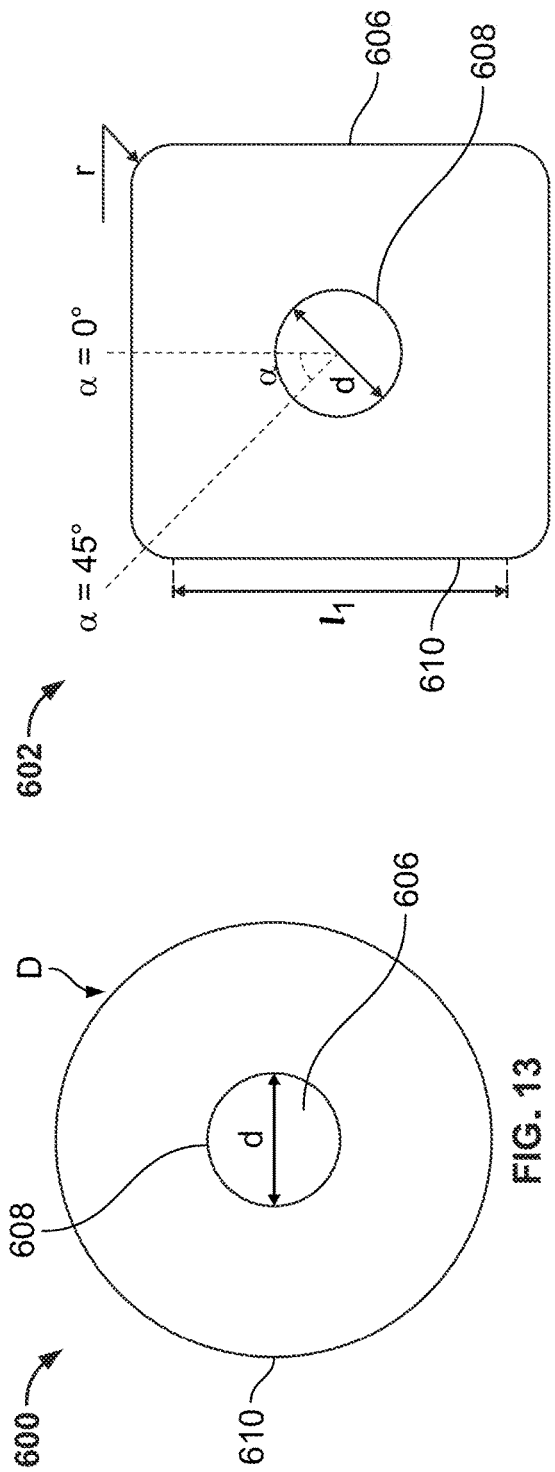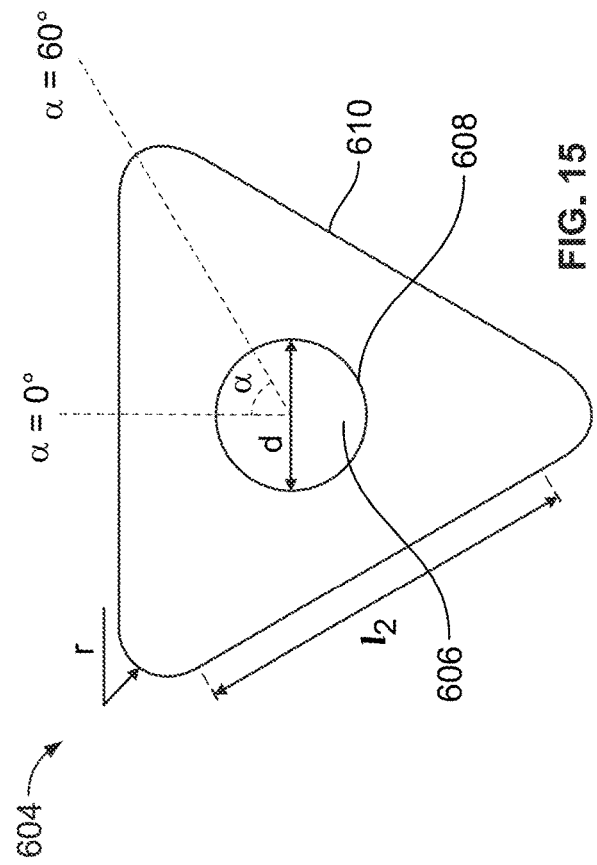

ly high amounts of heat generated by electronic devices. Moreover, design aspects of electronic devices such as shape and size are limited at least in part by the capabilities and sizes of the thermal management systems.

METHODS AND SYSTEMS FOR EVAPORATION OF LIQUID FROM DROPLET CONFINED ON HOLLOW PILLAR

This application is a U.S. National Phase Application of PCT/US2019/047982, filed Aug. 23, 2019, which claims priority to U.S. Provisional Application No. 62/722,469, filed Aug. 24, 2018, U.S. Provisional Application No. 62/826,293, filed Mar. 29, 2019, and U.S. Provisional Application No. 62/863,055, filed Jun. 18, 2019, the contents of which are hereby incorporated herein by reference in their entirety.

GOVERNMENT SUPPORT

This invention was made with government support under 1943468 awarded by the National Science Foundation. The government has certain rights in the invention.

FIELD

The field of the disclosure relates generally to evaporation of liquid. More specifically, the field of the disclosure relates to systems and methods for evaporation of a liquid from a droplet confined on a hollow pillar.

BACKGROUND

Current electronic devices include multiple electronic components that are integrated into single assemblies to provide faster signal communication and a tighter footprint than prior devices. Advancements in the integration of electronic components have led to higher generation of heat in confined spaces of the electronic devices. For example, some current electronic devices generate heat exceeding 1 kW cm$^{-2}$ (⅕ of the solar radiation at the surface of the sun). Accordingly, at least some electronic devices include thermal management systems configured to dissipate the heat generated by the electronic components during operation of the devices. However, current thermal management systems have not been completely satisfactory in dissipating the relatively high amounts of heat generated by electronic devices. Moreover, design aspects of electronic devices such as shape and size are limited at least in part by the capabilities and sizes of the thermal management systems.

Two-phase liquid cooling, such as droplet evaporation, utilizes a latent heat of vaporization to remove excessive heat and can provide higher efficiency and a greater heat dissipation rate compared to single-phase cooling techniques. For example, compared to boiling heat transfer, where the formation and growth of vapor bubbles must overcome an energy barrier associated with nucleation and a capillary force acting on the convex liquid-vapor interface, evaporation from a droplet can facilitate much higher heat transfer by direct mass transport from the bulk liquid to the bulk vapor domain. In addition, two-phase liquid cooling provides a relatively small thermal resistance (<0.1 K-cm$^2$/W). In addition to two-phase heat exchangers, droplet evaporation facilitates a diverse range of applications including spray coating, inkjet printing, DNA sequencing, and bio-sensing. Typical droplet evaporation systems utilize spherical droplets which are axisymmetric. Moreover, at least some known systems rely on polar liquids such as water to function and are not compatible with dielectric liquids.

Accordingly, there is a need for an improved thermal management system that is able to dissipate the increasing amount of heat generated by electronic components. Also, there is a need for a droplet evaporation system that provides increased heat transfer efficiency in comparison to prior systems. In addition, there is a need for a thermal management system that utilizes dielectric liquids.

BRIEF DESCRIPTION OF THE DISCLOSURE

In one aspect, a heat exchanger for thermal management of an electronic device includes a liquid delivery layer thermally coupled to the electronic device and configured to receive a liquid from a source. The heat exchanger also includes an evaporation layer comprising hollow pillars configured to receive a continuous flow of the liquid from the liquid delivery layer and evaporate the continuous flow of the liquid from droplets maintained on the hollow pillars. Each hollow pillar has an evaporation surface and a pore. The pore is configured to channel the continuous flow of the liquid through the hollow pillar to the evaporation surface. The evaporation surface is configured to maintain a droplet on the respective hollow pillar within a contact line. The evaporation surface has a wetting efficiency of at least about 95% and the contact line has a length of less than about 0.0314 mm.

In another aspect, an evaporation layer for evaporating a liquid includes a first surface configured receive a continuous flow of liquid from a liquid delivery layer, a second surface opposite the first surface, and a plurality of hollow pillars extending from the second surface and configured to evaporate the continuous flow of the liquid received from the liquid delivery layer through droplets maintained on the hollow pillars. Each hollow pillar has an evaporation surface and a pore configured to channel the continuous flow of the liquid from the first surface to the evaporation surface. Each evaporation surface has a wetting efficiency of at least about 95%, and is configured to maintain a droplet on the respective hollow pillar within a contact line. The contact line has a length of less than about 0.0314 mm.

In yet another aspect, hollow pillar for evaporating a continuous flow of liquid includes a stem defining a pore that channels the liquid through the hollow pillar, and a head having an evaporation surface configured to receive the liquid from the pore. The pore is positioned in the center of the evaporation surface such that the liquid wicks radially outward from the pore and forms a droplet that is convex. Each evaporation surface has a wetting efficiency of at least about 95%, and is configured to maintain a droplet on the respective hollow pillar within a contact line having a length of less than about 0.0314 mm.

In still another aspect, a method of evaporating a liquid includes providing a flow of liquid to an evaporation layer comprising hollow pillars. Each hollow pillar has an evaporation surface and a pore configured to channel the continuous flow of the liquid to the evaporation surface. The method also includes maintaining a droplet on each of the hollow pillars. Each evaporation surface has a wetting efficiency of at least about 95% is configured to maintain the droplet on the respective hollow pillar within a contact line the contact line having a length of less than about 0.0314 mm. The method further includes evaporating the flow of the liquid from a surface of the droplet maintained on each hollow pillar.

DESCRIPTION OF DRAWINGS

The drawings described below illustrate various aspects of the disclosure.

FIG. 11 is a schematic drawing of the curvature and vapor concentration line of a droplet on a circular evaporation surface.

FIG. 12 is a schematic drawing of the curvature and vapor concentration line of a droplet on a triangular evaporation surface.

FIG. 13 is a top view of a hollow pillar having a circular cross-sectional shape.

FIG. 14 is a top view of a hollow pillar having a square cross-sectional shape.

FIG. 15 is a top view of a hollow pillar having a triangular cross-sectional shape.

FIG. 43 is a graph of analytically predicted liquid pressure variation as liquid flows through a single hollow micropillar.

DETAILED DESCRIPTION

Figure 1:
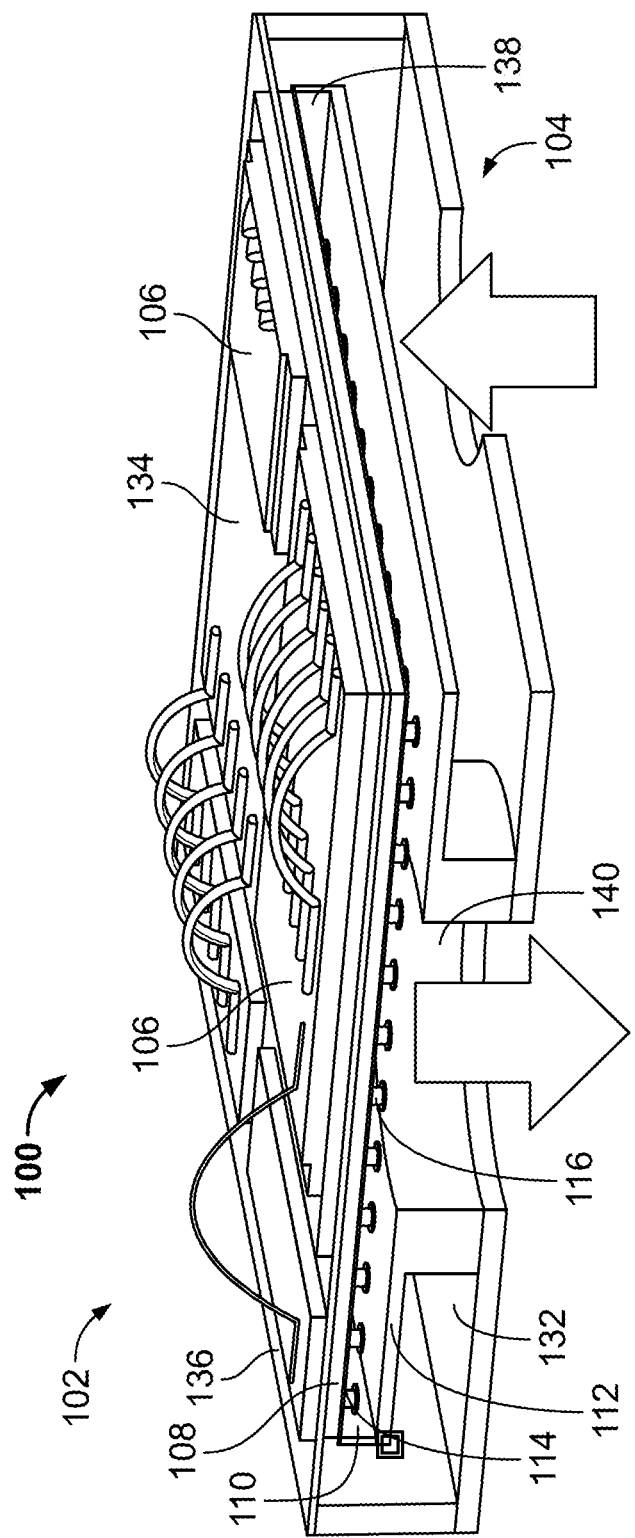
FIG. 1 is a schematic illustration of a portion of an electronic device and a thermal management system.

As used herein, the terms "microstructure" and "micro" refer to structures having dimensions less than about 1 millimeter (mm). For example, microstructure heat exchangers include heat exchangers in which at least one fluid flows in lateral confinements with an average dimension of less than about 1 mm. While some embodiments herein include microstructures, it is understood that the principles may be applied to larger scale structures without departing from some aspects of the disclosure.

In various aspects, phase routing evaporative microstructure heat exchanger systems and elements thereof, methods of assembling the elements to produce the phase routing evaporative microstructure heat exchanger systems, methods of producing the system elements, 2D and 3D packaged electronics incorporating the phase routing evaporative microstructure heat exchanger systems, and methods of cooling 2D and 3D packaged electronics using the phase routing evaporative microstructure heat exchanger systems are disclosed.

Embodiments of the microstructure heat exchanger systems include features configured to generate and maintain a plurality of droplets on one or more evaporative surfaces, enabling significantly higher heat exchange coefficients compared to existing heat exchanger systems and devices. In various aspects, the disclosed microstructure heat exchanger systems include porous membranes provided with arrays of micropillars configured to generate and maintain single droplets on each micropillar of the array. In some aspects, each micropillar is provided with features to further enhance the heat dissipative properties of each micropillar droplet including, but not limited to, at least one additional re-entrant surface feature and nanocoatings.

Moreover, in some aspects, at least one of the micropillars has a non-circular shape and produces a non-spherical droplet. Evaporation from the non-spherical droplet, due to the change in meniscus curvature, exhibits very different interfacial mass transport features from spherical droplets. For example, the non-spherical droplet has a higher local vapor concentration gradient that drives faster vapor diffusion at more curved regions. For adiabatic systems, the total evaporation rate from a triangular-based droplet is enhanced by 13% compared to a spherical droplet with the same perimeter and liquid-vapor interfacial area. For microdroplets on heated pillars, triangular-based droplets provide a higher heat transfer coefficient than spherical droplets at a supplied heat flux of 500 W/cm$^2$.

Also, surfaces with nanocoatings have been shown to improve two-phase heat transfer performance through enhanced wettability and reduced interfacial thermal resistance in comparison to surfaces without nanocoatings. There is a direct relationship between the surface wettability and the interfacial thermal transport property for an evaporating thin film liquid. Specifically, nanocoatings on an evaporative surface may increase wettability and reduce interfacial thermal resistance. As a result, the nanocoatings may reduce the evaporation rate of liquid on the surface. For example, compared to a pure silicone substrate, addition of one and three layers of graphene reduces the evaporation rate by 38% and 62% times, respectively, with the same temperature gradient between hot and the cold sources. In addition, an equilibrated contact angle of argon is increased from 7° to 17° with increasing number of graphene layers.

Various aspects of the heat exchanger systems, hollow pillars, and nanocoatings are described in additional detail below.

FIG. 1 is a schematic illustration of a portion of an electronic device 100 and a thermal management system 102. The thermal management system 102 includes a heat exchanger 104 including a liquid delivery layer 108 and an evaporation layer 110. The heat exchanger 104 is thermally coupled to at least one electronic component 106 of the electronic device 100 and is configured to remove heat from the electronic component 106 via a heat transfer medium. In the illustrated embodiment, the liquid delivery layer 108 is thermally coupled to the electronic device 100 such that the heat transfer medium receives heat from the electronic component 106. Suitably, the heat transfer medium may be a phase changing fluid and the heat exchanger 104 may operate as a two-phase cooling system. In other embodiments, the heat exchanger 104 may utilize a different cooling method such as single-phase cooling and/or air cooling without departing from some aspects of this disclosure.

Figure 2:
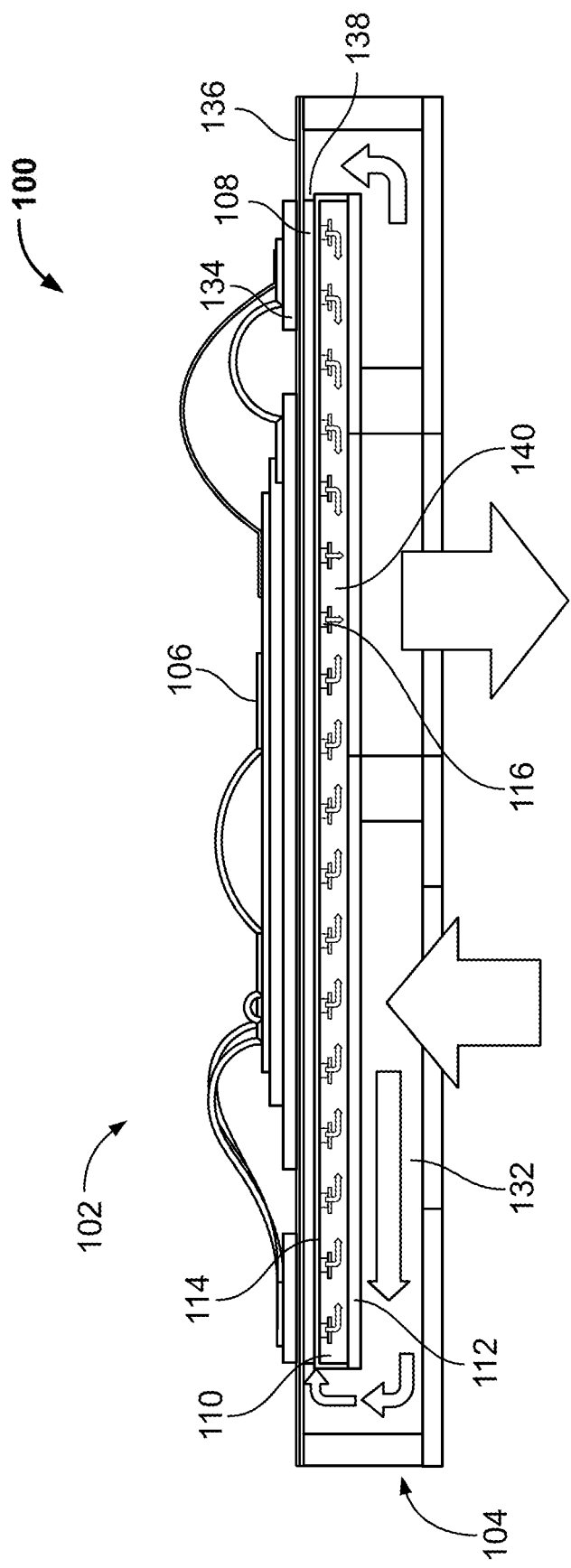
FIG. 2 is a cross-sectional view of the electronic device shown in FIG. 1 and the thermal management system shown in FIG. 1, illustrating fluid flow through the thermal management system.
Figure 3:
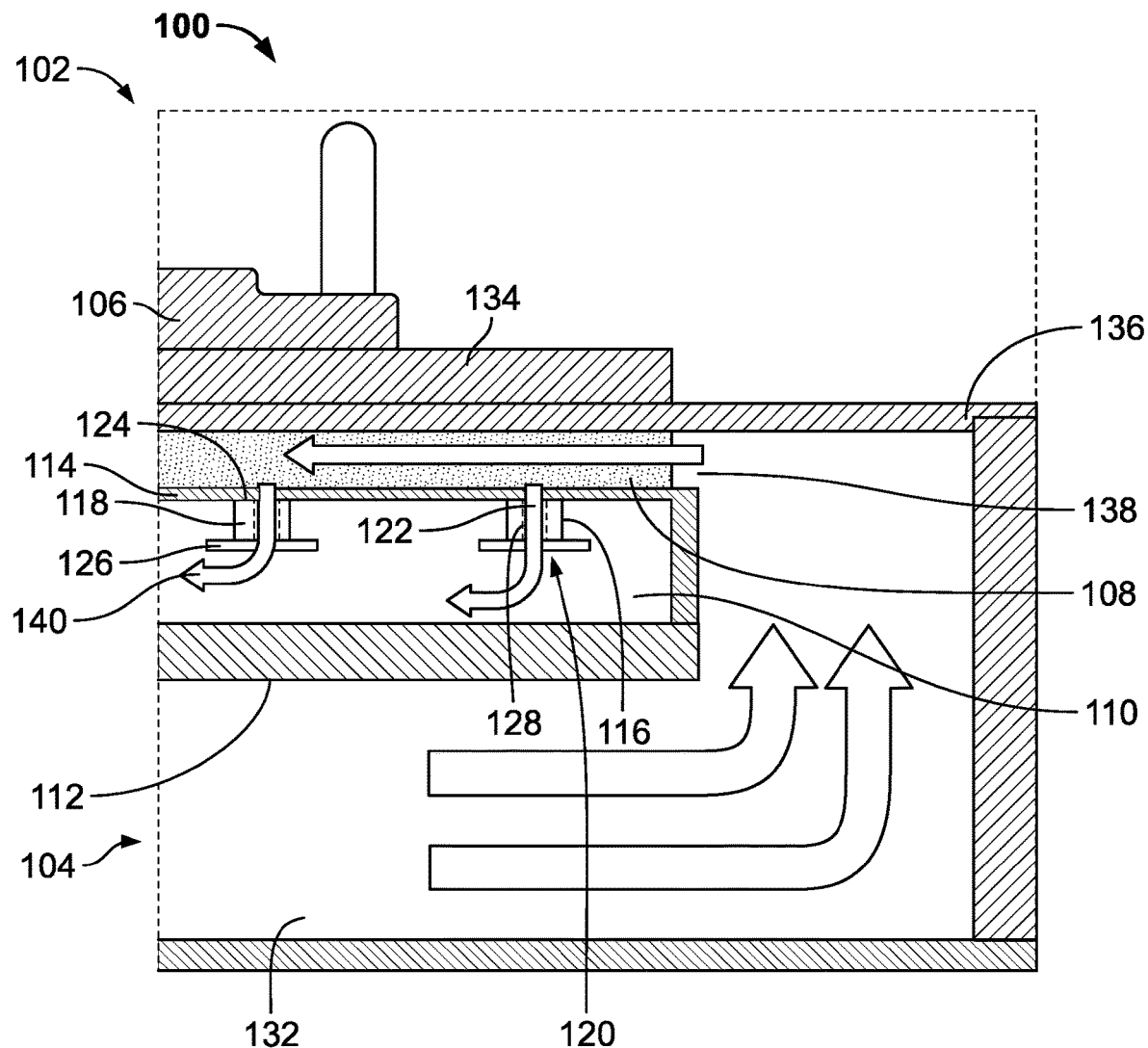
FIG. 3 is an enlarged cross-sectional view of the thermal management system shown in FIGS. 1 and 2, illustrating evaporation of liquid from pillars.

With reference to FIGS. 2 and 3, the evaporation layer 110 includes a first surface 112 coupled to the liquid delivery layer 108, a second surface 114 opposite the first surface 112, and a plurality of hollow pillars 116 extending from the second surface. Each hollow pillar 116 includes a stem 118, an evaporation surface 120, and a pore 122. Each stem 118 has a proximal end 124 joined to the second surface 114 and a distal end 126 opposite the proximal end 124. Each pore 122 extends through the stem 118 from the proximal end 124 to the distal end 126 and is configured to channel liquid received from the liquid delivery layer 108 through the stem 118 to the evaporation surface 120.

Each evaporation surface 120 is on the distal end 126 of the stem 118 of one of the hollow pillars 116. In some embodiments, the evaporation surfaces 120 may be annular surfaces on a rim of the stems 118. For example, the evaporation surfaces 120 may be defined solely by the thickness of the wall 128. In other embodiments, at least one evaporation surface 120 may be defined by a flange or cap extending around the wall 128 and/or extending radially inward from the wall 128. Such a flange or cap may at least partially form a head of the hollow pillar 116.

The hollow pillars 116 are configured to receive the continuous flow of the liquid from the liquid delivery layer 108 and evaporate the continuous flow of liquid from droplets maintained on the evaporation surfaces 120. Each evaporation surface 120 has a wetting efficiency and is configured to maintain a droplet on the respective hollow pillar within a contact line where the meniscus meets the evaporation surface 120. The contact line may have a length of less than about 0.0314 mm. In some embodiments, the wetting efficiency is at least about 95%. In addition, a non-circular evaporation surface 120 has a perimeter-to-area ratio that is at least 10% greater than the area of a circular surface, as a percentage of the circular area.

At least one of the hollow pillars 116 may have a non-circular cross-sectional shape. For example, the hollow pillars 116 may have a cross-sectional shape that is square, rectangular, triangular, star-shaped, polygonal, star-shaped polygon, airfoil shaped, streamline shaped, and any other suitable non-axisymmetric shapes. Accordingly, the hollow pillars 116 may be non-axisymmetric and may provide non-spherical droplets. As described further herein, the shape of the hollow pillars 116 controls the pinning of the droplets and may be designed to control the evaporation and/or heat transfer of the droplets.

For example, a droplet with a square or a triangle cross-sectional shape yields a larger contact line length and therefore a greater portion of thin film region, due to the larger perimeter-to-solid liquid interfacial area ratio of non-circular shapes such as triangles and squares compared to circles. For droplets evaporating on a circular micropillar, the total evaporating area along the liquid-vapor interface is distributed uniformly across different film thicknesses. In contrast, the fraction of the total evaporating area possessing a smaller film thickness is significantly higher for a non-circular droplet. Correspondingly, the fraction of the total liquid-vapor interfacial area evaporating with a large liquid thickness (e.g., greater than 95% of the maximum droplet height) is also reduced as the shape of the droplet contact line changes from circle to square and triangle.

A change in the distribution of the liquid-vapor interfacial area over different film thickness, e.g., by changing the shape of the hollow pillar 116, results in a substantial change in the total thermal resistance of the droplet because the conduction resistance inside the droplet is proportional to the liquid film thickness. Specifically, the effective film thickness and conduction resistance of the evaporating droplet are reduced when the shape of the droplet contact line is changed from circle to a square and from a circle to a triangle.

In addition, the local evaporation rate is affected significantly by several factors including the area fraction of the thin film region, the local curvature, the interfacial temperature, and the wall confinement effect. Non-spherical droplets exhibit sharper curvatures near both the contact line (i.e., r/R~1) and the corner regions (i.e., locations with a higher azimuth angle). At locations with a small apparent contact angle θa, the percentage of evaporating liquid-vapor area with smaller film thickness (e.g., less than 10% of the maximum droplet height) is higher, resulting in a smaller effective thickness across the droplet. The average heat transfer coefficients for triangular and square microdroplets with a heat flux of 500 W/cm$^2$ are 15% and 21% higher than the average heat transfer coefficient for a capped spherical droplet with a heat flux of 500 W/cm$^2$. When the heat flux is increased from 500 W/cm$^2$ to 1000 W/cm$^2$, the conduction resistance is the dominant resistance during the evaporation process.

Moreover, triangular microdroplets have a higher heat transfer performance compared to circular microdroplets at a constant temperature. For example, for microdroplets evaporating on a substrate at 60° C., the evaporation flux of microdroplets on a triangular micropillar is 8% larger than the microdroplets on a square micropillar and 45% larger than the microdroplets on a circular micropillar. When the substrate temperature is raised to 98° C., the enhancement in the heat transfer coefficient for the microdroplet evaporating on a triangular micropillar is 46% larger than the microdroplets on a square micropillar and 71% larger than the microdroplets on a circular micropillar.

Also, each hollow pillar 116 has a height defined between the proximal end 124 and the distal end 126 of the stem 118. The height of the hollow pillar 116 provides a diffusive space below the droplet and an increase in the total evaporation rate of the pillar in comparison to structures with lesser heights or droplets confined on substantially flat surfaces. For example, a ratio of the height of at least one hollow pillar 116 to a width of the hollow pillar may be in a range of about 0.1 to about 20 depending on the working conditions of the heat exchanger. In some embodiments, the height of the hollow pillar 116 is determined based on the temperature condition of the hollow pillar 116 to provide a desired evaporation rate. For example, in some embodiments, the hollow pillar 116 may reach approximately 98° Celsius during operation and the height of the hollow pillar may be selected to provide a desired evaporation rate at a 98° Celsius operating temperature of the hollow pillar. Moreover, the height may be determined to balance a conduction resistance of the poruous pillar 116 which increases when the height increases and a diffusion transport resistance of the droplet which decreases when the height of the hollow pillar increases.

In some embodiments, the thermal management system 102 includes microstructures and the heat exchanger 104 is configured to function as a microheat exchanger. For example, the height of each hollow pillar 116 may be less than about 1 millimeter. In some embodiments, the height of at least one hollow pillar 116 is in a range of about 1 nanometer to about 100 micrometers.

Also, in some embodiments, the liquid provided by the liquid delivery layer 108 is dielectric. Accordingly, the heat exchanger 104 may be used with sensitive electronic components 106 without risk of the liquid damaging the components. As described further herein, the configuration of the hollow pillars 116 enables the use of low surface tensions fluids such as dielectric liquids because the hollow pillars are able to maintain and evaporate droplets of dielectric liquids.

During operation of the heat exchanger 104, the heat transfer medium is used to remove heat from the electronic components 106. At least some of this heat is dissipated as the droplets evaporate. In addition, at least some of this heat is transferred through the evaporation layer 110 as the liquid is provided by the liquid delivery layer 108. Accordingly, the hollow pillars may be heated to temperatures greater than ambient temperature. The higher temperature provides a higher evaporation rate and higher heat transfer performance than materials at ambient temperature. The temperature is controlled to be less than the saturation temperature to prevent boiling of the liquid. For example, in some embodiments, at least one of the hollow pillars 116 is heated to a temperature close to the saturation temperature of the working liquid (98° Celsius for water at atmosphere).

As the liquid is provided to the evaporation layer 110, the liquid evaporates continuously from droplets that pin on the tops of the hollow pillars 116. As droplets evaporate from the tops of the hollow pillars 116, additional liquid is continuously supplied through the pores 122 of the hollow pillars 116 into the pinned droplets. The continuous supply of liquid is controlled to maintain the shape of the interface of the droplet and maintain the inlet pressure of the liquid at the pore 122. For a droplet pinned to a non-circular evaporation surface 120, the equilibrium geometry associated with minimum total surface energy is no longer a capped sphere, but instead assumes an irregular or non-axisymmetric shape where the total and local curvature vary significantly along the liquid-vapor interface. The local curvature of the droplet's liquid-vapor interface influences the droplet's capillary pressure, vapor pressure along the meniscus, and the internal circulation inside the droplet, and by extension the droplet's evaporation characteristics. For example, the non-circular evaporation surface 120 provides a droplet with a higher evaporation rate per unit area than circular surfaces because (1) the ratio of contact line length of the droplet to droplet surface area is greater for droplets on the non-circular surfaces than for droplets on circular surfaces, and (2) non-axisymmetric droplets provided the non-circular evaporation surface 120 have larger effective thin film regions compared to circular droplets.

The operating parameters of the system 102 are controlled to maintain stable droplets on the hollow pillars 116 as a continuous flow of liquid is provided to the evaporation layer 110. For example, the dynamic flow conditions of the liquid provided by the liquid delivery system are controlled to provide a desired maximum retention pressure based at least in part on the geometry of the hollow pillars 116. In various aspects, the shapes of the hollow pillars 116 allow the system 102 to maintain stable droplets on the hollow pillars using both high surface tension liquids and low surface tension liquids because the liquids are pinned on the edges of the hollow pillars. The stable droplets maintained on the hollow pillars 116 are characterized by a convex meniscus shape with liquid-vapor interfacial area that provides relatively high heat transfer coefficients as compared to existing materials.

Without being limited to any particular theory, sharp geometric features may restrict contact line advancement of low surface tension liquids (e.g., oils) due to the change in interfacial energy along the solid-liquid interface. As liquid advances along a solid edge, the contact line stays pinned until external forces overcome the wetting energy barrier. The fundamental mechanisms that hinder low surface tension liquids in wetting over a solid edge are typically characterized by pinning/de-pinning criteria that are influenced by one or more geometrical features of the solid edge including, but not limited to, edge angle and edge roundness. The hollow pillars 116 are shaped and constructed to enhance the area fraction of the thin film evaporation region (transition and intrinsic) and to increase the average heat transfer coefficient.

Referring again to FIGS. 1-3, the thermal management system 102 is configured to transfer heat generated by electronic components 106 packaged in a 2D arrangement. The thermal management system includes the liquid delivery layer 108 coupled to a 2D device layer and further coupled to a manifold layer 132. The electronic components 106 are coupled to a metallic conducting and bonding layer 134 bonded to a thermally conductive substrate 136 including, but not limited to, a Si substrate with a thin $SiO_2$ layer. The thermally conductive substrate 136 is further coupled to the liquid delivery layer 108. As illustrated in FIG. 3, the thermally conductive substrate 136 is coupled to an exposed face of the liquid deliver layer opposite to the face coupled to the evaporation layer.

Referring again to FIGS. 1-3, the manifold layer 132 is coupled to the liquid delivery layer 108 at a liquid inlet 138 configured to conduct a liquid coolant from a coolant source to the liquid delivery layer. The manifold layer 132 is further coupled to the evaporation layer 110 at a vapor outlet 140 configured to conduct vapor evaporated from the coolant droplets retained on the array of hollow micropillars away from the liquid delivery layer.

Referring again to FIG. 3, in use, the liquid is delivered to the liquid delivery layer 108 via the liquid inlet 138. The liquid is conducted through the manifold layer 132 via bulk flow, and passes through the liquid delivery layer 108. The array of hollow pillars 116 receive liquid from the liquid delivery layer 108 and form droplets. The liquid is vaporized from the surface of the droplets and is continuously replenished by the liquid delivery layer 108. The vaporized fluid released from the evaporation layer 110 passes out of the heat exchanger via the vapor outlet 140 of the manifold layer 132.

A method of evaporating a liquid using the thermal management system 102 includes providing a flow of liquid to the evaporation layer 110. The liquid flows through the pores 122 of the hollow pillars 116 and wicks out of the pores 122 along the evaporation surfaces 120. In the illustrated embodiment, the pore 122 is positioned in the center of the evaporation surface 120 and the liquid wicks radially outward from the pore to an edge circumscribing the evaporation surface. The liquid is pinned at the edge and forms a droplet with a contact line extending along the edge and circumscribing the evaporation surface 120. The method also includes maintaining a droplet on each of the hollow pillars 116 and evaporating the flow of the liquid from a surface of the droplet which is maintained on each pillar.

Figure 4:
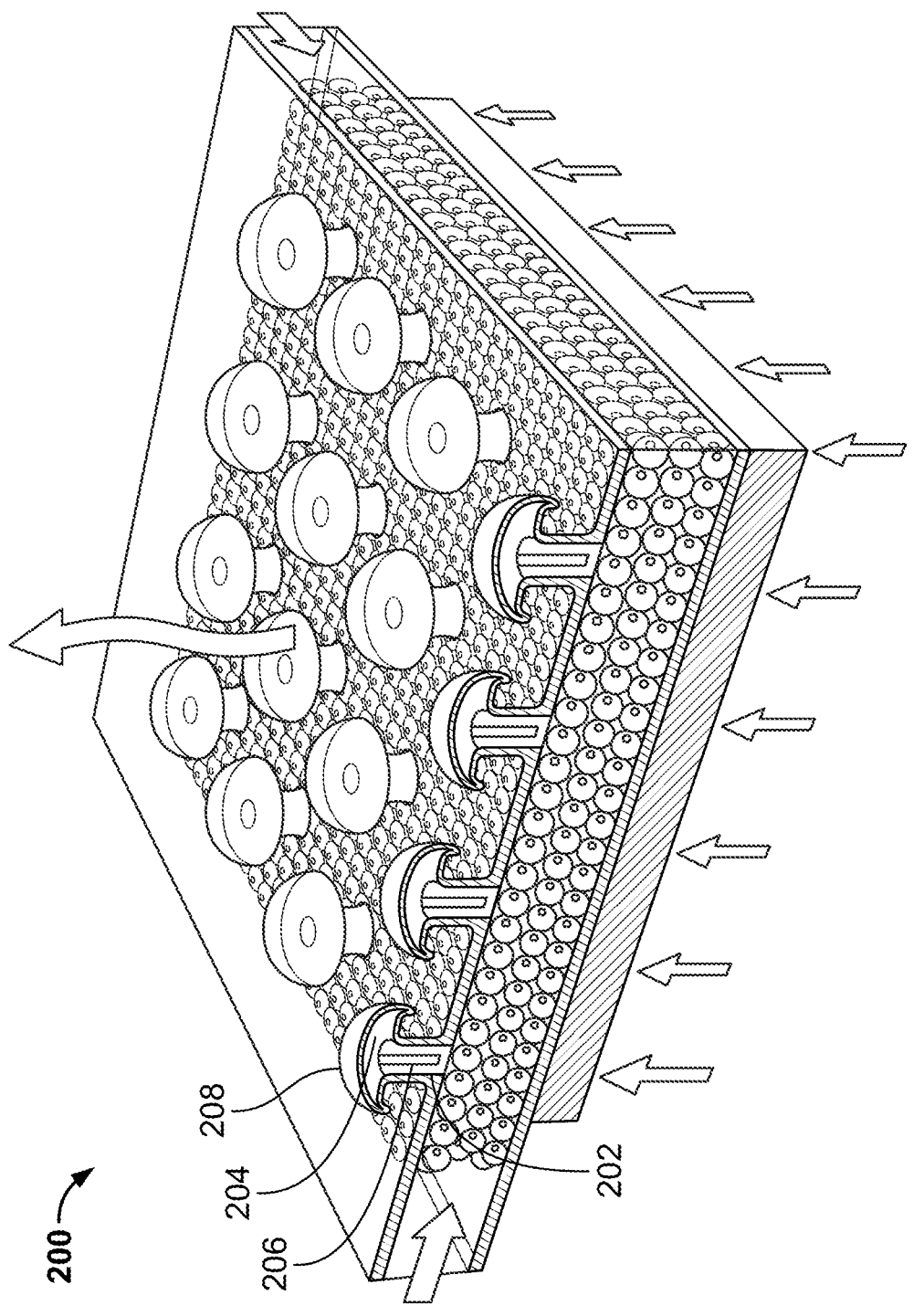
FIG. 4 is an example embodiment of an array of hollow pillars for evaporating droplets.
Figure 5:
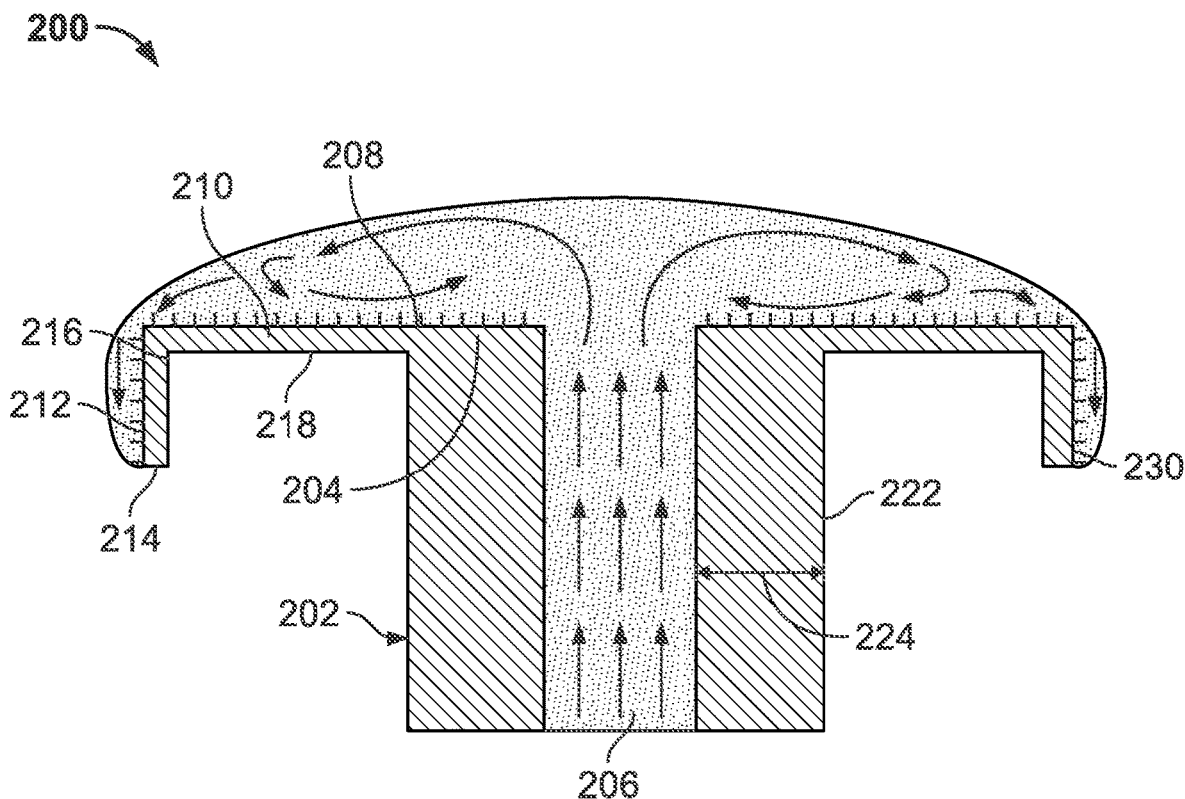
FIG. 5 is a schematic cutaway view of one of the hollow pillars of the array shown in FIG. 4.
Figure 6:
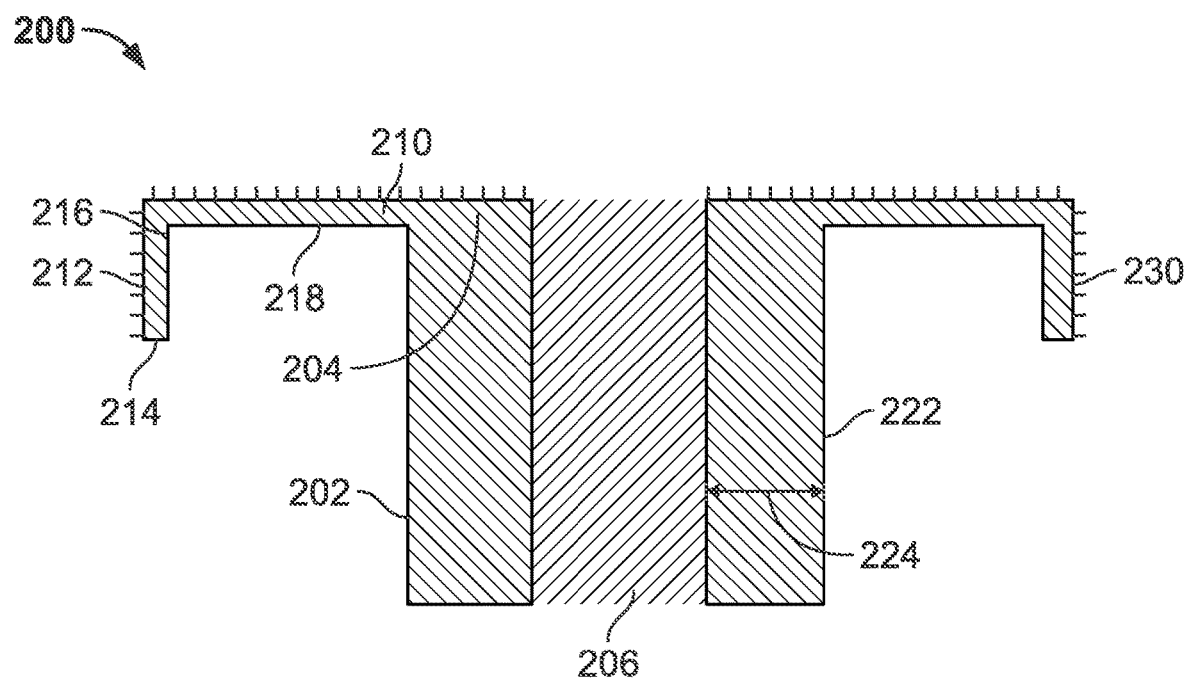
FIG. 6 is a cross-sectional view of the hollow pillar 200 in FIG. 5.

FIG. 4 is an example embodiment of an array of hollow pillars 200 for evaporating droplets. FIG. 5 is a schematic cutaway view of one of the hollow pillars 200. FIG. 6 is a cross-sectional view of the hollow pillar 200 shown in FIG. 5. As illustrated in FIGS. 4-6, each hollow pillar 200 includes a stem 202 and a head 204 attached to a distal end of the stem. The stem 202 includes a wall 222 defining a pore 206 that channels liquid through the hollow pillar 200. The wall 222 has thickness 224 defined between an inner surface defining the pore 206 and an outer surface spaced radially outward from the inner surface.

The head 204 has an evaporation surface 208 that is in flow communication with the pore 206. The pore 206 is positioned in the center of the evaporation surface 208 such that the liquid wicks radially outward from pore and forms a droplet on the evaporation surface 208. The evaporation surface is configured to maintain the droplet on the hollow pillar within a contact line. For example, the wetting efficiency is at least 95% and the contact line has a length less than about 0.0134 mm.

The head 204 includes a flange 210 extending around and radially outward from the stem 202. The flange 210 at least partially forms the evaporation surface 208. The flange 210 includes an edge 212 that circumscribes and extends downward from the evaporation surface 208. The flange 210 also includes a bottom edge 214 and an inner edge 216. The bottom edge 214 extends radially inward from the outer edge 212 and to the inner edge 216. The inner edge 216 extends upward from the bottom edge 214. An overhang surface 218 extends from the inner edge 216 to the stem 202.

The flange 210 extends the area of the evaporation surface 208 and provides further control of the evaporation of the liquid from the droplet. For example, at least a portion of the fluid-vapor interface of the liquid provided to the evaporation surface 208 is pinned at a contact line defined by the outer edge 212 under certain flow conditions. In addition, the edges 212, 214, 216 are relatively sharp edges (e.g., the edges define an angle of at least about 85°). Accordingly, the edges 212, 214, 216 may act as reentrants to pin at least a portion of the fluid-vapor interface at a contact line defined by the edges under certain flow conditions. The term reentrant, as used herein, refers to an abrupt turn in a direction of a surface wetted by a fluid.

Referring to FIG. 5, the evaporation surface 208 may further include a nanocoating 230 on at least a portion of the evaporation surface 208 that is wetted by the liquid. For example, the nanocoating 230 may be on a portion of the evaporation surface 208 defined by the flange 210 and a portion of the evaporation surface 208 defined by a rim of the stem 202. In various aspects, the nanocoating includes a plurality of nanostructures attached to the flange and/or rim surface. Non-limiting examples of suitable nanostructures include nanoparticles such as nanotubes, nanowires, nanospheres, nanoshells, and any other suitable nanoparticle. The nanocoatings may be formed from any suitable material including, but not limited to, carbon and gold. In various aspects, the nanocoatings are configured to functionalize the wetted surfaces of the micropillar to enhance liquid pinning and evaporation. In various aspects, the functionalized flange and/or rim surfaces are configured to enhance droplet formation and retention by the hollow pillars 200.

In other aspects, the nanocoatings 230 on the evaporation surface 208 can yield reduced interfacial thermal resistance and higher effective contact area at a solid liquid interface which enhances liquid pinning and evaporation. The nanocoatings 230 may be constructed from materials, including but not limited to gold nanotubes, gold nanowires, graphene oxide (GO) layers, and reduced graphene oxide (RGO) layers, by surface engineering with 2D nanomaterials to enable high specific surface area. The nanocoatings 230 can be designed to increase two-phase heat transfer flux in comparison to the heat transfer flux from surfaces without nanocoatings.

Figure 7K:
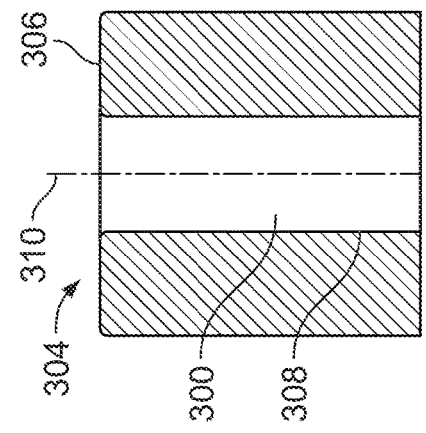
FIGS. 7A-7P are a series of schematic diagrams illustrating various stages of fluid transport through an inner channel of a hollow pillar.
Figure 7L:
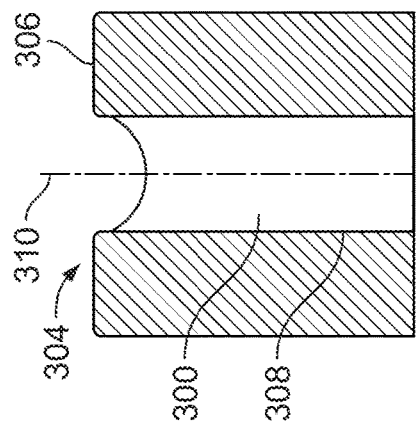
Figure 7M:
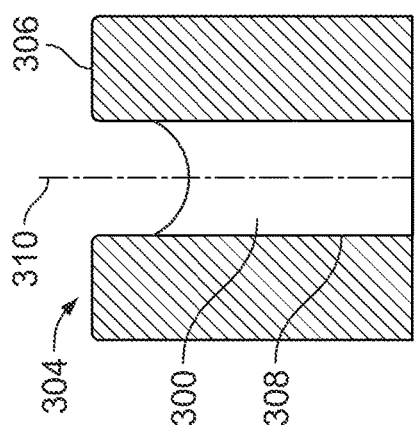
Figure 7N:
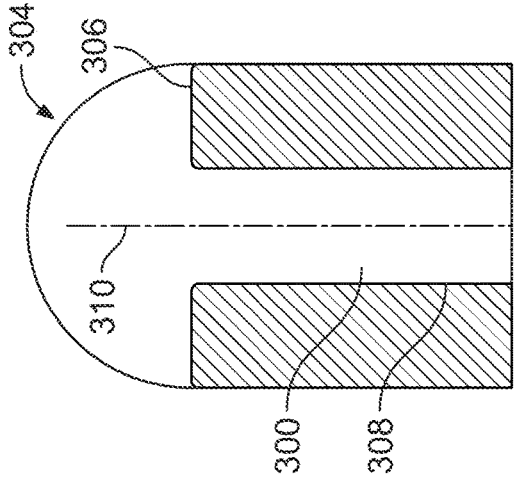
Figure 7O:
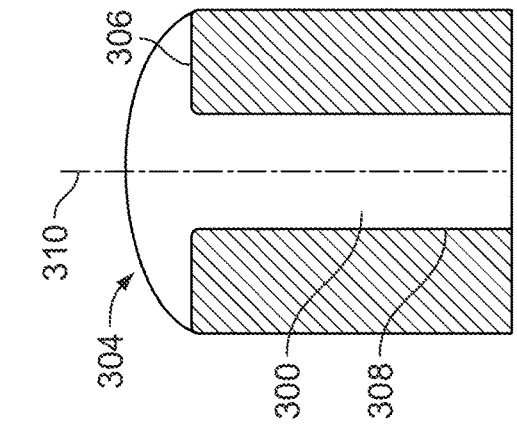
Figure 7P:
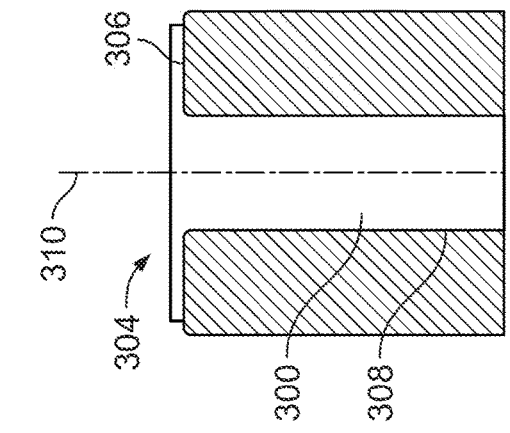

FIGS. 7A-7P are a series of schematic diagrams illustrating various stages of fluid transport through an inner channel 300 of a hollow pillar 302. The hollow pillar 302 includes an evaporation surface 304, an outer edge 306 circumscribing the evaporation surface, and an inner edge 308 at least partially defining the inner channel 300 extending along a longitudinal axis 310 of the micropillar. In the illustrated embodiment, the hollow pillar 302 has a circular cross-section. In other embodiments, the hollow pillar 302 may be any shape including, for example, and without limitation, square and triangular. In addition, in the illustrated embodiment, the hollow pillar 302 is a microstructure and the width of the inner channel 300 is less than about 1 micrometer.

As illustrated in FIGS. 7A-7P, a liquid advances through the inner channel 300 of the hollow pillar 302 by means of by capillary action, defined herein as fluid flow within narrow spaces impelled by intermolecular adhesive forces between the liquid and surrounding surfaces and/or surface tension of the liquid. FIGS. 7A-7P illustrate the action of the liquid advancing through and being retained by the hollow pillar 302 and shows the contact line dynamics for a wetting liquid as it advances toward the external orifice in one aspect. Without being limited to any particular theory, the behavior of liquids advancing through pillars differs significantly depending at least in part on the composition of the liquid. In particular, liquids characterized as high surface tension (i.e. polar) liquids and low surface tension (i.e. non-polar) liquids behave differently within micropillars, as illustrated in FIG. 7. Non-limiting examples of high surface tension liquids include polar liquids such as water. Non-limiting examples of low surface tension liquids include non-polar liquids such as dielectric fluids.

In some aspects, the hollow pillar 302 is configured to retain liquids characterized by relatively small equilibrium contact angles. In addition, the hollow pillar 302 is configured to enhance liquid retention and to inhibit bursting behavior. Accordingly, the hollow pillar 302 may be used with low surface tension fluorinated compounds including, but not limited to, dielectric liquids. In addition, the hollow pillar 302 may be used to enhance the performance of phase management-related applications requiring stable liquid-vapor interfaces, including, but not limited to, thermal management applications. In some embodiments, the hollow pillar 302 facilitates the routing and phase management of dielectric working fluids for application in heat exchangers. By way of non-limiting example, the hollow pillar 302 may be combined with a composite heat sink to produce an integrated two-phase thermal management system.

After the liquid advances onto the evaporation surface 304, the liquid is pinned by the edge of the hollow pillar 302 and forms a droplet on the hollow pillar 302. The ability of the edges to pin the spreading liquid is determined based on the apparent angle of the liquid relative to the evaporation surface 304. Specifically, the contact line of the liquid will stay fixed at the edge as long as the apparent contact angle does not exceed a critical value $\theta^*$. The critical value $\theta^*$ is provided by the following equation:

$$\theta^* = \theta_y + \pi - \varphi \qquad \text{Eqn. (1)}$$

where $\theta_y$ is the intrinsic contact angle of the liquid and substrate, and $\varphi$ is the edge angle.

Notably, the contact angles measured for liquid advancing and receding on a substrate are different from the static contact angle, as shown by the following relationship:

$$\theta_{adv} > \theta_y > \theta_{rec} \qquad \text{Eqn. (2)}$$

where $\theta_{adv}$ is the advancing contact angle and $\theta_{rec}$ is the receding contact angle. This difference is known as the contact angle hysteresis (CAH), which indicates whether the surface is "sticky" or "slippery". For example, surfaces with high roughness generally exhibit high CAH, and it becomes more difficult to remove a pre-wetted liquid from such surfaces (e.g., water-oil displacement). For example, such hysteresis may be induced by microscopic defects whose geometric discontinuities resist liquid spreading. Similarly, design of superoleophobic surfaces with microstructure patterns (e.g., micropillars and micromeshes) follows the same principle where the sharp edge feature of each individual microstructure prohibits spilling of the liquid down the sides of these microstructures. Therefore, the liquid rests partially on the solid substrate and partially on the interstitial air gap. This results in a higher effective interfacial energy at the bottom interface and therefore a tendency to reduce the contact area with the bottom substrate, i.e., to increase the apparent contact angle.

Referring again to FIG. 7, the high surface tension liquid pins along the inner edge 308, as illustrated in FIG. 7B, until a convex meniscus is formed along the inner channel 300, as illustrated in FIG. 7D. As additional fluid advances through the inner channel 300 via capillary action, the convex meniscus enlarges and advances along the evaporation surface 304, as illustrated in FIG. 7E, until the meniscus is pinned along the outer pillar edge 306 as shown in FIG. 7F. With increasing liquid pressure, the pinned meniscus expands and that yields a minimum radius of curvature and a maximum Laplace pressure, as illustrated in FIG. 7G. The pinned meniscus forms a hemispherical shape if the evaporation surface is circular and non-axisymmetric shape if the evaporation surface is non-circular. The growing meniscus forms a pressure barrier attributed to changes in meniscus interfacial area. A resistive capillary force opposes any further increases in surface area and associated increases in total interfacial energy, and consequently prevents the meniscus from further expansion beyond the outer edge 306 of the hollow pillar 302. A convex meniscus implies a positive pressure of the wetting liquid with respect to the non-wetting phase (i.e., $p_w > p_{nw}$). While the contact line of the meniscus is pinned at the outer edge of the micropillar, the apparent contact angle, $\theta_a$ between the evaporation surface 304 and meniscus liquid-vapor interface increases from the intrinsic contact angle of the liquid and micropillar material, $\theta_y$ (FIG. 7I) to a critical angle, $\theta^*$ as the meniscus expands (FIG. 7J). Once the meniscus forms the critical angle, $\theta^*$, depinning at the liquid contact line occurs and the meniscus continues to advance along the outer pillar edge, causing a breakdown of the meniscus structure termed "burst". As described above, high surface tension liquids, characterized as having finite intrinsic angles $\theta_y$ are capable of sustaining stable menisci with shapes exceeding a hemisphere, as illustrated in FIG. 7H.

For low surface tension (e.g., non-polar) liquids, the liquid initially wicks through the inner channel 300 of the hollow pillar 302, as illustrated in FIG. 7K. The liquid contact line then pins along the inner edge 308, as illustrated in FIG. 7L until the liquid levels rise above the inner pillar edge, as illustrated in FIG. 7M. For low surface tension liquids, the meniscus immediately advances from the inner edge 308 to the outer pillar edge 306, as illustrated FIG. 7N until the liquid is again pinned at the outer pillar edge as illustrated in FIG. 7O. The meniscus expands from the pinned contact line at the outer pillar edge 306 and forms a hemispherical shape on a circular evaporation surface 304 and an non-axisymmetric shape on a non-circular evaporation surface. The meniscus expands until the apparent contact angle, $\theta_a$ between the evaporation surface 304 and the meniscus liquid-vapor interface reaches the critical angle $\theta^*$. The critical angle $\theta^*$ may be 90° for the low surface tension liquids, as illustrated in FIG. 7P.

Without being limited to any particular theory, existing free energy theory typically describes the wetting barrier at a solid edge using a thermodynamic approach, where the total surface free energy of a liquid meniscus is calculated with the contact line pinned at, or exceeding, the edge. The contact line of the droplet will by nature stick to the solid edge to maintain a minimum energy state. By performing a free energy analysis, three distinct wetting regions along the sharp edge can be delineated based on the intrinsic contact angle $\theta_y$ and edge angle $\psi$. In State 1, the contact angle $\theta_y$ is greater than the edge angle V and the liquid is at a local minimum energy state. In the local minimum energy state, the contact line pinned at the edge regardless of the apparent contact angle. In a State 2, the relationship between the contact angle $\theta_y$ and the edge angle $\varphi$ is represented by the following equation:

$$\varphi > \theta_y + 2\tan^{-1}\left(\frac{\cot\theta y}{2}\right) \qquad \text{Eqn. (3)}$$

In State 2, the liquid be pinned at the edge as long as the apparent contact angle is less than the critical value $\theta^*$ (see Eqn. (1)). Once such a threshold is reached, the liquid will spread over the sharp edge, with the contact line moving steadily down the adjacent surface and the liquid will be in State 3. In State 3, the relationship between the contact angle $\theta_y$ and the edge angle $\varphi$ is represented by the following equation:

$$\theta_y < \varphi < \theta_y + 2\tan^{-1}\left(\frac{\cot\theta y}{2}\right) \qquad \text{Eqn. (4)}$$

In State 3, the liquid is pinned with the same criteria described in State 2. After the critical contact angle is reached, however, the contact line immediately advances over the sharp edge and spreads spontaneously down the adjacent surface, leading to a "swelling-collapsing" behavior of liquid abruptly flowing across and down the edge.

Without being limited to any particular theory, based on the free energy method, the liquid will always try to minimize its total surface free energy and resist the movement across the a reentrant feature such as an edge. In some embodiments, a nanocoating is applied to the surface to provide a superoleophilic surface (e.g., a surface including an oil with a contact angle less than 10°) which will shift the wetting characteristic of the surface from state 3 to state 1 or provide a superoleophobic surface (e.g., a surface including an oil with a contact angle greater than about 150°) which will shift the wetting characteristic of the surface from state 3 to state 3.

Figure 8:
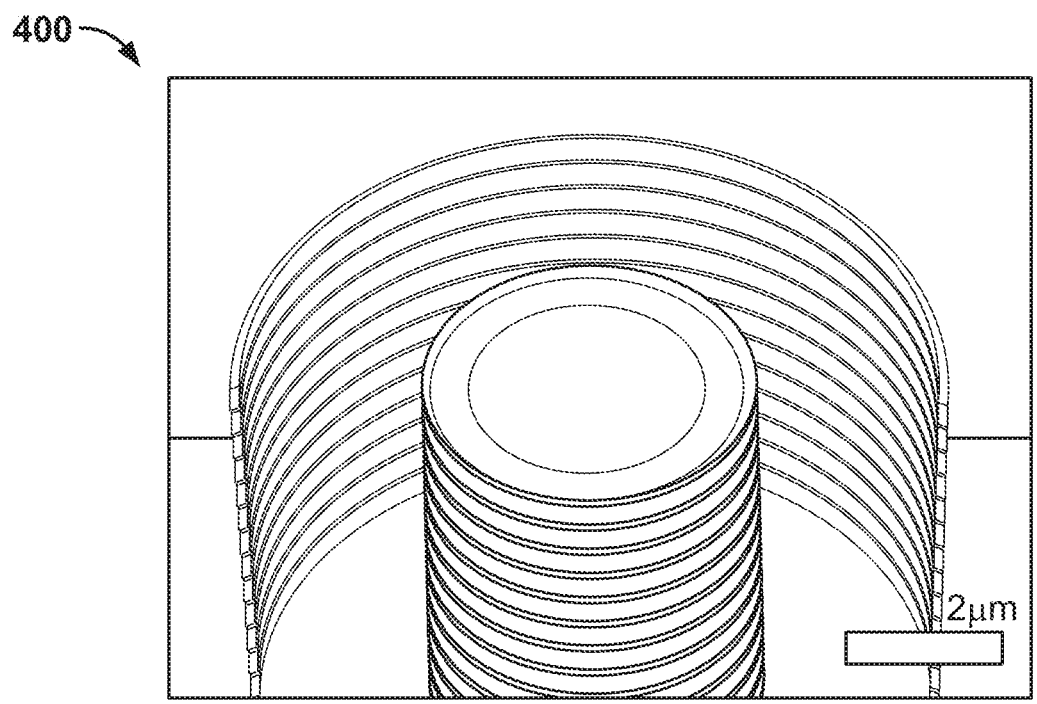
FIG. 8 is a schematic view of a hollow pillar with portions removed to show an inner pore of the pillar.
Figure 9:
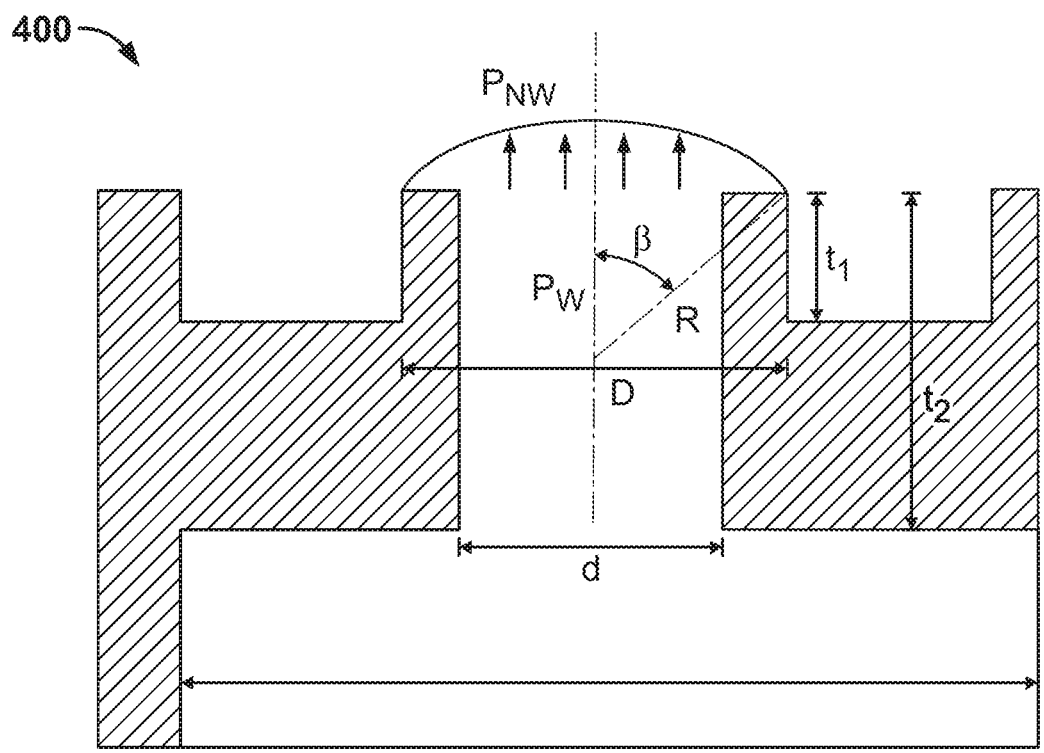
FIG. 9 is a schematic cross-sectional view of the hollow pillar illustrating liquid advancing through the hollow pillar.
Figure 10B:
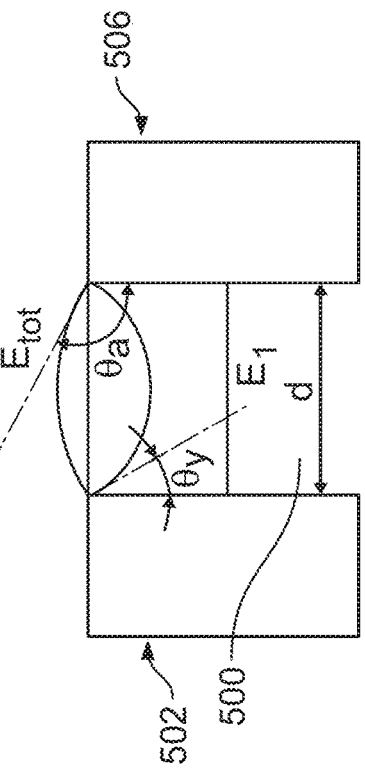
FIGS. 10A-10D are a series of schematic diagrams illustrating various stages of fluid movement through an inner channel of a micropillar.
Figure 10D:
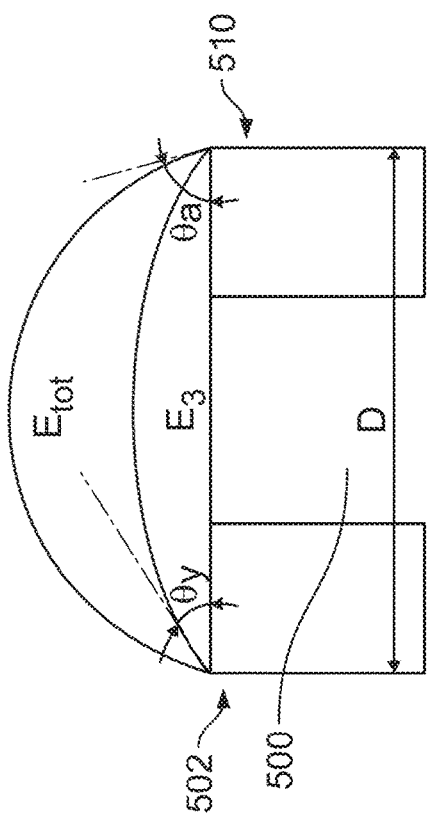
Figure 10A:
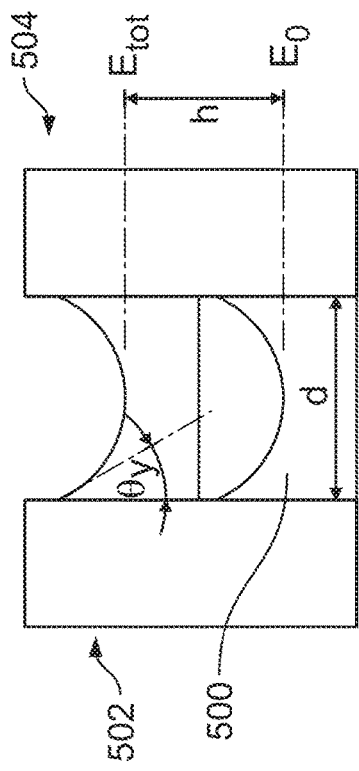
Figure 10C:
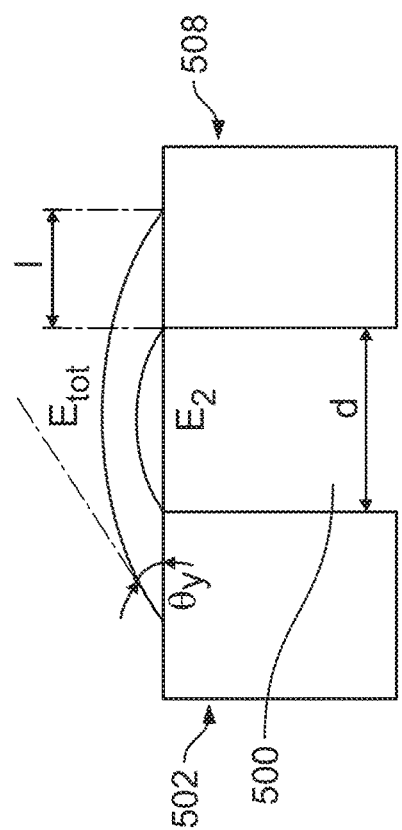

FIG. 8 is a perspective view of a hollow pillar 400. FIG. 9 is a schematic cross-sectional view of the hollow pillar 400 illustrating liquid advancing through the hollow pillar. The wicking, pinning, and bursting behavior of liquid along the hollow pillar 400 can be analyzed theoretically using a free energy approach with a quasi-static assumption. The advancement of liquid along the hollow micropillar can be described in terms of the total free energy as expressed in the following equation:

$$E_{tot}=E_{sl}+E_{sa}+E_{la}=A_{sl}\gamma_{sl}+A_{sa}\gamma_{sa}+A_{la}\gamma_{la} \qquad \text{Eqn. (5);}$$

where the surface tension $\gamma_{sl}$, $\gamma_{sa}$, and $\gamma_{la}$ are correlated by the following equation (Young's equation):

$$\gamma_{sa}=\gamma_{sl}+\gamma_{la}\cos\theta_y \qquad \text{Eqn. (6).}$$

The corresponding pressure in the liquid associated with the change in total free surface energy can then be obtained by taking the derivative of Eq. (1) with respect to the liquid volume and substituting Eq. (2) to obtain Eqn. (7):

$$\Delta p = -\frac{dE_{tot}}{dV_l} = \gamma_{la}\left(\cos\theta_y\frac{dA_{sl}}{dV_l} - \frac{dA_{la}}{dV_l}\right). \qquad \text{Eqn. (7)}$$

FIGS. 10A-10D are a series of schematic diagrams illustrating various stages of fluid movement through an inner channel 500 of a micropillar 502. The stages for the meniscus formed on the micropillar 502 include a wicking stage 504, a pivoting stage 506, an advancing stage 508, and an expanding stage 510. Without being limited to any particular theory, both high surface tension and low surface tension liquids advance through the narrow inner channel 500 formed within the micropillar 502 during the wicking stage 504. The liquids may initially have a concave surface profile and then form the meniscus during the pivoting stage 506 as the meniscus transitions from the concave surface profile to a convex surface profile. The liquid travels across a surface of the micropillar 502 and undergoes pinning of the meniscus to the sharp outer edge of the micropillar at the end of the meniscus advancing stage 508. The pinned meniscus continues to grow during the expanding stage 510. The physical phenomena related to meniscus pinning, referred to herein as the canthotaxis effect, provide a thermodynamic framework for describing the resistance of wetting liquids spreading along sharp edges. As described by the canthotaxis effect, a bursting event is triggered as the apparent contact angle ($\theta_y$) (see FIG. 7I) of a growing meniscus exceeds a critical angle ($\theta^*$) (see FIG. 7J) and overwhelms the forces maintaining the meniscus pinned to the sharp outer edge of the micropillar. The overwhelming forces cause the liquid to advance beyond the sharp outer edge and onto the outer surface of the micropillar. Without being limited to any particular theory, it is believed that once the liquid pins to the sharp outer edge of the micropillar, the expanding meniscus system maintains a minimum energy state until the contact angle ($\theta_y$) of the liquid at the sharp outer edge exceeds the critical value $\theta^*=\omega+\theta_y$, where $\omega$ is the angle between the top surface and outer pillar edge, which is assumed to be 90°. During the process of liquid penetrating through the micropillar, the change of total free surface energy and liquid volume at different stages (e.g., wicking, pivoting, advancing, and expanding) can be calculated using the associated geometric boundary conditions, assuming that the meniscus maintains the geometry of a capped sphere. The following equations (Eqns. (8)-(15)) can be used to determine total free surface energy and liquid volume according to the free energy approach described above:

$$E_{tot} = E_0 - \pi d h y_{la} \cos\theta_y. \qquad \text{Eqn. (8)}$$

$$V_{tot} = V_0 + \frac{\pi}{4} d^2 h. \qquad \text{Eqn. (9)}$$

$$E_{tot} = E_1 - \frac{\pi d^2}{2}\left(\frac{1 - \sin\theta_y}{\cos^2\theta_y} - \frac{1 - \sin\theta_a}{\cos^2\theta_a}\right) y_{la}. \qquad \text{Eqn. (10)}$$

$$V_{tot} = V_1 + \frac{\pi d^3}{24}\left[\frac{(1 - \sin\theta_y)^2(2 + \sin\theta_y)}{\cos^3\theta_y} - \frac{(1 - \sin\theta_a)^2(2 + \sin\theta_a)}{\cos^3\theta_a}\right] \qquad \text{Eqn. (11)}$$

$$E_{tot} = E_2 + \pi(l^2 + dl)\left(\frac{2 - 2\cos\theta_y}{\sin^2\theta_y} - \cos\theta_y\right) y_{la}. \qquad \text{Eqn. (12)}$$

$$V_{tot} = V_2 + \frac{\pi(1 - \cos\theta_y)^2(2 + \cos\theta_y)}{24\sin^3\theta_y}\left[(d + 2l)^3 - d^3\right]. \qquad \text{Eqn. (13)}$$

$$E_{tot} = E_3 - \frac{\pi D^2}{2}\left(\frac{1 - \cos\theta_a}{\sin^2\theta_a} - \frac{1 - \cos\theta_y}{\sin^2\theta_y}\right) y_{la}. \qquad \text{Eqn. (14)}$$

$$V_{tot} = V_3 + \frac{\pi D^3}{24}\left[\frac{(1 - \cos\theta_a)^2(2 + \cos\theta_a)}{\sin^3\theta_a} - \frac{(1 - \cos\theta_y)^2(2 + \cos\theta_y)}{\sin^3\theta_y}\right]. \qquad \text{Eqn. (15)}$$

Combining and substituting the equations (14) and (15) for $E_{tot}$ and $V_{tot}$ of the droplet at each stage from FIG. 10 into Eqn. (9) enables a theoretical prediction of the pressure variation as liquid flows through the hollow micropillar 502 at the various stages. After the critical contact angle is formed along the pillar edge, the liquid eventually collapses, as described above. Since the edge angle of the outer edge of each micropillar is 90°, a spherical drop profile cannot be satisfied during the meniscus collapse as the pillar edge will protrude into the liquid outline. Therefore, the liquid bursts suddenly and spreads instantaneously down the side of the micropillar. On the side of the micropillar 502, the contact line splits into a capped sphere sitting on the top of the micropillar and a falling film surrounding the outer micropillar wall. The free energy during burst is irregular due to the irregular shape deformation of the liquid spreading down the micropillar. However, once liquid burst has occurred, no additional pressure barrier remains, and subsequent flow is again dominated by the contact line friction as the liquid spreads freely over the entire substrate. The corresponding liquid pressure variation after the burst can then be calculated, again using the change in free energy, as described in Eqns. (12) and (13).

Accordingly, the stability at which a liquid is pinned to an enclosing edge of the micropillar varies in proportion to the intrinsic contact angle, corresponding to the solid-liquid interfacial energy. For liquids with infinitesimal intrinsic contact angles, the maximum Laplace pressure, corresponding to the pressure at burst, occurs as the meniscus assumes a critical angle approximated as θ*=90°, corresponding to a hemispherical meniscus shape, shown illustrated in FIG. 7G by way of non-limiting example. For liquids with finite equilibrium contact angles (i.e., lower solid-liquid interfacial energy), the meniscus can be expanded beyond a hemispherical shape that corresponds to θ*=90°+θ$_y$ prior to the burst event, as illustrated in FIG. 7H by way of non-limiting example. In this case, the pressure at burst falls below the maximum Laplace pressure.

The free energy approach with quasi-static assumptions was also used to assess the effect of different shapes of the flange face and associated column cross-sectional profile on droplet characteristics. In some aspects, the micropillar's non-axisymmetric shape may yield a higher evaporation rate. Exploring the evaporation flux distribution in a drop with circular and triangular contact area demonstrated that larger curvature provided by the triangular contact area leads to larger evaporation flux and that larger mean curvature leads to larger total evaporation as shown in FIGS. 11 and 12. Specifically, FIG. 11 shows the curvature and vapor concentration line of a droplet on a circular evaporation surface. FIG. 12 shows the curvature and vapor concentration line of a droplet on a triangular evaporation surface. FIGS. 11 and 12 show an increased evaporation flux for the triangular evaporation surface with the larger mean curvature. For example, a triangular droplet evaporates 17% faster than a hemispherical droplet with same liquid-vapor interfacial area and same base perimeter at room temperature and atmosphere. When the substrate temperature is raised to 98° C., the enhancement in the heat transfer coefficient for the microdroplet evaporating on a triangular micropillar is 46% larger than the microdroplets on a square micropillar and 71% larger than the microdroplets on a circular micropillar.

Classical thermodynamic analysis provides a sound explanation of most liquid retention behaviors at sharp edges, subject to at least several assumptions. The thermodynamic analysis described herein is based on a quasi-static assumption that the process is reversible. In other words, the system is always at its local energy minimum state and the change in total free energy is contributed to only by the change in total surface energy, as expressed by:

$$dG_{tot} = -SdT + Vdp + \sum_i \mu_i dn_i + \sigma dA \approx \sigma dA \qquad \text{Eqn. (16)}$$

where μ is the chemical potential and σ is the surface tension. However, the quasi-static assumption may not be appropriate for highly non-equilibrium conditions (e.g., a high flow rate) where the liquid meniscus shape deformation by external perturbation cannot be instantaneously restored by surface tension force, resulting in systems characterized by transient states and non-constant system pressures. By way of non-limiting example, for high flow rate fluid displacement in porous media, an interfacial meniscus may progress abruptly through a geometric throat, unbounded by the quasi-static thermodynamic descriptions. In this case, the progression contact angle θ exceeds the intrinsic contact angle θ$_y$.

Without being limited to any particular theory, the onset of non-equilibrium behavior of droplets during transient states may be identified using Capillary number, defined as:

$$Ca = \frac{\mu v}{\gamma} \qquad \text{Eqn. (17)}$$

where μ is the viscosity, v is the velocity, and γ is the surface tension.

For flows characterized by Ca<$10^{-5}$, the liquid flow can be generally analyzed using free-energy methods with the quasi-static assumption as described above. For flows characterized by Ca>0.001, a liquid droplet pinned on a cylindrical tube typically undergoes an anisotropic expansion with a higher growth rate in the vertical direction. Therefore, the droplet expands beyond the maximum shape predicted by the quasi-static thermodynamic analysis before spilling occurs. At Ca>0.001, the high flow rate reduces the wetting barrier at the sharp solid edge.

In various aspects, the behavior of the liquid contact line of droplet expansion and advancing along a sharp edge may be evaluated in terms of interfacial molecular interactions in addition to the thermodynamic free energy methods described above. By studying the interfacial interactions in the vicinity of the contact line region and developing a general description for liquid spreading on arbitrary curved surfaces, contact line dynamics and flow behavior over a variety of geometries, such as porous media and textured substrates that contain "macroscopic" sharp features may be predicted.

Without being limited to any particular theory, it is thought that wetting behavior of droplets on solid substrates are not governed by phenomena occurring over the entire wetted area, but instead are governed by interfacial interactions within a very small region positioned beneath the liquid juxtaposed with the contact line. This one-dimensional (1D) contact line, when magnified at the nanoscale, becomes a 3D space (~10 nm) where the molecules of the liquid, solid, and gas phases interact. These interactions drive the contact line and bulk liquid to advance along the solid surface.

In a stable state for wetting on a planar substrate, the local contact angle $\theta_{local}$ is equivalent to the apparent contact angle $\theta_a$. If $\theta_{local}$ exceeds the intrinsic contact angle $\theta_y$, the molecular solid-liquid interaction near the contact line will be stronger than the liquid-liquid interaction, resulting in a spontaneous jump and absorption of the interfacial liquid molecule into the solid molecules. The absorption of the interfacial liquid molecule leads to the further avalanche of the bulk liquid molecules and consequently spreading of the liquid on the solid substrate. This process will proceed until $\theta_{local}=\theta_y$, where a force balance is reached for interfacial liquid molecules. For wetting over a curved edge, the same principle should hold as long as the apparent contact angle $\theta_a$ is less than the critical contact angle $\theta^*$ defined above in Eqn. (1). In this case, the contact line will always reach a local equilibrium state with $\theta_{local}=\theta_y$, while the apparent contact angle $\theta_a$ is larger than the intrinsic contact angle $\theta_y$. However, under some limited conditions, the contact line may spontaneously spill along the solid substrate when $\theta_a$ exceeds $\theta^*$, despite the fact that its local contact angle is less than its local equilibrium state (i.e., $\theta_{local}<\theta_y$).

Without being limited to any particular theory, four distinct stages of the droplet evaporation process have been identified including: (I) an initial small decrease in droplet height and contact angle with a fixed radius; (II) a subsequent fast decrease in droplet height and contact angle with a fixed radius; (III) a decrease in droplet height and radius with a fixed contact angle; and (IV) the complete disappearance of the droplet. For systems characterized by a solid substrate beneath a droplet that prohibits vapor diffusion from downward, a capacitance factor as a function of contact angle to calculate the reduction in evaporation rate induced by the solid substrate was previously defined. In addition to vapor diffusion, a number of other mechanisms are also thought to be involved in droplet evaporation. Non-uniform evaporation from the contact line of the droplet are thought to induce microconvection effects in both the liquid and vapor domain that accelerate the evaporation process. It has also been demonstrated that a temperature gradient along the droplet surface, induced by the self-cooling of the droplet surface during evaporation, may subsequently induce thermocapillary flow inside a droplet.

FIGS. 13-15 are top views of hollow pillars 600, 602, 604 having different cross-sectional shapes. Specifically, hollow pillar 600 has a circular cross-sectional shape. Hollow pillar 602 has a square cross-sectional shape. Hollow pillar 604 has a triangular cross-sectional shape. Each hollow pillar 600, 602, 604 has an inner edge 608 defining a pore 606 and an outer edge 610 spaced radially outward from the inner edge.

Micro/nano structures are able to tune and control droplet geometries including, but not limited to, non-axisymmetric droplet contact area shapes such as squares, rectangles, hexagons, octagons, dodecagons, star shaped polygon, airfoil shape, and streamlined shape using advanced micro- and nano-fabrication techniques. The non-axisymmetric contact areas typically result in non-spherical droplet geometries for which the liquid-vapor interface is not amenable to characterization using existing explicit function such as the expressions described above. In particular, the curvature of the liquid-vapor interface is non-uniform over the droplet surface, which leads to drastic changes of the local vapor concentration gradient in the azimuthal direction, as illustrated in FIGS. 13-15.

Compared to spherical droplets where the local evaporative flux distribution is solely determined by the contact angle, non-axisymmetric droplets exhibit different evaporative transport characteristics, since both the shape and proximity to the triple phase contact line (TPL), defined as the region where the solid, liquid, and vapor molecules interact, influences the droplet's evaporation flux. Without being limited to any particular theory, droplets with a higher mean interface curvature evaporate at a faster rate, which is a desirable characteristic for an efficient evaporative cooling system.

Figure 16:
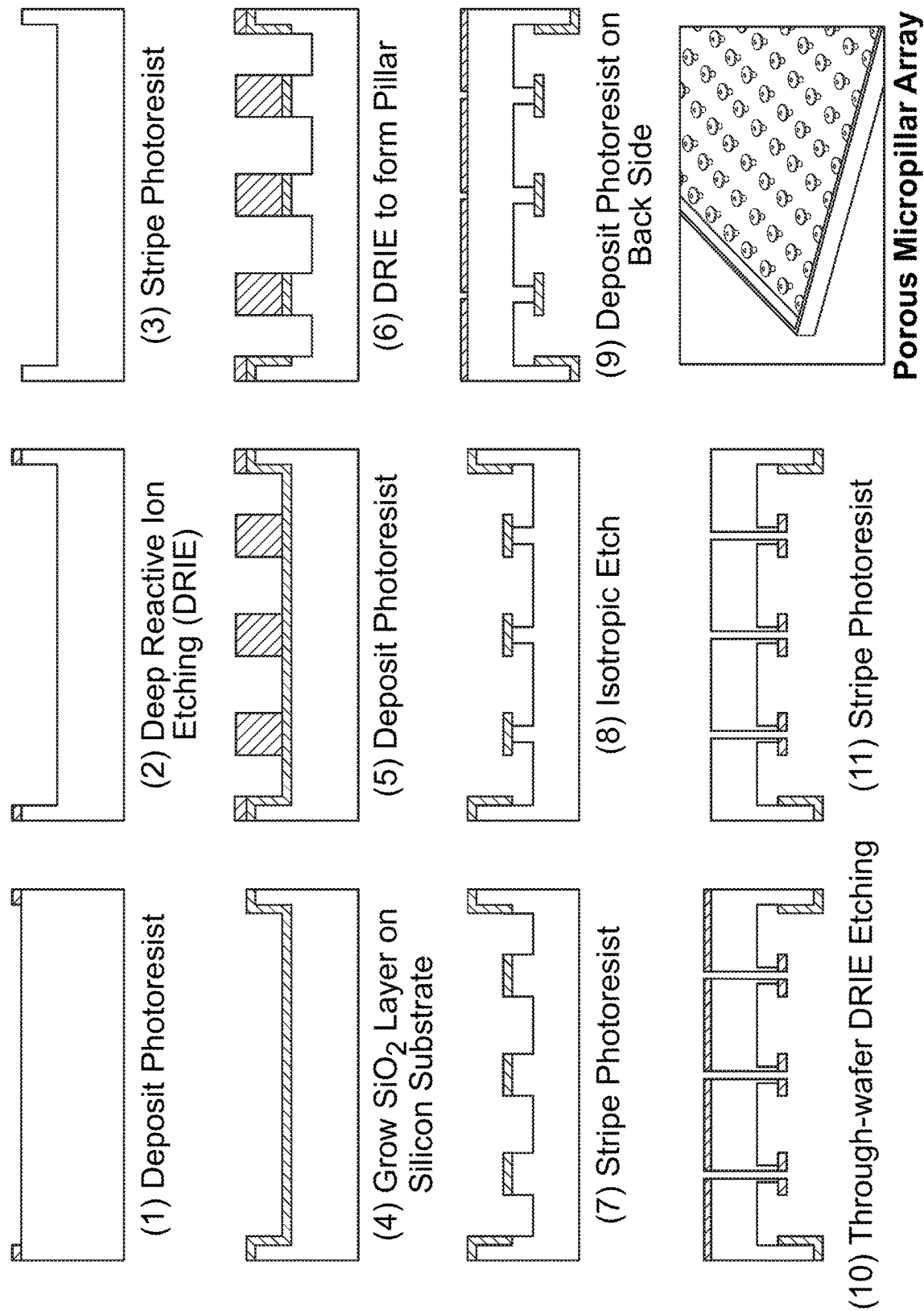
FIGS. 16 and 17 are schematic diagrams of an example fabrication process of hollow micropillars.
Figure 17:
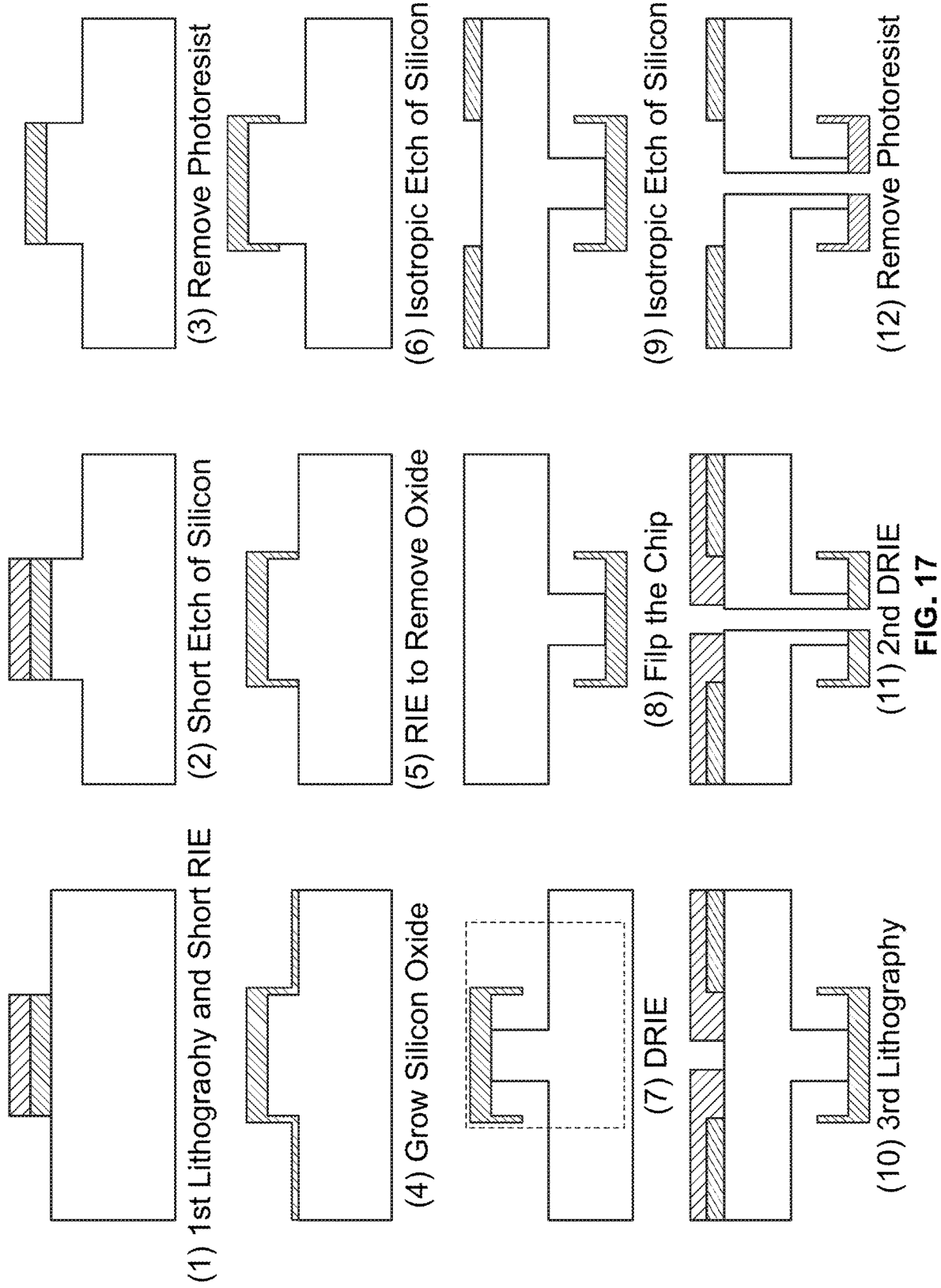

FIGS. 16 and 17 are schematic diagrams of an example fabrication process of hollow micropillars. The first method is for a re-entrant profile (see FIG. 16) and the second method is for a double re-entrant profile (see FIG. 17). The double re-entrant profile is a three-stage microfabrication procedure for manufacturing the hollow micropillar with desired geometry.

To retain both polar and non-polar liquids, microfabrication techniques were applied to create a membrane containing an array of hollow micropillars with re-entrant surface features from a material such as silicon. In one aspect, the hollow micropillars are constructed using two front-side deep reactive ion-etching (DRIE) steps to independently delineate trenches and through-holes. In another aspect, an additional back-side DRIE step may be conducted to define the membrane thickness. In various aspects, the inner diameter of the micropillars may be limited by the resolution of the lithography and/or the DRIE steps, both of which may are typically well-suited for the formation of high aspect ratio through-holes.

In one aspect, the micropillar inner diameter is about 3 µm, the membrane thickness is about 0.7 µm, and the corresponding micropillar outer diameter is about 4.4 µm. In this one aspect, the area of the micropillar arrays fabricated here was about 1 mm². The DRIE etch produced sharp edges at the intersection of the outer and top surfaces of the micropillars (i.e., angle $\omega \geq 90°$ as defined in FIG. 7J), suitable for pinning liquids with infinitesimal intrinsic contact angles including, but not limited to dielectric fluids characterized by low surface tension as described above. the outer corner of each micropillar has an etch angle less than about 90° which enables lower surface tension liquids to maintain a meniscus with a hemispherical shape when the liquid is pinned along the outer pillar edge as described above.

Figure 18:
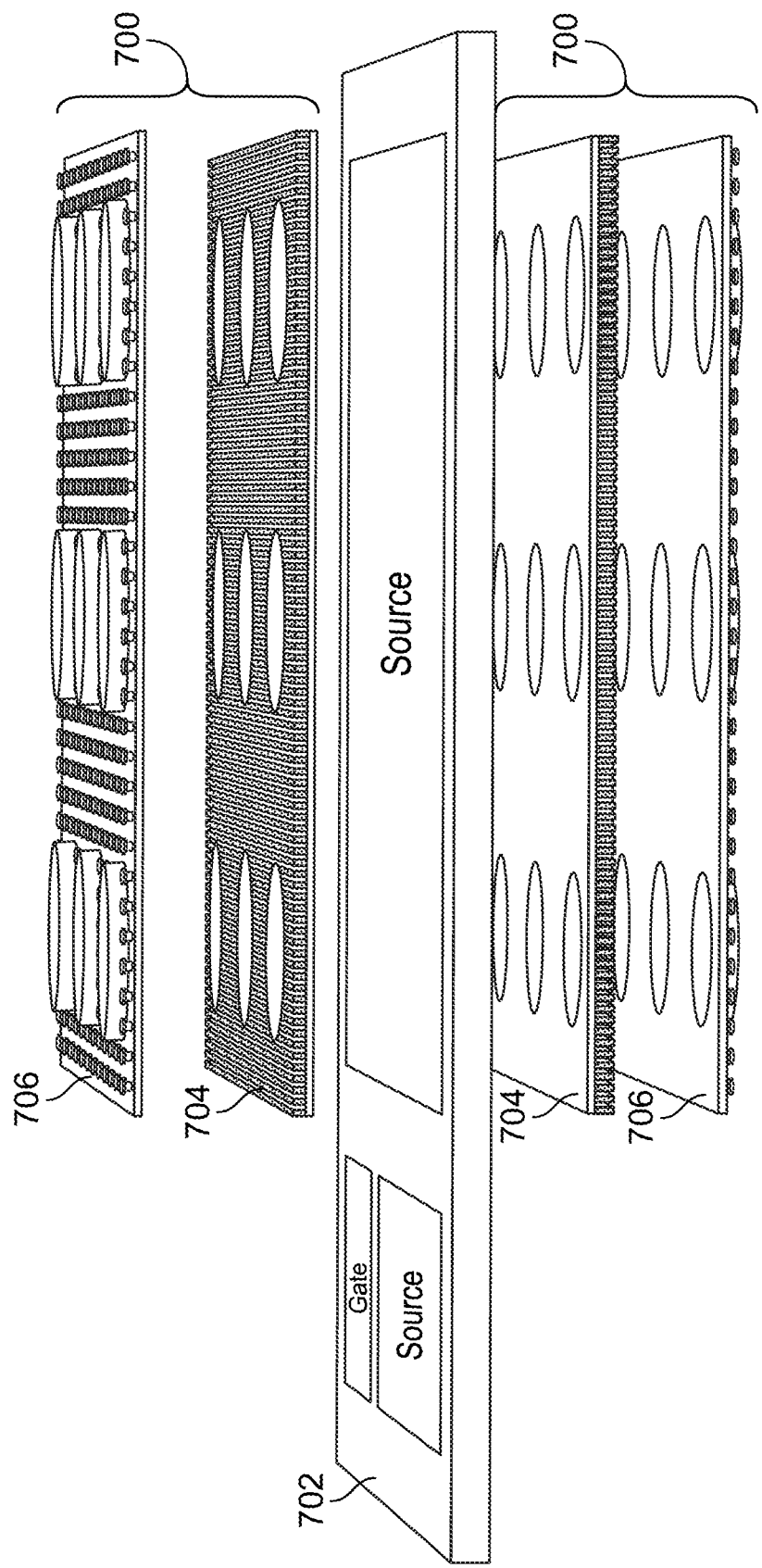
FIG. 18 is an exploded view of a thermal management system including a pair of integrated liquid delivery layers configured to couple to opposite faces of a 2D device layer.
Figure 19:
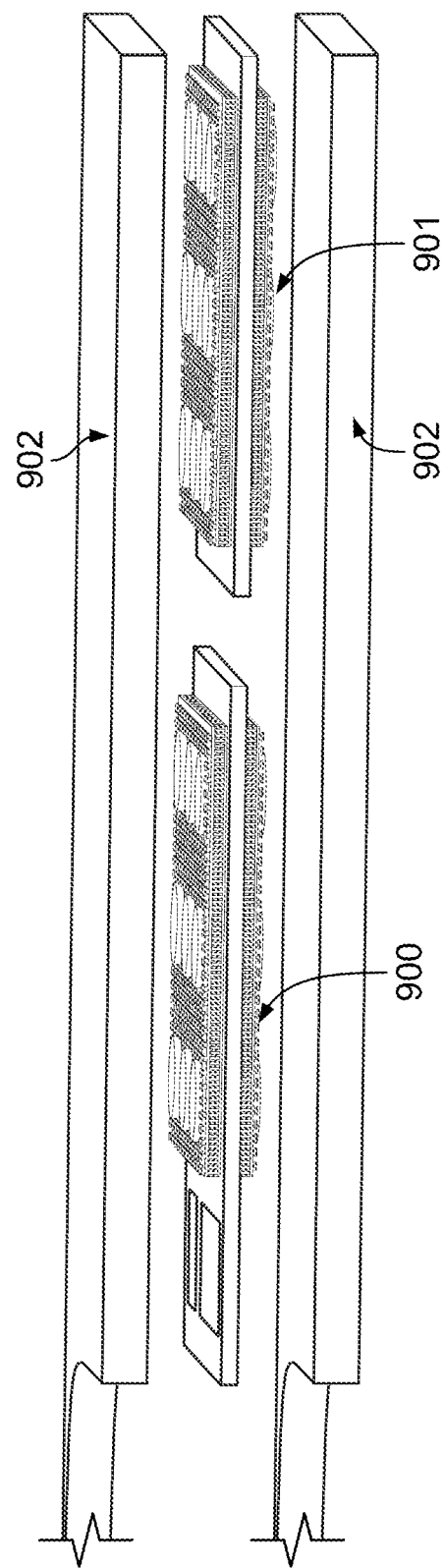
FIG. 19 is an enlarged exploded view of a portion of the thermal management system showing an IGBT-Diode block with the integrated cooling module shown in FIG. 18.
Figure 20:
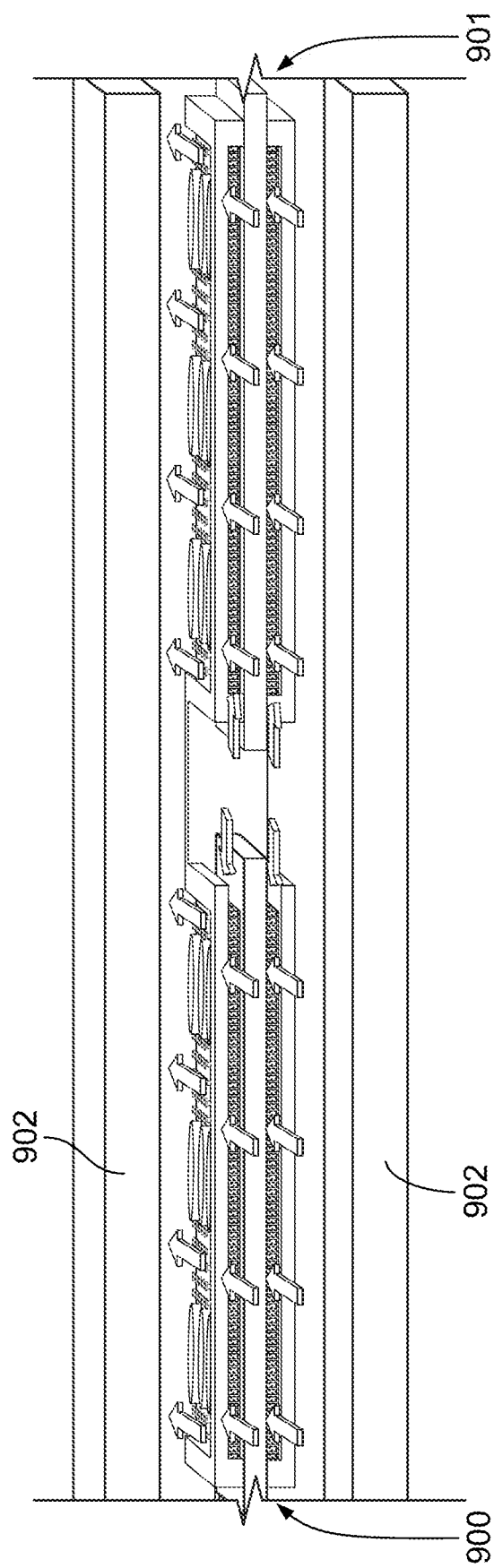
FIGS. 20 and 21 are schematic diagrams of a portion of the thermal management system shown in FIG. 18, showing liquid and vapor routing for the 3D packaging of power electronics.
Figure 21:
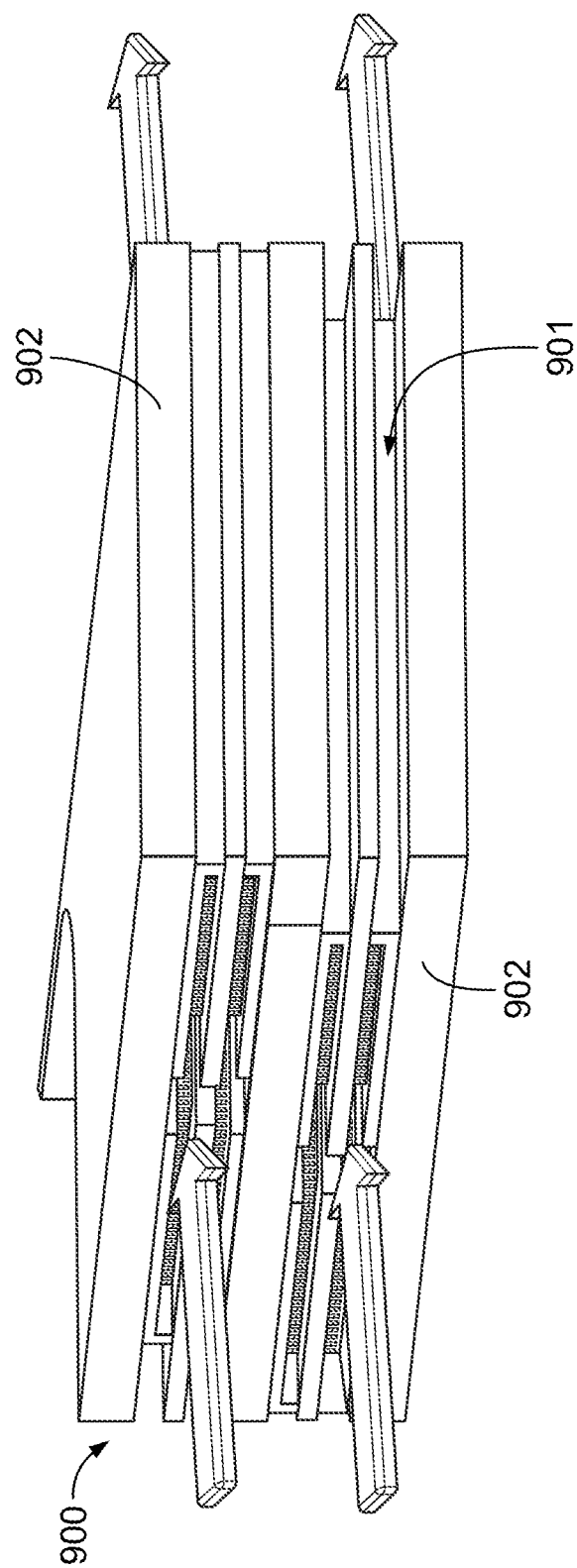

In various aspects, multiple integrated liquid delivery layers may be combined in various arrangements to provide thermal management to a variety of arrangements of power electrical components. In one aspect, illustrated in FIG. 18, a pair of integrated liquid delivery and evaporation layers 700 are coupled to opposite faces of a 2D device layer 702. As illustrated in FIG. 18, the first integrated liquid delivery and evaporation layer 700 is coupled to the first/upper face of the device layer 702 at a thermally conductive substrate via a metallic conductive layer as describe above. The second integrated liquid delivery and evaporation layer 700 is similarly coupled to a second/lower face of the device layer 702 opposite the first/upper face. The integrated liquid delivery and evaporation layers 700 include liquid delivery layers 704 connected to the device layers 702 and evaporation layers 706 connected to the device layers 702 opposite the device layers 702. The liquid delivery layers 704 may include a structure such as matrix foil or a series of pillars that allows wicking of the liquid therethrough and facilitates transfer of heat from the device layers 702 to the evaporation layers 706. In this aspect, the liquid inlet of the manifold (not shown) is coupled to the liquid delivery layers 704 of both integrated liquid delivery and evaporation layers 700 and the vapor outlet of the manifold (not shown) is coupled to the evaporation layers 706 of both integrated liquid delivery layers. In various other aspects, single integrated liquid delivery layers and device layers are interspersed in alternating layers, as illustrated in FIGS. 18-21. In one aspect, illustrated in FIG. 19-21, a double sided cooling module for a MOSFET 900 and a double sided cooling module for a diode 901 are layered between two copper buses 902.

Figure 22:
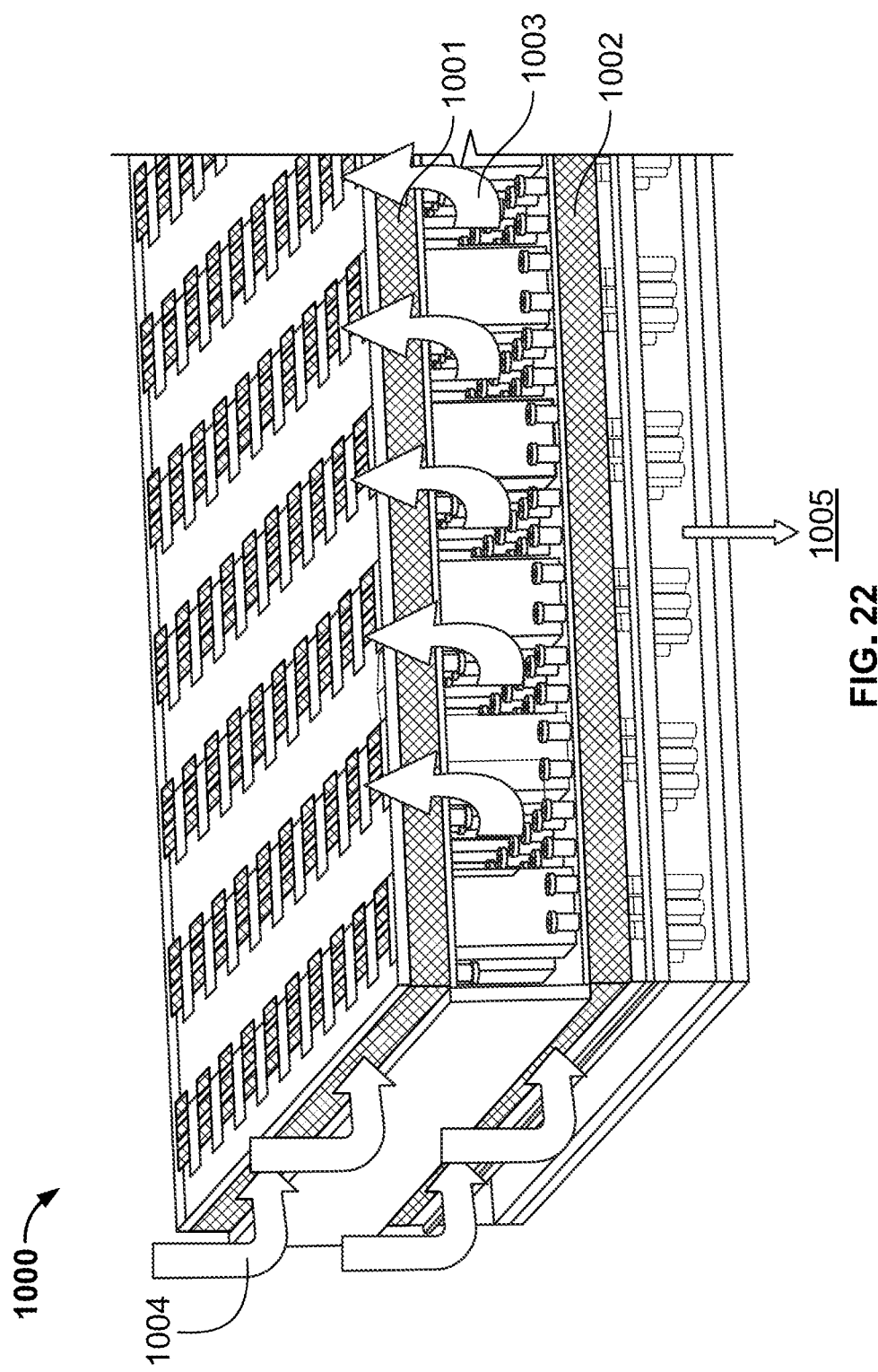
FIG. 22 is a schematic diagram of an assembly of a power device with a cooling module for 3D packaging of microelectronics.
Figure 23:
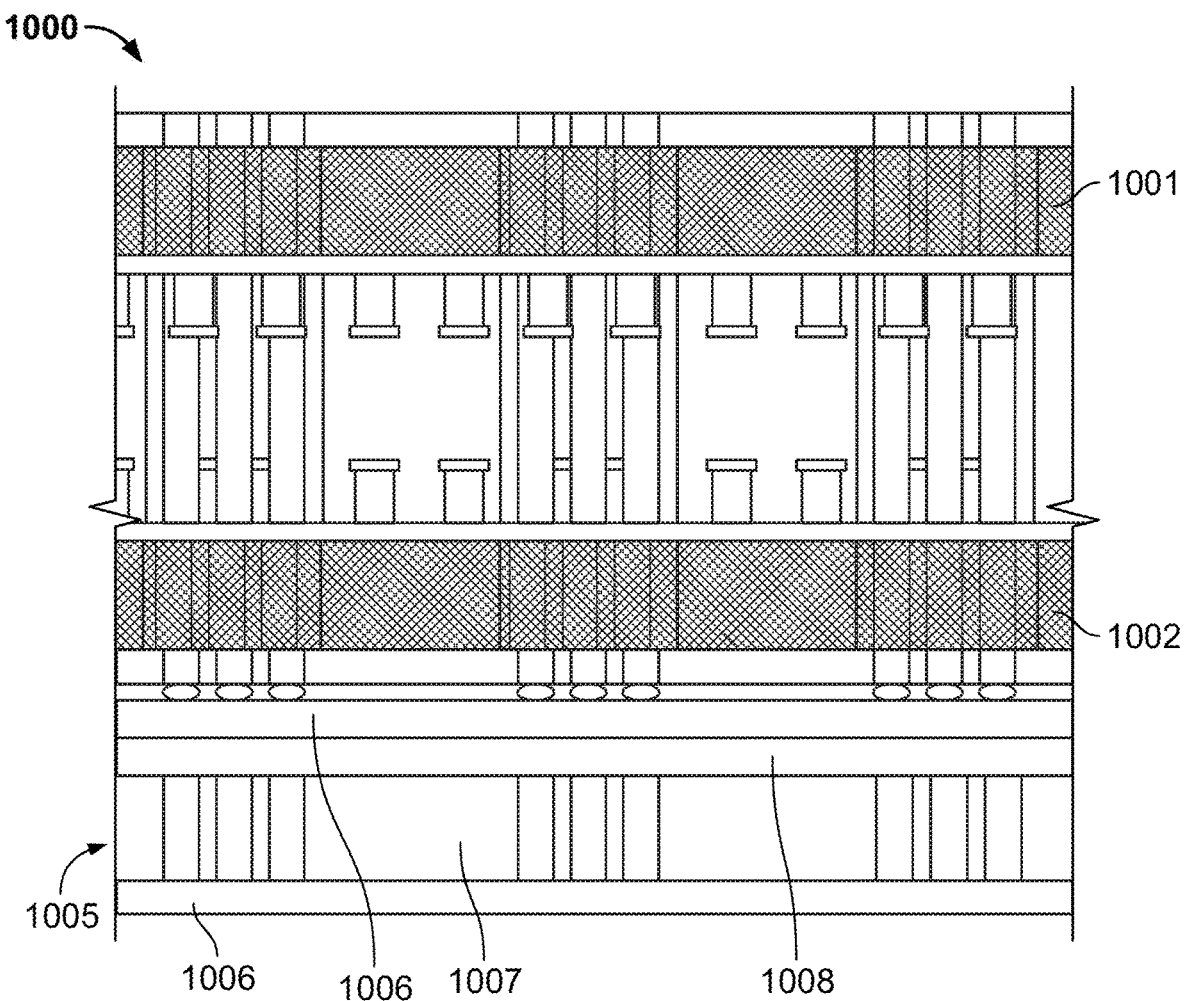
FIG. 23 is an enlarged cross-sectional view of a portion of the assembly shown in FIG. 22.
Figure 24:
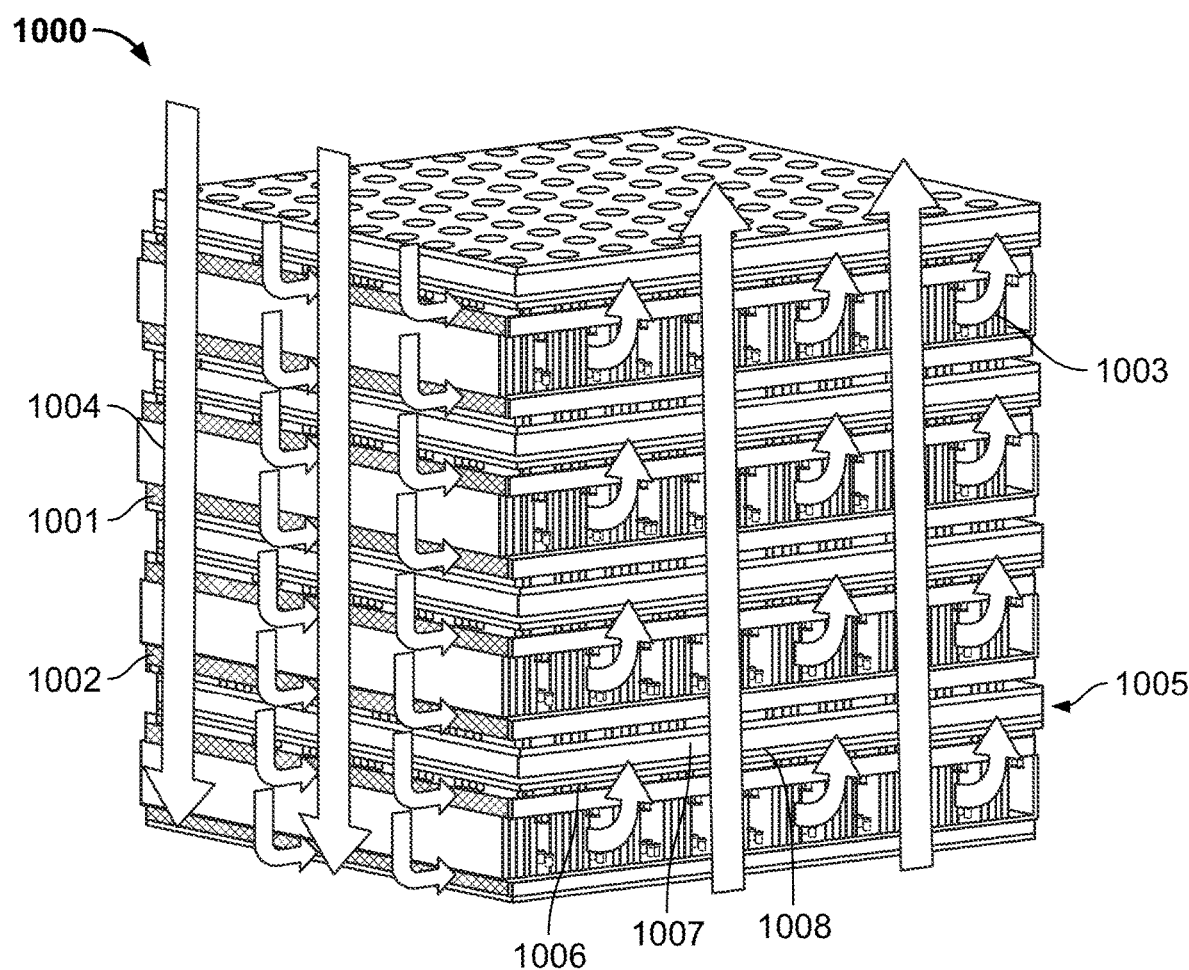
FIG. 24 is a schematic diagram showing fluid and vapor flow through a 3D assembly of the cooling module and power device for 3D packaging of microelectronics as illustrated in FIGS. 22 and 23.

In various other aspects, a pair of integrated liquid delivery layers are coupled together in an adjacent arrangement to form an assembly 1000 as illustrated in FIG. 22-24. As illustrated in FIG. 22, a first/upper integrated liquid delivery layer 1001 is coupled to a second/lower integrated liquid delivery layer 1002 are coupled such that a gap is maintained between a first evaporation layer of the first/upper integrated liquid delivery layer and a second evaporation layer of the second/upper integrated liquid delivery layer. In one aspect, the first and second evaporation layer are coupled via the through-silicon vias (TSVs) of a 3D electronic device package. In these aspects, the manifold is coupled to each evaporation layer and liquid delivery layer via the vapor outlet 1003 and liquid inlet 1004, respectively. In this aspect, the vapor produced by the evaporation layers of the coupled integrated liquid delivery layers is released into the gap between the evaporation layers, and passes into the vapor outlet of the manifold. In another aspect, the pair of integrated liquid delivery layers are coupled to a functional power device layer 1005, part of the 3D electronic delivery package. The functional power device layer 1005 is made up of a metal layer 1006, a silicon layer 1007, and a power semiconductor 1008.

In various additional aspects, multiple coupled pairs of integrated liquid delivery layers as described above are interspersed in alternating layers with device layers, as illustrated in FIG. 25-30. Each coupled pair of integrated liquid delivery layers are coupled to the liquid inlet and vapor outlet of a manifold.

Figure 25:
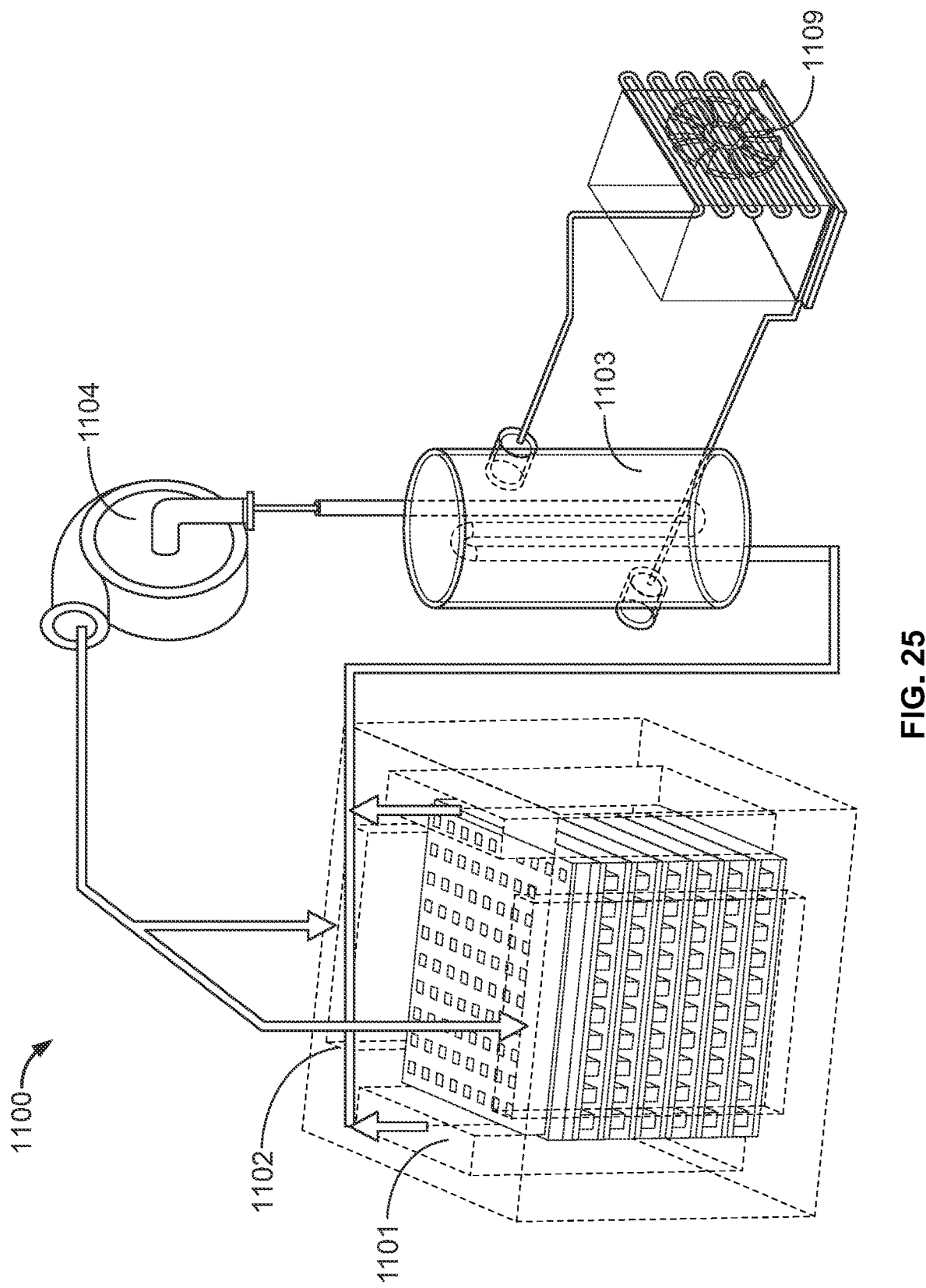
FIG. 25 is a schematic diagram of an integrated thermal management system for a 3D packed power module.
Figure 26:
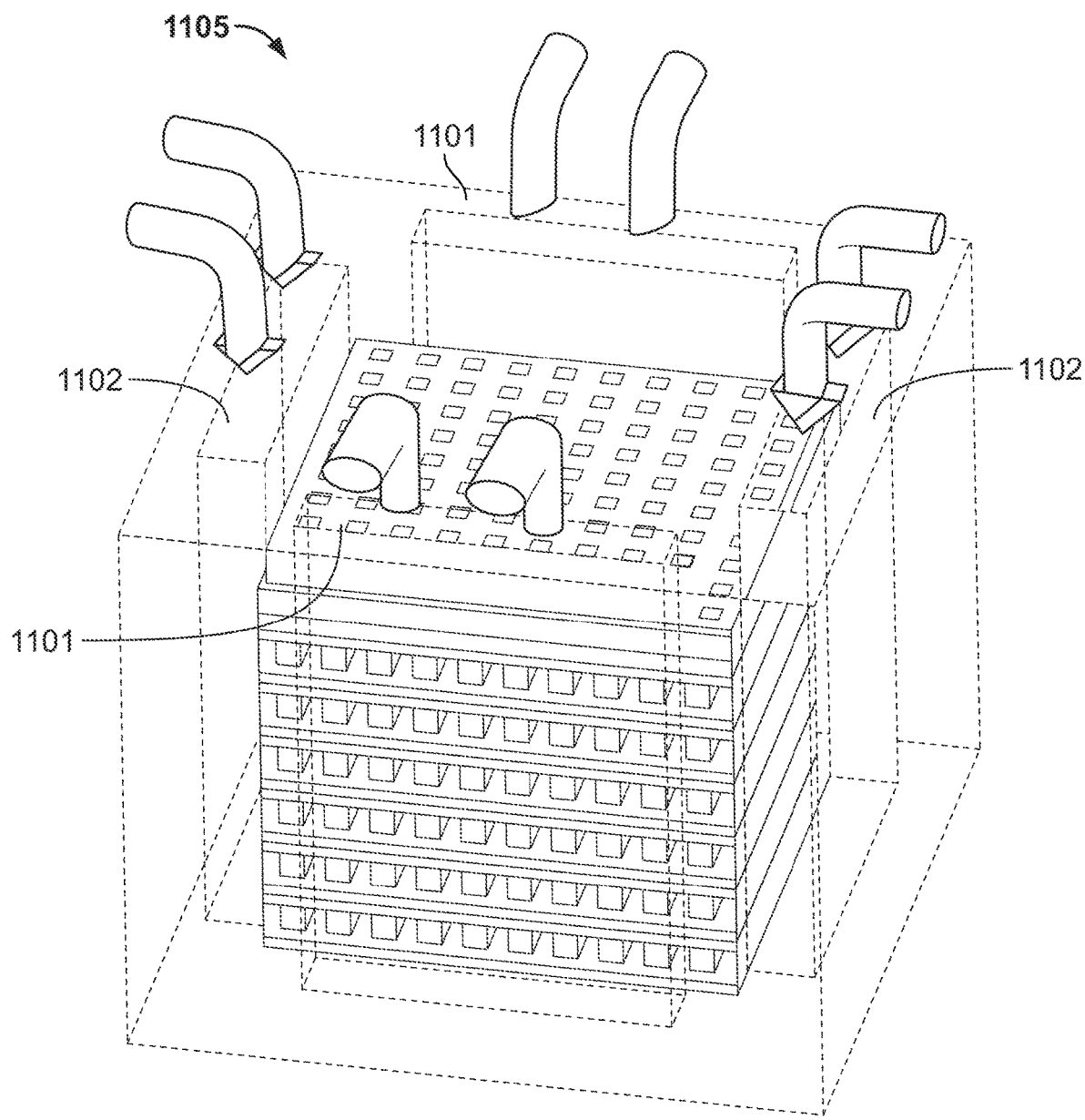
FIG. 26 is a schematic diagram of a portion of the thermal management system shown in FIG. 25.
Figure 27:
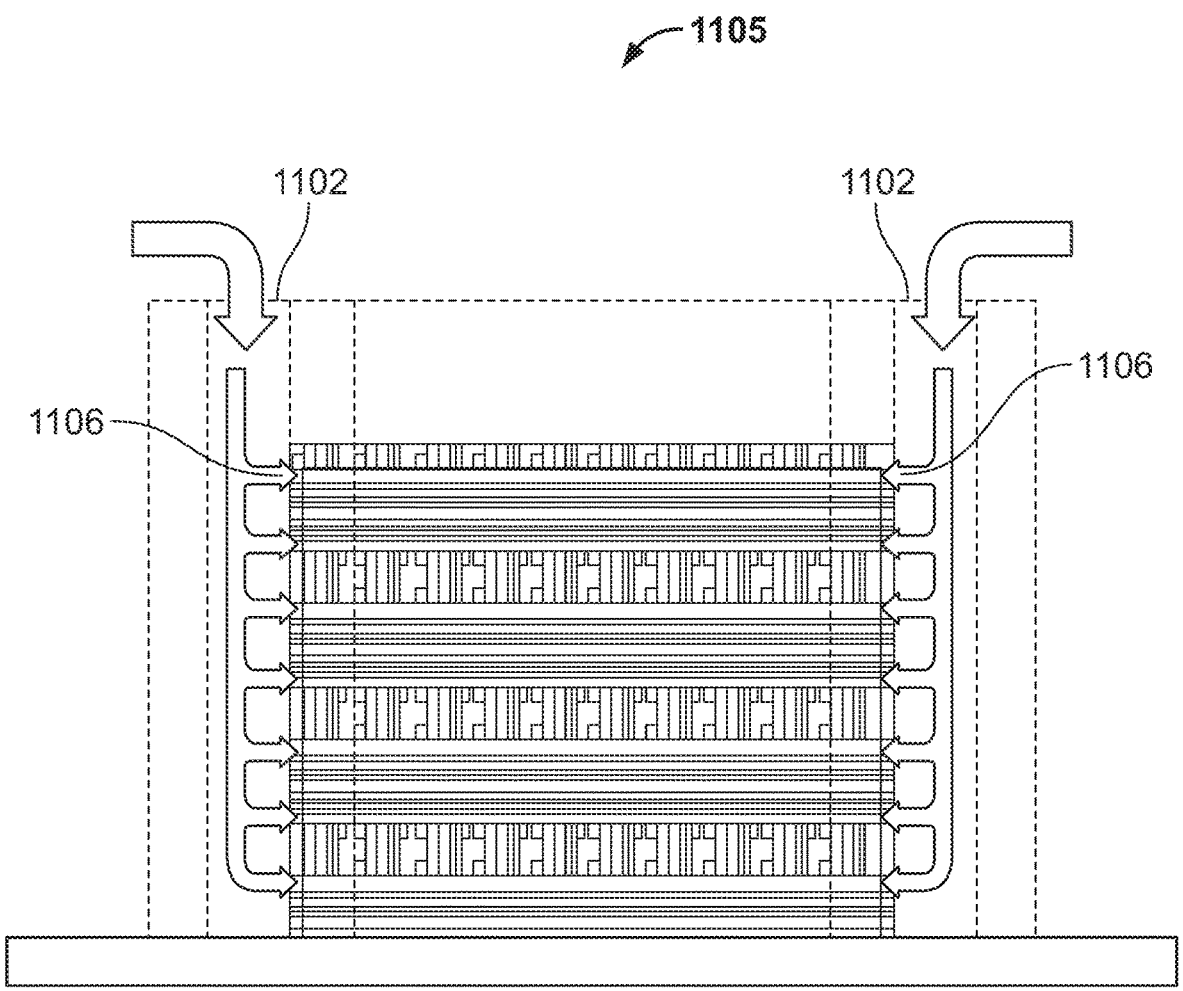
FIG. 27 is a sectional view of the portion of the thermal management system shown in FIG. 26, illustrating fluid delivered through the system using a manifold.
Figure 28:
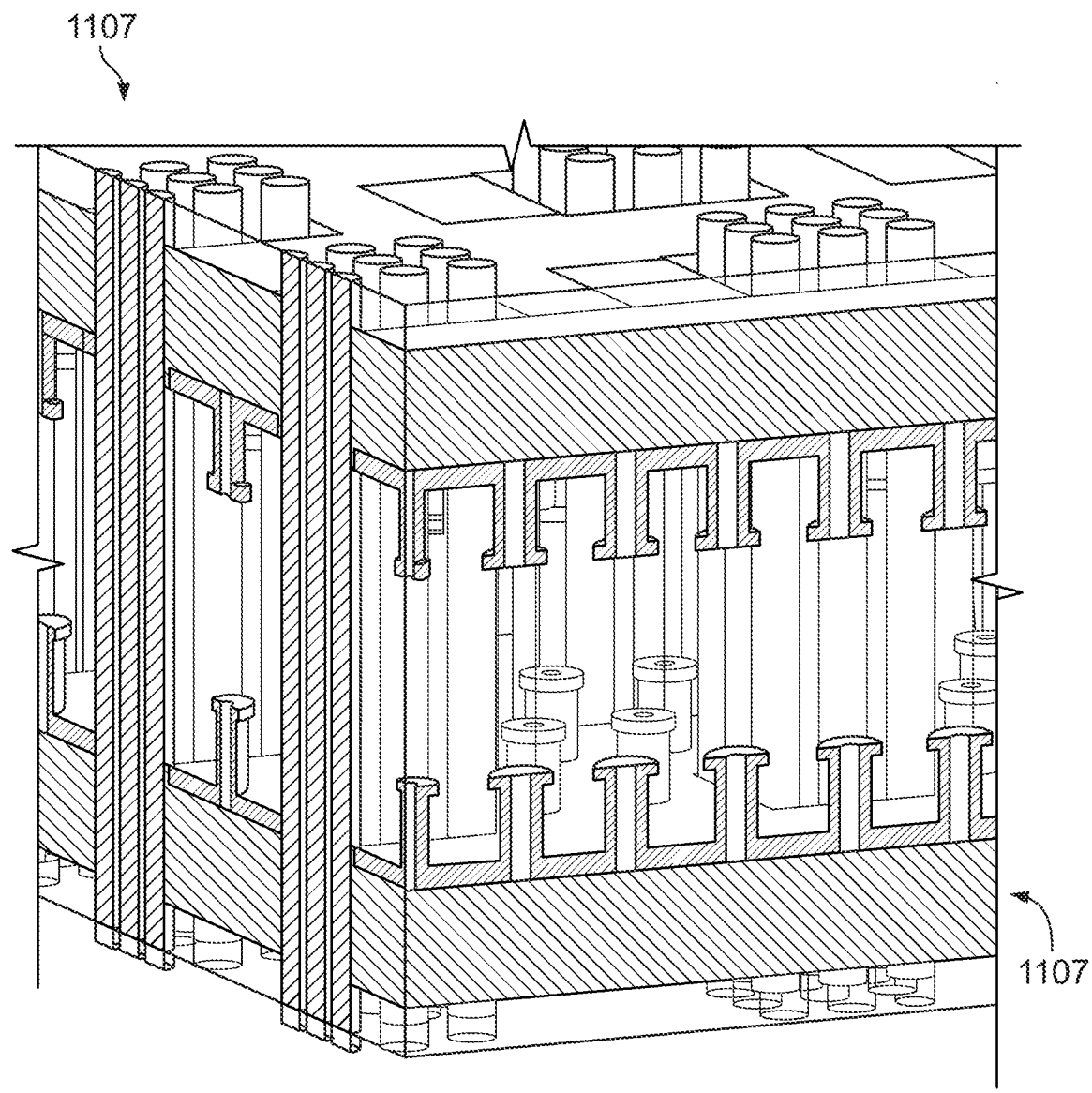
FIG. 28 is an enlarged view of a portion of the thermal management system shown in FIGS. 27 and 26, the system including hollow pillars.
Figure 29:
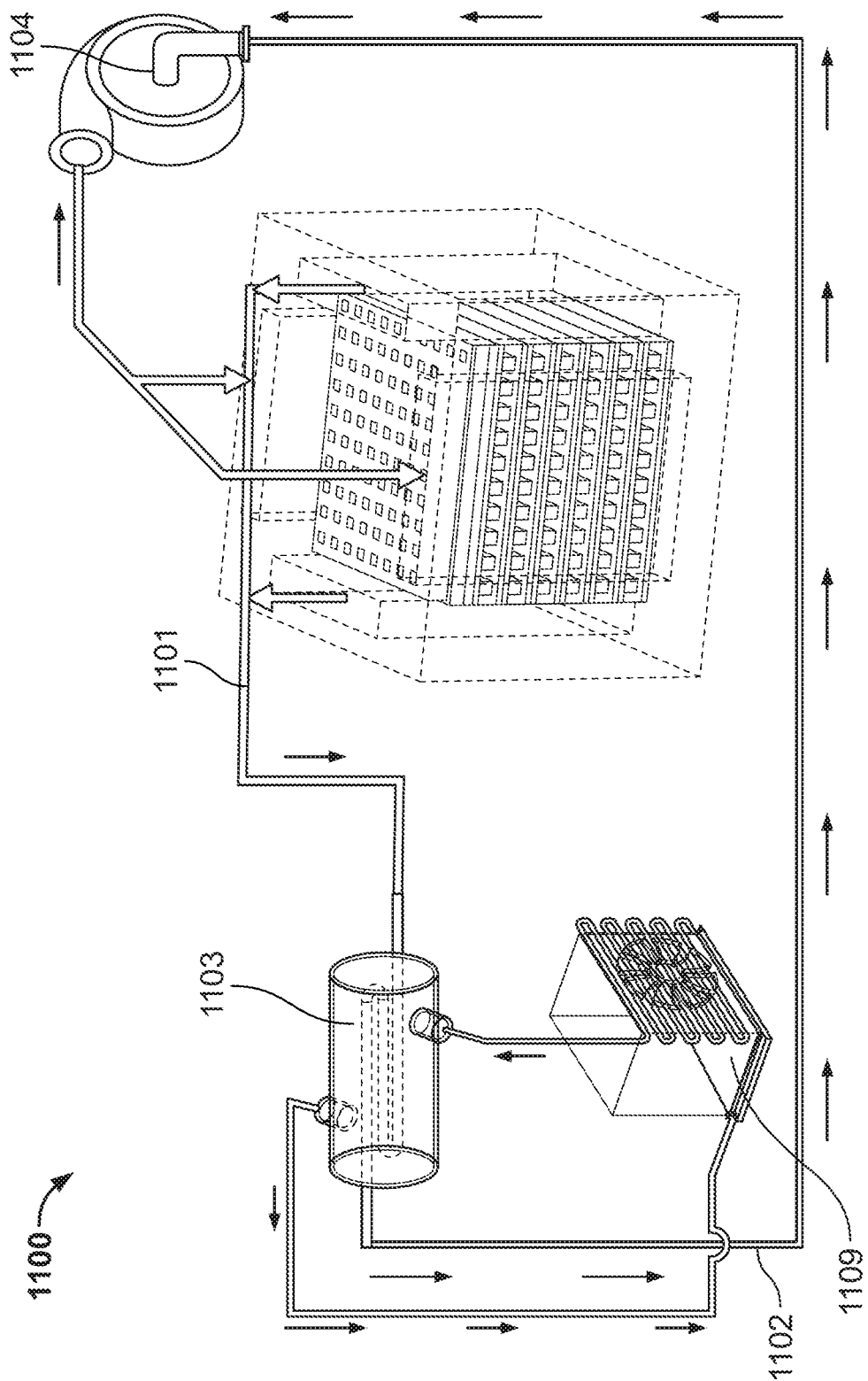
FIG. 29 is a schematic diagram of assembly of an integrated cooling system including an external heat rejection flow loop and a 3D IC packaging with interlayer evaporative cooling platforms.

In other aspects, illustrated in FIG. 25, a thermal management system 1100 further includes a cooling fluid reconditioning loop coupled to the manifold 1105. The cooling fluid reconditioning loop is configured to receive vapor from the vapor outlets 1101 of the manifold and to deliver chilled cooling liquid back to the liquid inlets 1102 of the manifold 1105. As illustrated in FIGS. 25-30, the cooling fluid reconditioning loop includes a condenser 1103 coupled to the vapor outlet of the manifold. The condenser is configured to receive and convert vaporized cooling fluid to cooling liquid. In an embodiment shown in FIG. 29, the cooling fluid reconditioning loop further includes a radiator 1109 coupled to the condenser and configured to release heat from the cooling fluid. The cooling fluid reconditioning loop further includes a pump 1104 configured to move the reconditioned cooling fluid into the fluid inlet of the manifold. The manifold 1105 directs the cooling fluid into separate channels 1106 connected to integrated liquid delivery and evaporation layers 1107. The layers 1107 are configured to manage heat of multiple stacked electronic devices. The manifold 1105 substantially encloses the stacked electronic devices and the integrated liquid delivery and evaporation layers 1107. Moreover, the manifold 1105 is sized and shaped to allow the electronic devices and the integrated liquid delivery and evaporation layers 1107 to have a compact configuration and be modular. For example, the liquid inlets 1102 and the vapor outlets 1101 include channels extending along sides of the assembly.

Figure 30:
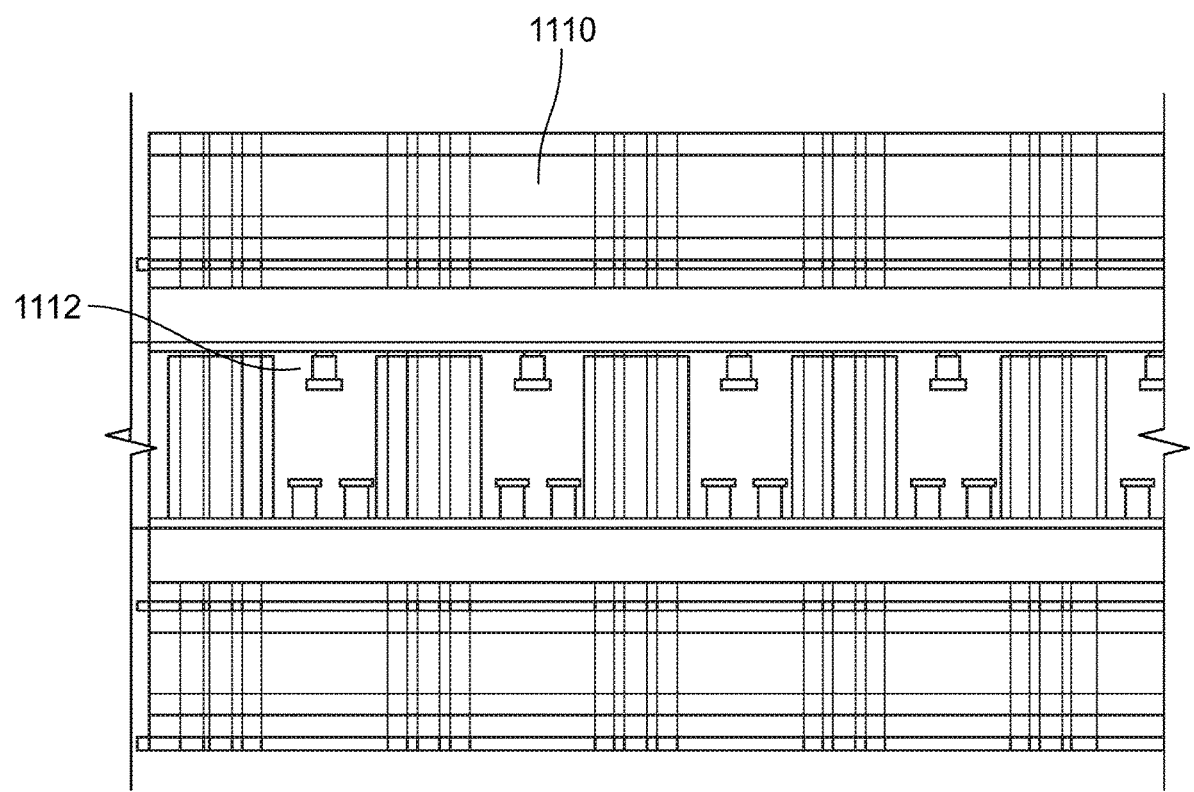
FIG. 30 is a sectional view of a portion of the integrated cooling system showing opposed evaporative layers with hollow pillars.

As illustrated in FIG. 30, the integrated liquid delivery and evaporation layers 1107 each include a liquid delivery layer 1110 configured to thermally couple to electronic components and an evaporation layer 1112 attached to the liquid delivery layer 1110 opposite the electronic components.

EXAMPLES

The following examples illustrate various aspects of the disclosure.

Example 1: Volume of Fluid (VOF) Modeling of Microdroplets on Circular, Square, and Triangular Micropillars In various aspects, a Volume of Fluid (VOF) numerical model is used to characterize the evaporation behavior of non-axisymmetrical microdroplets suspended on a hollow micropillar. In one aspect, the VOF model is used to characterize the heat and mass transfer over a non-axisymmetric microdroplet meniscus formed at the outlet of a hollow micropillar. In some aspects, equilibrium profiles and mass transport characteristics of droplets with circular, triangular, and square contact shapes are characterized using the Volume of Fluid (VOF) method. In one aspect, the VOF model is based on a volume of fluid (VOF) multiphase method that accounts for microconvection effects within the droplet and evaporative phase change transport at the liquid-vapor interface, and further provides representation of the vapor diffusion process in the air domain. In an aspect, evaporative mass transport at the liquid-vapor interface is modeled using a simplified Schrage model.

As described below, the VOF numerical model predicts highly non-uniform mass transport characteristics for non-axisymmetrical microdroplets, where a higher local evaporation rate is observed near the locations where the meniscus has high curvature. This observation is attributed to a higher local vapor concentration gradient that drives faster vapor diffusion at more curved regions, analogous to a lightning rod exhibiting a strong electric field along a highly curved surface. In various aspects, described below, this contact line confinement phenomenon may be used to artificially tune a droplet into a more curved geometry, resulting in enhanced total evaporation rate of as much as 13% from a triangular-based droplet compared to a spherical droplet with the same perimeter and liquid-vapor interfacial area. In various aspects, manipulation of contact line confinement may influence the design and optimization of geometric features to improve evaporation in high performance electronics cooling systems.

A transient three-dimensional simulation model using the Volume of Fluid method (VOF) is developed to predict the liquid pressure and capture the contact line dynamics as the meniscus advances from the inner channel to the outer edge of the hollow micropillar. The simulation tracks the evolution of the meniscus and corresponding pressure profile as the meniscus moves to different locations along the micropillar.

In one aspect, the VOF model employs one set of governing equations to solve for the liquid and vapor domains, using ANSYS Fluent. The computational solver is implemented to compute the conservation equations below:

Continuity:

$$\frac{\partial y}{\partial x} + \nabla \cdot (\alpha_k \vec{V} = 0),$$  Eqn. (18)

Momentum:

$$\frac{\partial}{\partial t}(\rho \vec{V}) + \nabla \cdot (\rho \vec{V}) = -\nabla p + \nabla \cdot [\mu(\nabla \vec{V} + \nabla \vec{V}^T)] + \rho \vec{g} + \vec{F},$$  Eqn. (19)

where $\alpha_k$, $\rho$, $\mu$, and $\vec{F}$ are the phase volume fraction, density, dynamic viscosity, and body force terms, respectively.

The interfacial forces are modeled using the Young-Laplace equation:

$$\vec{F}_\gamma = \gamma \kappa \nabla \alpha,$$  Eqn. (20)

where $\gamma$ and $\kappa$ are the surface tension and surface curvature, respectively.

The change in momentum due to the interfacial forces is expressed using the Continuous Surface Force (CSF) model:

$$\vec{F}_\gamma = \gamma \kappa \frac{\rho}{\rho_f + \rho_g} \nabla \alpha$$  Eqn. (21)

A three-dimensional computational domain is used for the simulation. In this model, a micropillar is considered, with an inner diameter, outer diameter, and thickness of 2.5 μm, 5 μm, and 25 μm, respectively.

In this model, grid independence is established using a 3D unstructured hexahedral mesh with three different mesh sizes. The coarsest mesh has 0.3 million computational nodes in the domain and is refined twice, up to 2.1 million hexahedral nodes. A mesh sensitivity analysis is performed by monitoring local pressure values at the inlet and outlet of the computational domain. The final mesh generated has a comparatively modest 0.8 million nodes, which minimizes computational effort. There is only a minimal pressure difference (≤1.3%) between the finest mesh size and the meshes implemented for these studies. The micropillars are periodically arranged, and therefore symmetric boundary conditions are used for all sidewalls. An inlet boundary velocity is determined based on a capillary number, Ca, at the micropillar inlet. In order to explore if the dynamic effects (e.g., viscous and inertial effects) are significant in the liquid pinning performance, three different inlet conditions were chosen, with Ca number equaling 0.001, 0.01, and 0.05. The surface tension, c, is assumed to be constant, and a constant pressure outlet boundary condition is applied at the outlet. Details of the input parameters, fluid properties, and solution methods for numerical modeling are summarized in Table 1.

TABLE 1

Input parameters and modeling setup for numerical simulation.

| Input parameters | Value | | | |
|---|---|---|---|---|
| Ourer diameter, D | 5 μm | | | |
| Inner diameter, d | 2.5 μm | | | |
| Micropillar height, h | 5 μm | | | |
| Membrane width, | 16 μm | | | |
| Liquid inlet temperature, $T_{in}$ | 293 K | | | |
| Liquid inlet | Mass flow rate, $\dot{m}_{s1}$ | $2 \times 10^{-10}$ kg/s | $2 \times 10^{-9}$ kg/s | $1 \times 10^{-8}$ kg/s |
| | Ca number | 0.001 | 0.01 | 0.05 |
| Outlet gauge pressure, $p_{out}$ | 0 kPa | | | |
| Properties | Water | | FC-40 | |
| Surface tension | $7.3 \times 10^{-2}$ N/m | | $1.6 \times 10^{-2}$ N/m | |
| Viscosity | $1.0 \times 10^{-3}$ kg/m·s | | $4.3 \times 10^{-4}$ kg/m·s | |
| Membrane contact angle | 10° | | 3° | |
| Solution methods | Setup | | | |
| Number of meshes | 0.8 million hexahedral meshes | | | |
| Surface tension modeling | Continuous Surface Force (CSF) | | | |
| Pressure-Velocity Coupling | Pressure Implicit with Splitting of Operator (PISO) | | | |
| Spatial discretization | Gradient | | Green-Gauss Node Based | |
| | Pressure | | PREssore STaggering Option (PRESTO!) | |
| | Momentum | | Second Order Upwind | |
| | Volume Fraction | | Geo-Reconstruct | |
| Time Stepping Method | Variable | | Global Courant = 2 | |

The maximum Laplace pressure is calculated by subtracting the viscous effects from the total pressure drop predicted using the Hagen-Poiseuille equation:

$$\Delta p_{viscous} = \frac{128\ \mu h Q}{\pi d^4} \qquad \text{Eqn. (22)}$$

Figure 31:
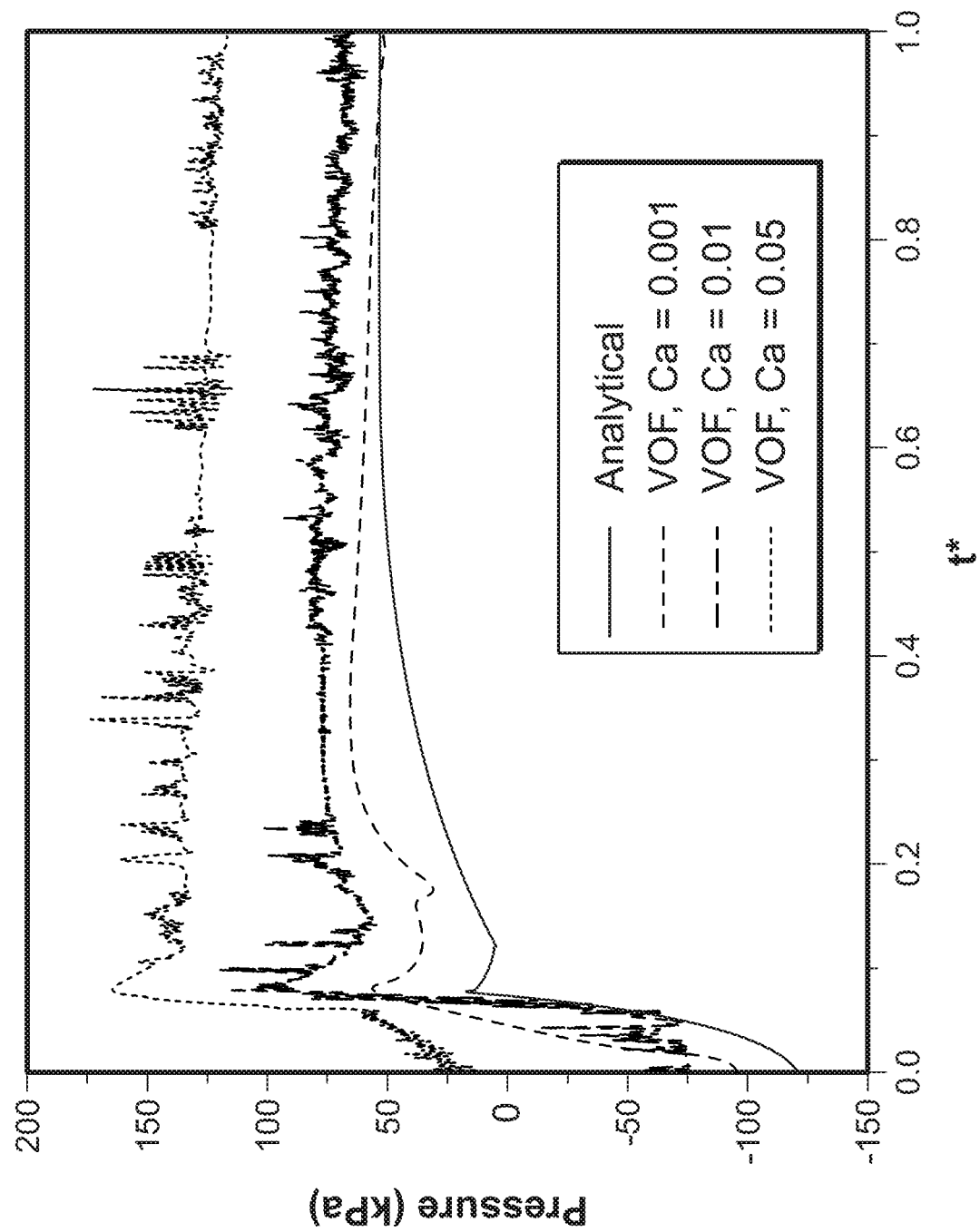
FIG. 31 is a graph illustrating VOF simulation results for water, showing the evolution of the meniscus and the corresponding capillary pressure at different micropillar locations under three flow rates.

FIG. 31 illustrates VOF simulation results for water, showing the evolution of the meniscus and the corresponding capillary pressure at different micropillar locations under three flow rates. The pressure response shown in FIG. 31 reveals similar trends in pressure variation, as predicted from quasi-static analytical calculations, in which the wicking, pivoting, advancing, and expansion stages are delineated clearly by changes in pressure. The fluctuations in the pressure signal are attributed to perturbation and instability during volume growth. Nevertheless, with increasing flow rate, there is a considerable increase in the liquid pressure due to the intensified viscous pressure. If the viscous pressure drop is subtracted based on Hagen-Poiseuille flow, the critical bursting pressure can be obtained, as shown in Table 1:

TABLE 2

Maximum bursting pressure for three different Ca numbers, using water.

| Capillary number | Viscous pressure (kPa) | Laplace burst pressure (kPa) | Total pressure (kPa) |
| --- | --- | --- | --- |
| 0.001 | 1.9 | 51 | 52.9 |
| 0.01 | 18.7 | 46.6 | 65.3 |
| 0.05 | 93.4 | 23.9 | 117.3 |

The results reveal that when the flow rate is increased by 10 and 50 times, the burst Laplace pressure is reduced by 8.6% and 53%, respectively. The time is normalized, with pivoting starting at t*=0 and the bursting occurring at t*=1. The results further suggest that the results obtained with the quasi-static assumption will no longer hold for high Ca flow and that the critical burst criterion is dependent on the liquid velocity.

Figure 32:
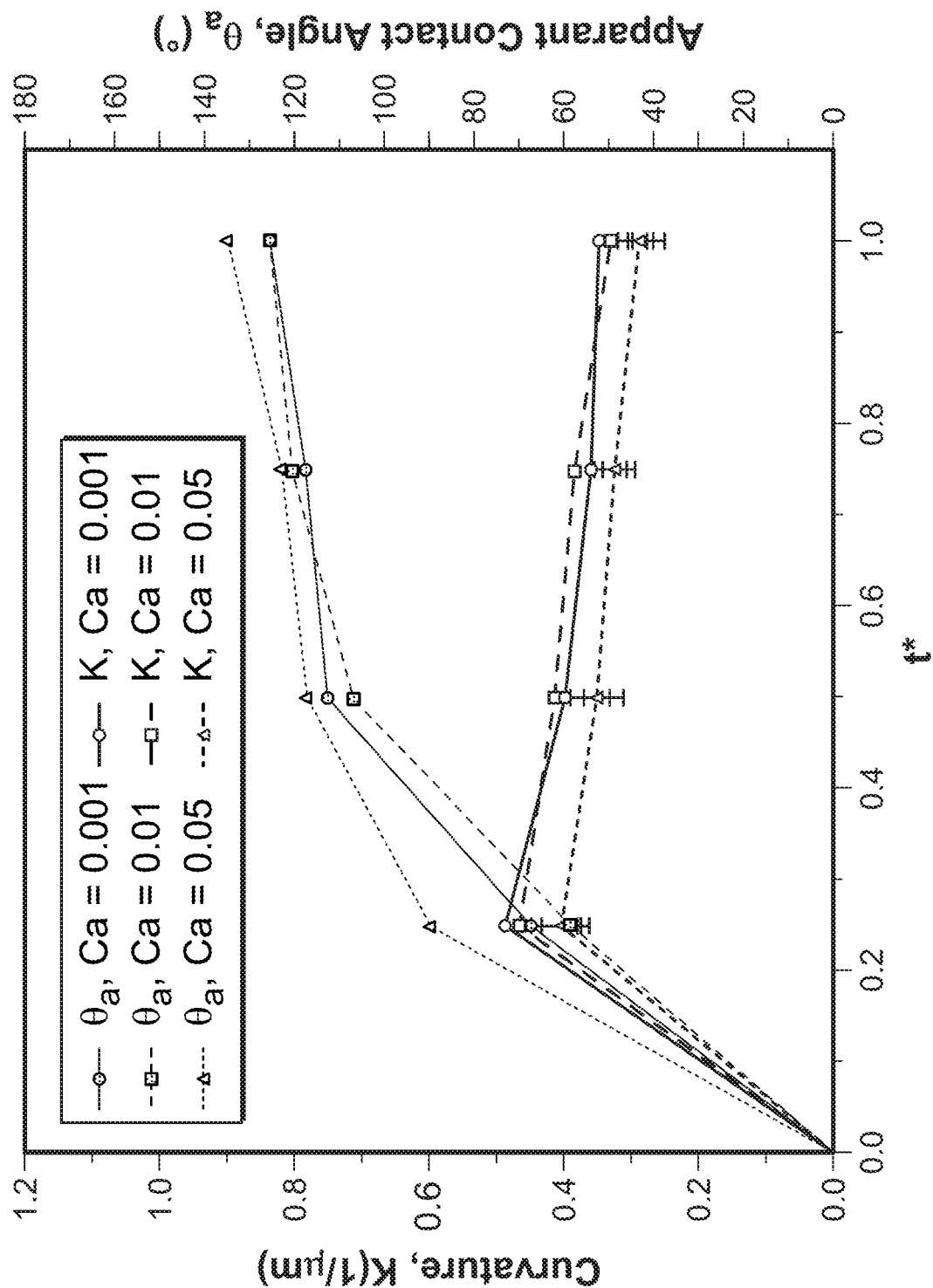
FIG. 32 is a graph of comparing mean curvature and apparent contact angles for droplets, the graph illustrating the geometric evolution of the liquid droplet from a flat liquid meniscus to liquid burst.

FIG. 32 shows the geometric evolution (i.e., mean curvature and apparent contact angle) of the liquid droplet, starting with a flat liquid meniscus (in the middle of the pivoting stage) and ending with liquid burst. Time is normalized with an initially flat meniscus (curvature equals to zero) at t*=0 and liquid bursting at t*=1. It is evident from the difference in critical contact angle that the shapes of the liquid menisci at the burst points deviate from a capped sphere. A decrease in the mean curvature, κ, is also observed for high Ca flow, which corresponds to a lower Laplace pressure. The decrease is particularly significant for Ca=0.05, where the mean burst curvature is reduced from 0.35 µm$^{-1}$ to 0.28 µm$^{-1}$. The liquid expands to a larger critical volume before bursting under the higher flow rate (i.e., high Ca number). The inconsistency in the liquid profile and pressure during the process under three flow rates suggests that burst behavior cannot be described solely by quasi-static analysis. This finding suggests that at sufficiently high flow rates, the surface tension force is no longer strong enough to instantly restore the shape of the liquid meniscus to its equilibrium condition. Therefore, the liquid will undergo an anisotropic expansion with a higher growth rate in the vertical direction, during which the surface energy is no longer at its minimized value. Such a dynamic effect can be quantitatively analyzed by calculating the change in liquid volume within the time constant, s, associated with the shape restoration by surface tension. Considering the perturbation of a liquid droplet held together by surface tension, the frequency of the n$^{th}$ oscillation mode in air is given by:

$$f = \sqrt{n(n-1)(n+2)\frac{\gamma}{\rho r_{droplet}^3}}, \qquad \text{Eqn. (23)}$$

where γ is the surface tension, ρ is the density, and $r_{droplet}$ is the radius of the droplet. Using water as an example with $r_{droplet}$=2.5 µm, the dominant mode of oscillation frequency (n=2) is calculated to be $f_{n=2}$=6.11×10$^6$ Hz.

Figure 33:
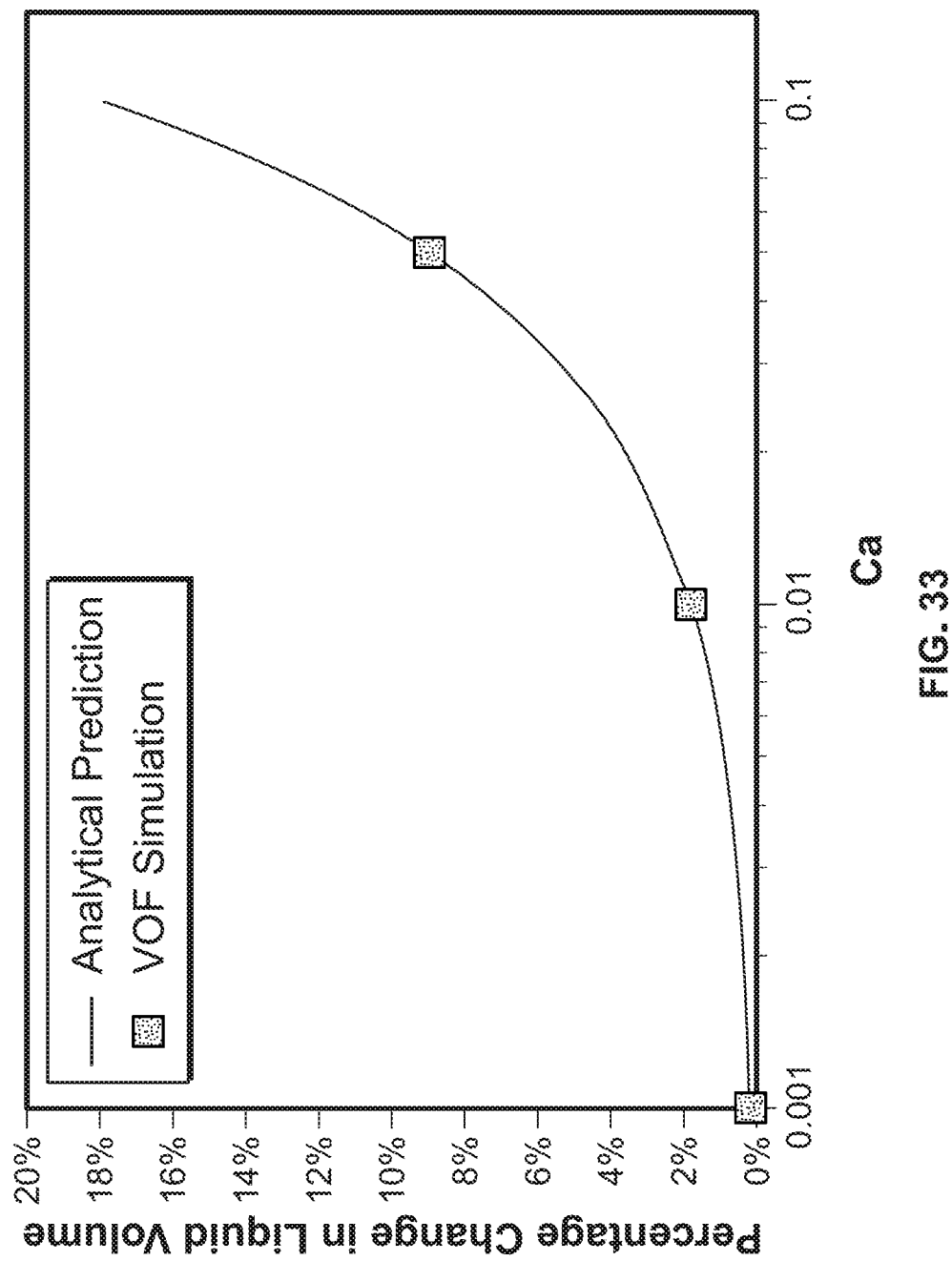
FIG. 33 is a graph of the percentage change in liquid volume within a specified time constant s for a liquid droplet with hemispherical geometry under different apparent contact angle numbers.

Therefore, the time constant for the liquid to restore to its equilibrium shape from a small deformation is given by $\tau=1/f_{n=2}$=0.16 µs. FIG. 33 illustrates the percentage change in liquid volume within the specified time constant s for a liquid droplet with hemispherical geometry under different Ca numbers. The result shows that for Ca number of 0.001, 0.01 and 0.05 respectively, the liquid droplet undergoes 0.2%, 2% and 9% volume changes before its surface can be restored to an equilibrium spherical shape. Therefore, the liquid meniscus will not be able to maintain its minimum energy state during expansion under high Ca number conditions. The quasi-static assumption that the droplet will always be at its local equilibrium condition becomes invalid under high Ca numbers, where the change in liquid volume becomes significant. The competing effects of the surface tension and the dynamic forces cause the liquid meniscus to oscillate in shape while expanding in volume, therefore resulting in different characteristics for the pressure traces and burst criterion. Since the deformation in meniscus geometry is stronger for high Ca number flows, the liquid droplet will exhibit greater burst volume, larger burst curvature κ, and smaller burst pressure under high flow conditions.

To characterize the evaporation characteristics of microdroplets pinned to the surface of micropillars with circular, square, and triangular shapes, shown illustrated in FIGS. 13-15, respectively, the following experiments were conducted.

A Volume of Fluid (VOF) model, described above, was used to simulate the evaporation of pinned droplets from the surface of the micropillars described above. All VOF simulations were performed with isothermal conditions at room temperature.

The VOF model included mathematical representations of various aspects of microdroplet formation and evaporation, as described in detail below.

The pressure difference between the liquid and vapor at the interface was described by the Young-Laplace equation:

$$p_v = p_l + p_c + p_d \qquad \text{Eqn. (24)}$$

where $p_v$, $p_l$, $p_c$, and $p_d$ are defined as the vapor pressure, liquid pressure, capillary pressure, and disjoining pressure, respectively.

In the liquid domain, incompressible liquid flow was described by the continuity and momentum equations:

$$\nabla \cdot (\vec{V}) = 0 \qquad \text{Eqn. (25A)}$$

$$\rho\left(\frac{d\vec{V}}{dt} + (\vec{V} \cdot \nabla)\vec{V}\right) = -\nabla p + \nabla(\mu \nabla \vec{V}) \qquad \text{Eqn. (25B)}$$

In the gas domain, the species transport was described by Eqn. (25C):

$$-\vec{V} \cdot \nabla C_v + \nabla \cdot (D \nabla C_v) = 0 \qquad \text{Eqn. (25C)}$$

The Schrage model was used to model how the liquid evaporates at the liquid-vapor interface, as shown in Eqn. (26):

$$m'' = \frac{2\sigma}{2-\sigma}\left(\frac{\overline{M}}{2\pi \overline{R}}\right)^{\frac{1}{2}}\left(\frac{p_{v_{eq}}(T_{lv})}{T_{lv}^{1/2}} - \frac{p_v}{T_v^{1/2}}\right) \qquad \text{Eqn. (26)}$$

where m" was mass flux at the interface, σ was the accommodation coefficient, $\overline{M}$ was the molecular weight of the liquid, $\overline{R}$ was the universal gas constant, $p_{v_{eq}}$ was the equilibrium pressure, $T_{lv}$ was the temperature of the interface, and $T_v$ was the temperature of the vapor. The Schrage model was simplified by assuming the interface temperature to be equal to the vapor temperature ($T_{lv}=T_v$) near the interface, and by neglecting the disjoining pressure and capillary pressure where the size of the geometry was sufficiently large.

Equilibrium vapor pressure was calculated by the Clausius-Clapeyron equation, as shown in Eqn. (27):

$$p_{v_{equ}}(T_{lv}) \approx p_{sat}(T_{lv}) = p_{sat_{ref}} \exp\left[\frac{\overline{M}h_{fg}}{\overline{R}}\left(\frac{1}{T_{sat_{ref}}} - \frac{1}{T_{lv}}\right)\right] \qquad \text{Eqn. (27)}$$

After applying all the assumptions above, the Schrage model was simplified to Eqn. (28):

$$m''_{evap} = \frac{2\sigma}{2-\sigma}\left(\frac{\overline{M}}{2\pi \overline{R}}\right)^{\frac{1}{2}} \frac{1}{T_{lv}^{\frac{1}{2}}}\left\{p_{sat_{ref}} \exp\left(\frac{\overline{M}h_{fg}}{\overline{R}}\left(\frac{1}{T_{sat_{ref}}} - \frac{1}{T_{lv}}\right)\right)\right\} \qquad \text{Eqn. (28)}$$

The mass flux at the interface for each component in the gas domain was obtained from the convection and diffusion term in Eqn. (25C) as shown in Eqn. (29) and Eqn. (30):

$$m''_v = \overline{M} \cdot \left(-D\frac{\partial C_v}{\partial n} + \vec{V}_n C_v\right) \qquad \text{Eqn. (29)}$$

$$m''_{air} = \overline{M} \cdot \left(-D\frac{\partial C_{air}}{\partial n} + \vec{V}_n C_{air}\right) \qquad \text{Eqn. (30)}$$

Since there was no air diffusion at the liquid-vapor interface, $m''_{air}=0$ and $\hat{V}_n$ was derived as:

$$\vec{V}_n = \frac{1}{C_{air}} \cdot D\frac{\partial C_{air}}{\partial n} = -\frac{1}{C_g - C_v} \cdot D\frac{\partial C_v}{\partial n} \qquad \text{Eqn. (31)}$$

$\hat{V}_n$ was substituted into Eqn. (29) and the vapor mass flux was expressed as Eqn. (32):

$$m''_v = \overline{M} \cdot D\frac{\partial C_v}{\partial n}\left(1 + \frac{C_v}{C_g - C_v}\right) \qquad \text{Eqn. (32)}$$

At the interface, the evaporation rate was equal to the vapor mass flux. Vapor pressure and vapor concentration rate can then be calculated using Eqn. (33) and Eqn. (34) (shown below).

$$p_v = p_{equ} - m''_v \bigg/ \left[\frac{2\sigma}{2-\sigma}\left(\frac{\overline{M}}{2\pi \overline{R}}\right)^{\frac{1}{2}} \frac{1}{T_{lv}^{\frac{1}{2}}}\right] \qquad \text{Eqn. (33)}$$

$$C_v = \frac{p_v C_g}{p_{atm}} \qquad \text{Eqn. (34)}$$

In the VOF method described above, the interface cells consisted of the liquid phase and air-mix phase, with a phase indicator. At the interface, the density and viscosity were defined by Eqn. (35) and Eqn. (36):

$$\rho = \varphi \rho_{liquid} + (1-\varphi)\rho_{vapor} \qquad \text{Eqn. (35)}$$

$$\mu = \varphi \mu_{liquid} + (1-\varphi)\mu_{vapor} \qquad \text{Eqn. (36)}$$

The mass conservation for each phase was ensured by the incorporation of Eqn. (37):

$$\frac{\partial \psi}{\partial t} + \vec{V}\nabla \psi = Src \qquad \text{Eqn. (37)}$$

where Src represents a volumetric source term. The phase change induced heat transfer was computed using Eqn. (38):

$$Q = -j \cdot Src \qquad \text{Eqn. (38)}$$

The energy equation was given by Eqn. (39):

$$\frac{\partial (\rho E)}{\partial t} + \nabla \vec{V} \cdot [(\rho E + p)] = \nabla \cdot (k\nabla T) + Q \qquad \text{Eqn. (39)}$$

At the liquid-vapor interface, the evaporation mass flux calculated by the Schrage model was set equal to the vapor diffusion flux derived from the gas domain governing equation. This allowed the calculation of the local evaporation rate along the meniscus after several iterations. A user defined function (UDF) was written based on the mathematical model previously discussed and was implemented in ANSYS Fluent R17.1 to perform the simulations.

The VOF model was implemented subject to several boundary conditions described below. The outlet boundary was set as constant atmospheric pressure to simulate the microdroplet's evaporation in ambient environment. Adiabatic non-slip walls were assumed along the micropillar top surface. The surface was assigned an equilibrium contact angle, $\theta_e$, of 23° to enable the droplet to relax its geometry and attain different equilibrium states on different micropillars. In order to initiate the evaporation process in the transient VOF simulation, the simulation domain was initialized with a vapor mass-fraction of 5%.

Initially, the inlet boundary was set as a mass-flow inlet condition with a mass flow rate of $1 \times 10^{-9}$ kg/s. After the liquid formed a convex meniscus with its contact line pinned on the pillar edge, the inlet boundary condition was changed to a pressure inlet. The pressure value was adjusted carefully, allowing the meniscus to expand and equilibrate so that the total liquid vapor interfacial area was equivalent to a pre-set value. In the simulation, the total liquid-vapor interfacial area was kept constant ($2 \times 10^{-11}$ m$^2$) for evaporation from all three micropillars. The total interfacial surface areas for the hemispherical, triangular, and square microdroplets were calculated using Surface Evolver.

In this study, the VOF method was implemented using ANYSTS Fluent R17.1 to simulate two-phase evaporation with a free surface. Each phase was calculated and separated with a volume fraction in mesh cells. This procedure was more flexible and efficient than other methods for treating complicated free boundary configurations. To model the mass transport at the evaporating interface, a user defined function (UDF) was developed to implement the simplified Schrage model. The source terms in both the mass transfer equation and energy transport equation are created using a user-defined scalar (UDS).

ICEM 18.0 software was used to generate a structured mesh with a hexahedron shape for the simulation. Because the VOF method was characterized by the mesh of the geometry, the mesh resolution significantly influenced the simulation result. A mesh sensitivity study was conducted to compare three levels of mesh resolution. The base element lengths were 5 nm for fine mesh, 12.5 nm for medium mesh, and 20 nm for coarse mesh. The thickness of the interface (transition region from liquid to vapor) of the coarse mesh was 200% larger than that of the medium mesh, while the difference between the fine mesh and medium mesh was only 10%.

Ideally, the interface should be as thin as possible; however, this was not observed for the coarse mesh. Table 2 and Table 3 as shown below summarize the total evaporation rates of droplets modeled using the three mesh resolution levels described above, using the Schrage model as described above. The equilibrium evaporation rates of the results from coarse mesh were 7.1% larger than those of medium mesh, and the difference between the results from the fine mesh and coarse mesh was only 1%. Therefore, we chose the medium mesh with an element length of 12.5 nm for the simulation. The mesh-independence for both the square pillar case and the triangular pillar case were tested, and the results are shown in Table 3 and 4 respectively.

TABLE 3

Mesh-independence results for the square case

| | Fine mesh (5 mm) | Medium mesh (1.5 mm) | Coarse Mesh (20 mm) |
|---|---|---|---|
| Number of cells | 13,547,920 | 3,386,980 | 964,995 |
| Total evaporation rate (kg/s) | $1.36 \times 10^{-13}$ | $1.38 \times 10^{-13}$ | $1.49 \times 10^{-13}$ |

TABLE 4

Mesh-independence results for the triangular case

| | Fine mesh (5 mm) | Medium mesh (1.5 mm) | Coarse Mesh (20 mm) |
|---|---|---|---|
| Number of cells | 14,098,128 | 3,524,532 | 881,113 |
| Total evaporation rate (kg/s) | $1.54 \times 10^{-13}$ | $1.57 \times 10^{-13}$ | $1.69 \times 10^{-13}$ |

Details of input parameters, working fluid properties, and the numerical solution methods are summarized in Table 5:

TABLE 5

Input parameters and modeling setup

| Input Parameters | Value | | |
|---|---|---|---|
| Outer Diameter, D | 5 μm | | |
| Inner Diameter, d | 2.5 μm | | |
| Interfacial Area, A | $2 \times 10^{-11}$ m$^2$ | | |
| Perimeter, L | $1.57 \times 10^{-5}$ m | | |
| Liquid Temperature, $T_l$ | 300 K | | |
| Vapor Temperature $T_v$ | 300 K | | |
| Outlet Pressure, $P_{outlet}$ | 101325 Pa | | |
| Properties | Water | | |
| Accommodation coefficient, σ | 1.0 [43] | | |
| Surface Tension | $7.3 \times 10^{-2}$ N/m | | |
| Dynamic Viscosity, μ | $1.0 \times 10^{-3}$ kg/m-s | | |
| Equilibrium contact angle, $\theta_e$ | 23° | | |
| Solution methods | Setup | | |
| Number of Cells | Circular | Triangular | Square |
| | 235,623 | 3,524,532 | 3,386,980 |
| Pressure | Pressure Staggering Option (PRESTO!) | | |
| Momentum | Second Order Upwind | | |
| Volume Fraction | Geo-Reconstruct | | |
| Time Stepping Method | Variable: Global Courant = 2 | | |

An analytical model was established using Popov's model (expressed in Eqn. (40) and Eqn. (41) using MATLAB:

$$m''(r) = D\frac{n_s - n_\infty}{R_i}\left[\frac{1}{2}\sin\theta + \sqrt{2}(\cosh\kappa + \cos\theta)^{3/2}\right] \quad \text{Eqn. (40)}$$

$$\int_0^\infty \frac{\cosh\theta\tau}{\cosh\pi\tau}\tanh[(\pi - 0)\tau]P_{-\frac{1}{2}+i\tau}(\cosh\kappa)\tau d\tau$$

$$\frac{dM}{dt} = -\pi r_i D(n_s - n_\infty)f(\theta); \quad \text{Eqn. (41)}$$

$$f(\theta) = \frac{\sin\theta}{1+\cos\theta} + 4\int_0^\infty \frac{1+\cosh 2\theta\tau}{\sinh 2\pi\tau}\tanh[(\pi - \theta)\tau]d\tau$$

where f(θ) was a function of the contact angle, m"(r) was evaporation flux, $n_s$ was density of the saturated vapor, $n_\infty$ was ambient vapor density, $\theta_e$ was equilibrium contact angle, KC was droplet interface in toroidal coordinates, $P_{-1/2+i\tau}$ was a Legendre function of the first kind, M was total evaporation rate, and τ was nondimensional time.

Since Popov's model is applied in axisymmetric systems, evaporative microdroplets on circular micropillars that yielded hemisphere-shaped menisci were modeled to validate the results from Fluent as described above. The total evaporation rates of microdroplets on circular pillar structures using Popov's model in MATLAB and using the Schrage model in Fluent were $0.936 \times 10^{-13}$ kg/s and $1.31 \times 10^{-13}$ kg/s, respectively. These differences between the two result was likely due to assumptions associated with Popov's model, which neglects the effects of microconvection within the droplet and non-uniform vapor concentration at the interface, both of which decrease the total evaporation rate.

Figure 34:
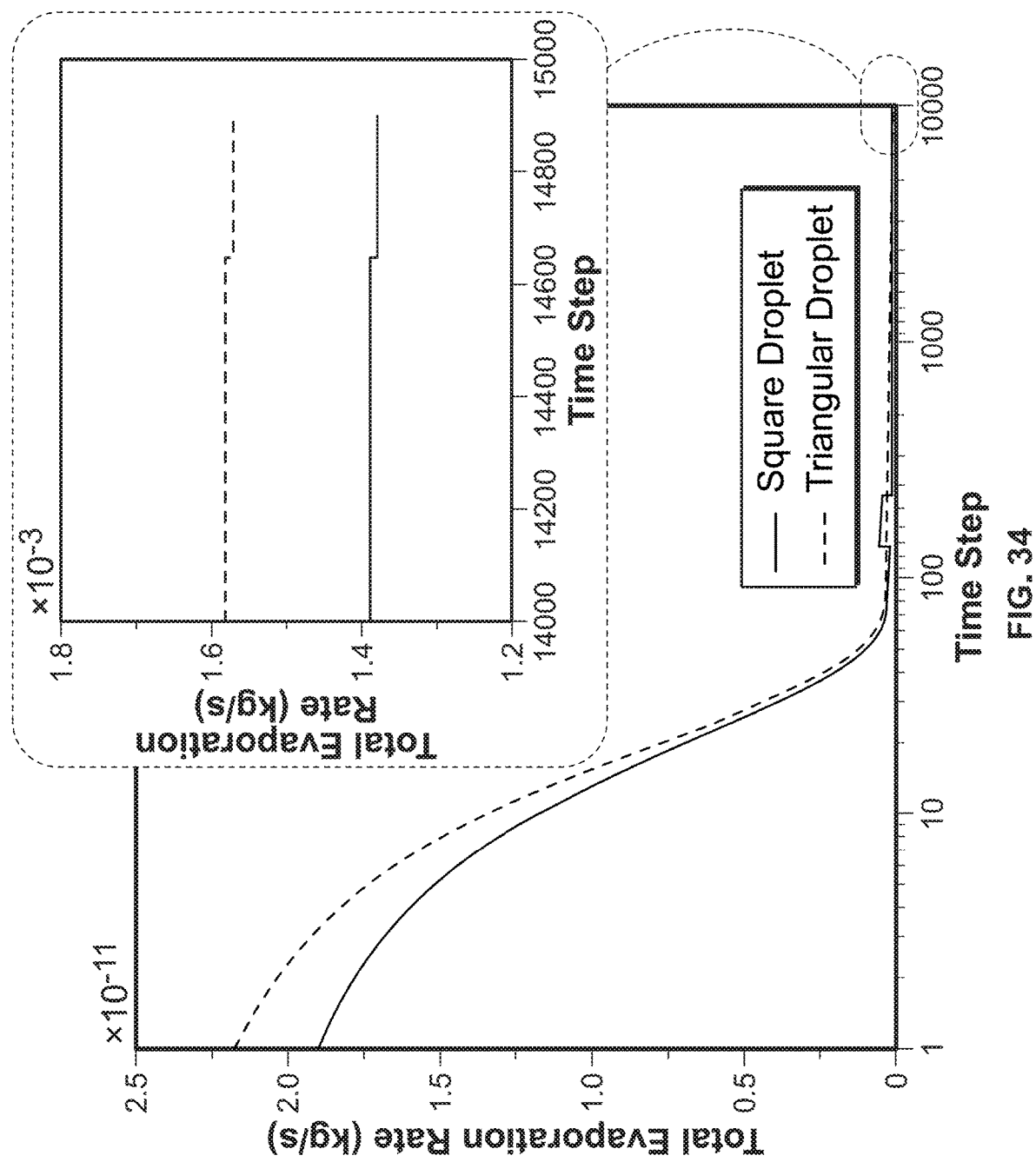
FIG. 34 is a graph of the change in total evaporation rate for the triangular and square droplets as a function of time during a transient simulation.
Figure 35A:
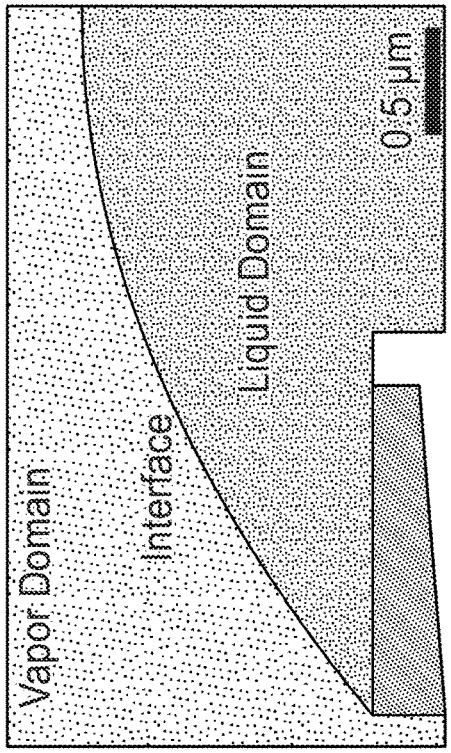
FIGS. 35A-35D are a series of the cross-section profiles of droplets confined on triangular and square micropillars after an equilibrium geometry was obtained.
Figure 35B:
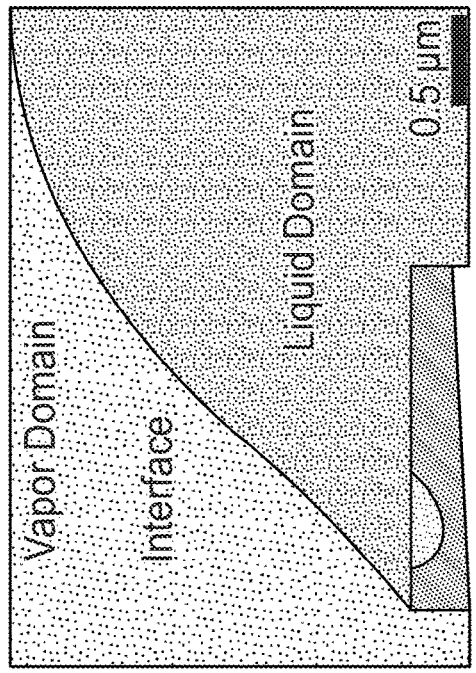
Figure 35C:
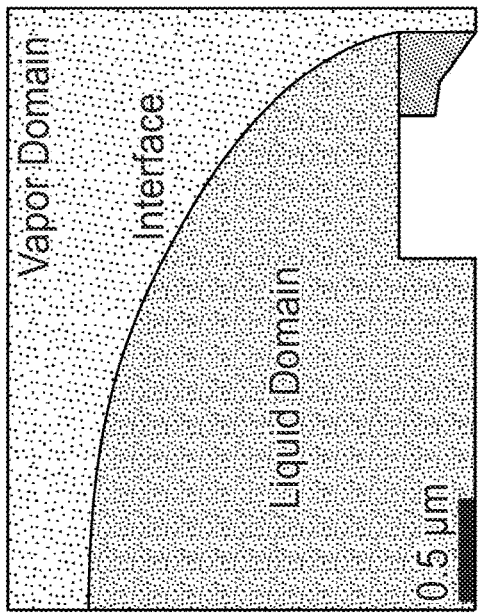
Figure 35D:
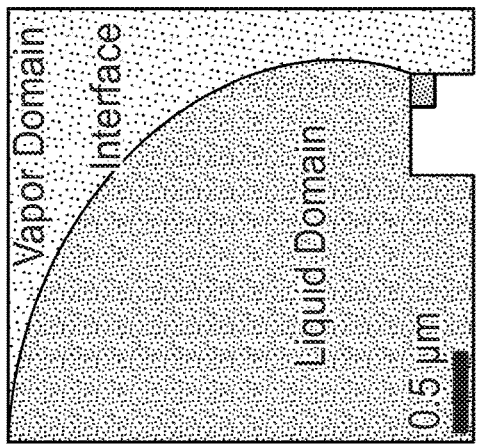

The change in total evaporation rate for the triangular and square droplets as a function of time during the transient simulation are shown in FIG. 34. At the beginning stages, the vapor fraction in the gas domain was very small and evaporation from the interface was not suppressed by the vapor diffusion. As a result, initial and total evaporation rates for both cases were around $2^{-11}$ kg/s. As the vapor fraction in the gas domain increased over time, evaporation was hindered by vapor diffusion, resulting in a gradual decrease in the total evaporation rate for both droplets. After the vapor concentration reached an equilibrium condition late in the simulation, the evaporation rates from the droplet surfaces were the same as the vapor diffusion rates, leading to stable total evaporation rate representing the evaporating behavior of the droplets at the equilibrium state.

Since the droplet geometry on triangular and square micropillars was not axisymmetric, the simulation results were assessed on cross-section planes with three different azimuthal angles. The azimuthal angles α were chosen to be 0°, 20°, and 40° for the square case and 0°, 30°, and 60° for the triangular case, respectively. FIGS. 35A-35D show the cross-section profiles of droplets confined on triangular (FIGS. 35A and 35B) and square (FIGS. 35C and 35D) micropillars after an equilibrium geometry was obtained. For axisymmetric droplets, the apparent contact angle $\theta_{ap}$ varied significantly along the triple phase contact line (TPL). Depending on the azimuthal angle, the cross-section meniscus exhibited either a hydrophilic (i.e., $\theta_a$<90°) or a hydrophobic (i.e., $\theta_a$>90°) characteristic along the microdroplet. Also, the cross-section contours revealed a complex change of curvature from the top of the droplet to the contact line region. While the 2D profiles did not provide a full description of the meniscus profile and local curvature on the 3D interface, it was observed that the contact angle measured at a small azimuthal angle position (α=0°) was significantly larger than the corresponding contact angle measured at a large azimuthal angle position (α=45°). The larger contact angle resulted in stronger suppression to vapor diffusion and therefore a smaller evaporation rate at the contact line region. Therefore, it was expected that the evaporation rate would continue to increase at higher azimuthal angles due to the decrease in contact angle.

While it appeared from the 2D profile shown in FIGS. 35A-35D that the menisci at smaller azimuthal angles were more curved compared to corresponding menisci at larger azimuthal angles, the menisci taken at large azimuthal angles were actually located at sharp corner locations of the non-axisymmetric geometries (i.e., the corner points of the triangle and square). Therefore, these menisci resembled the boundary edge lines between two adjacent surfaces of the non-axisymmetric droplet and possessed much higher curvatures compared to the menisci taken at small azimuthal angle (i.e., crossing the center of the sides of the triangle or square). A convex meniscus with higher curvature facilitated stronger evaporation and vapor diffusion due to the larger Laplace pressure and higher local concentration gradient. Therefore, higher local curvature also induced stronger evaporation rates at locations with higher azimuthal angles. The combined effects of smaller contact angle and higher local curvature at locations with high azimuthal angle contributed to significantly higher local evaporation rates at these locations. Consequently, the triangular and square micropillars exhibited highly non-uniform evaporation over the whole droplet characterized by enhanced local evaporation near edge locations and suppressed local evaporation near the center locations of the microdroplet.

Unlike a planar substrate, where the solid wall geometrically confines vapor diffusion into the ambient atmosphere, the micropillars described above exhibited a 90° sharp edge at the contact line region, and therefore did not induce significant vapor diffusion impedance. For all azimuthal angles, the highest local saturated vapor pressure was always observed at the contact line region. This high local vapor pressure induced a vapor concentration gradient near the contact line region and therefore promoted faster vapor diffusion from the contact line to the ambient atmosphere. Consequently, the local evaporation flux along the cross-section profile of a droplet on a micropillar was always the highest near the contact line region in this study regardless of the azimuthal angle. However, whether such characteristic is sustained for droplets with an apparent contact angle exceeding 90° over all azimuthal angles remains to be characterized. Since the contact line region was no longer subjected to wall confinement, it was anticipated that the evaporation rate may still be highest near the contact line even for larger droplets.

For microdroplets with the same liquid-vapor interfacial area, the total evaporation rate of a triangular droplet was 14.3% higher than that of a square droplet, and the total evaporation rate of a square droplet was 5.2% higher than that of a capped spherical droplet. This phenomenon was attributable to the effects of radial curvature and azimuthal curvature associated with micropillar geometry.

Figure 36:
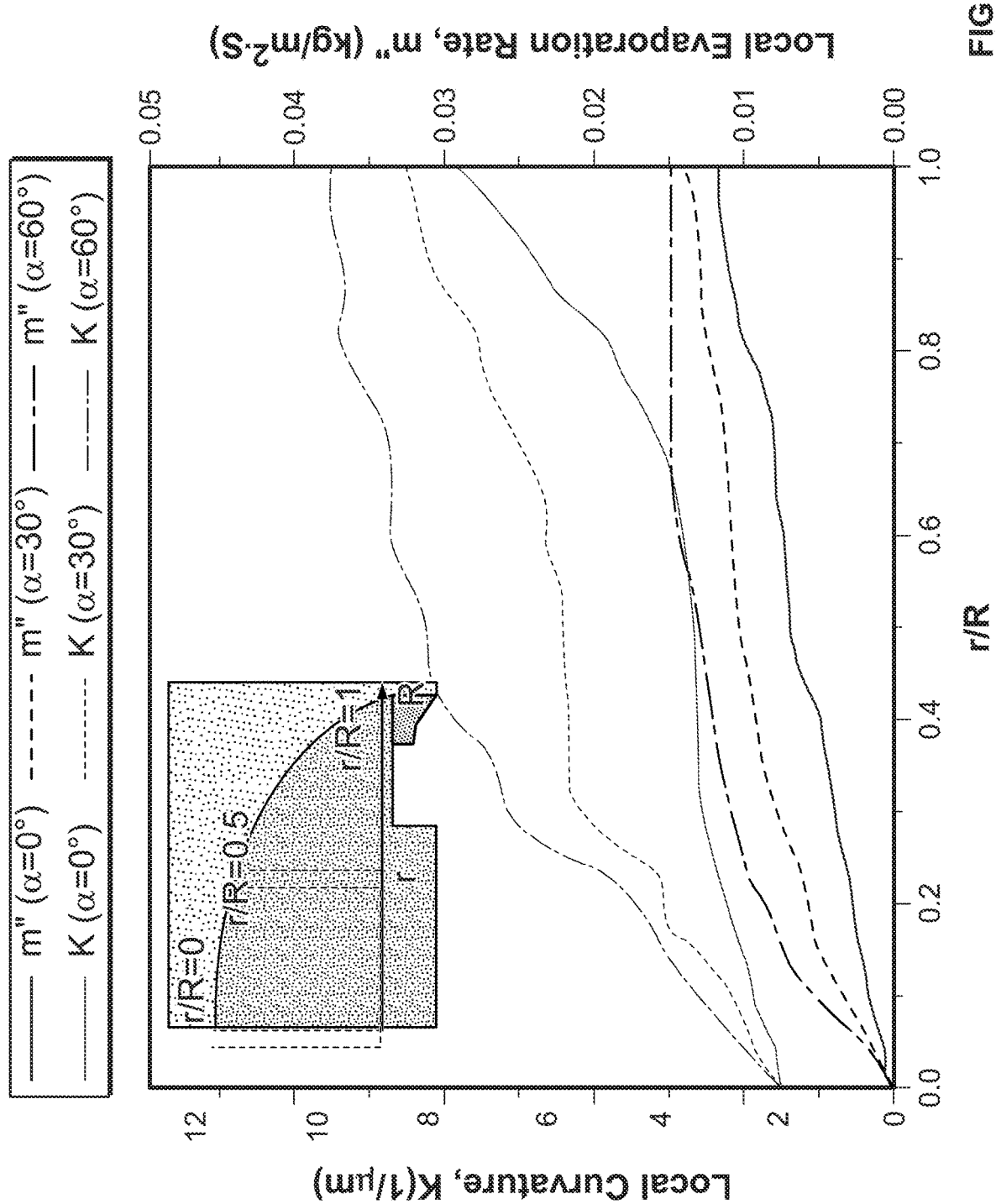
FIG. 36 is graphical plot of the local evaporation flux along a droplet interface along the radial location on the droplet interface for three azimuthal angles for a droplet pinned on a triangular pillar.
Figure 37:
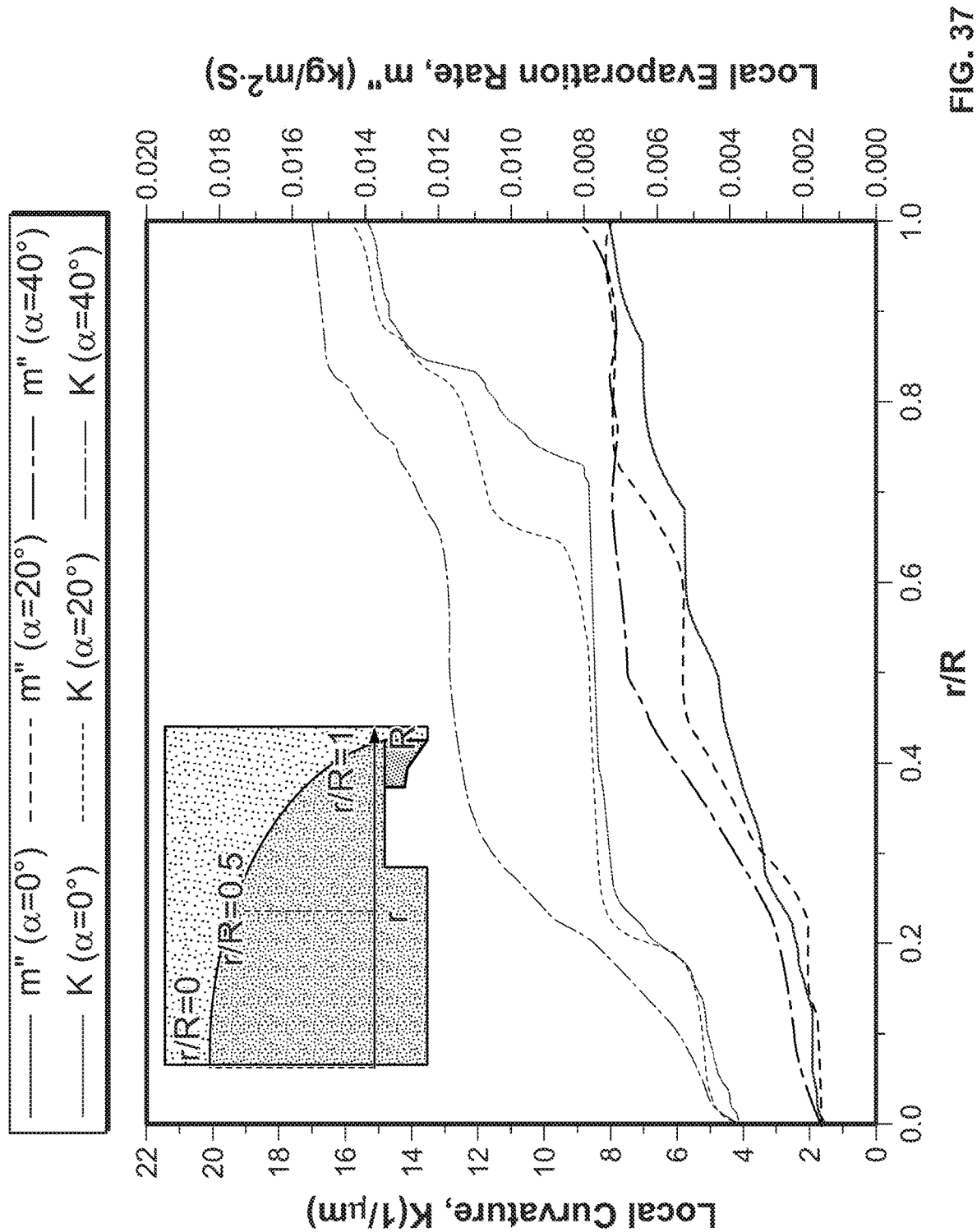
FIG. 37 is a graphical plot of the local evaporation flux along a droplet interface along the radial location on the droplet interface for three azimuthal angles for a droplet pinned on a square pillar.

The local evaporation flux along the droplet interface was plotted along the radial location on the droplet interface for three azimuthal angles, as shown in FIG. 36 (for a droplet pinned on a triangular pillar) and FIG. 37 (for a droplet pinned on a square pillar), where the radial location, r, was normalized by the droplet radius, R. The local curvature was calculated by the MATLAB curve fitting tool. The local evaporation mass flux was compared with the local curvature on a 3D curved interface.

For a triangular droplet (see FIG. 36), at the same azimuthal angle, the evaporation rate increased monotonically from the top of the droplet to the contact line region, which was accompanied by an increase in local curvature. For a square droplet (see FIG. 37), the rise of the local evaporation rate slowed when approaching the contact line, in accordance with the observed trend of curvature change. For the square confined microdroplet, at relatively small angles the curvature varied significantly along the interface. However, as azimuthal angle increased, the curvature near the contact line approached a constant value because the meniscus transformed from a distorted sphere-like shape into a cone-like shape. For these cases, the evaporation flux change near the contact line was affected only by the geometrical confinement.

For a fixed radial distance, the liquid tended to evaporate faster with increasing azimuthal angles, i.e., moving from the flat region to the corner region on the contact line. This trend was observed to closely match the change of local curvature in the azimuthal direction. Consequently, the azimuthally inhomogeneous curvature distribution contributed to the evaporation variation near the contact line region. The abrupt change of surface geometry enforced the increase in meniscus curvature along the contact line, leading to enhanced evaporation. This effect was especially prominent for the triangular microdroplet because the sharper corner triggered larger vapor concentration gradient.

The total evaporation rates from microdroplets with different geometries at an ambient temperature are summarized in Table 6.

TABLE 6

Total evaporation rate of droplets on different shapes of micropillars

|  | Hemispherical Droplet | Triangular Droplet | Square Droplet |
|---|---|---|---|
| Total evaporation rate (kg/s), M | $1.31 \times 10^{-13}$ | $1.57 \times 10^{-13}$ | $1.38 \times 10^{-13}$ |

Figure 38:
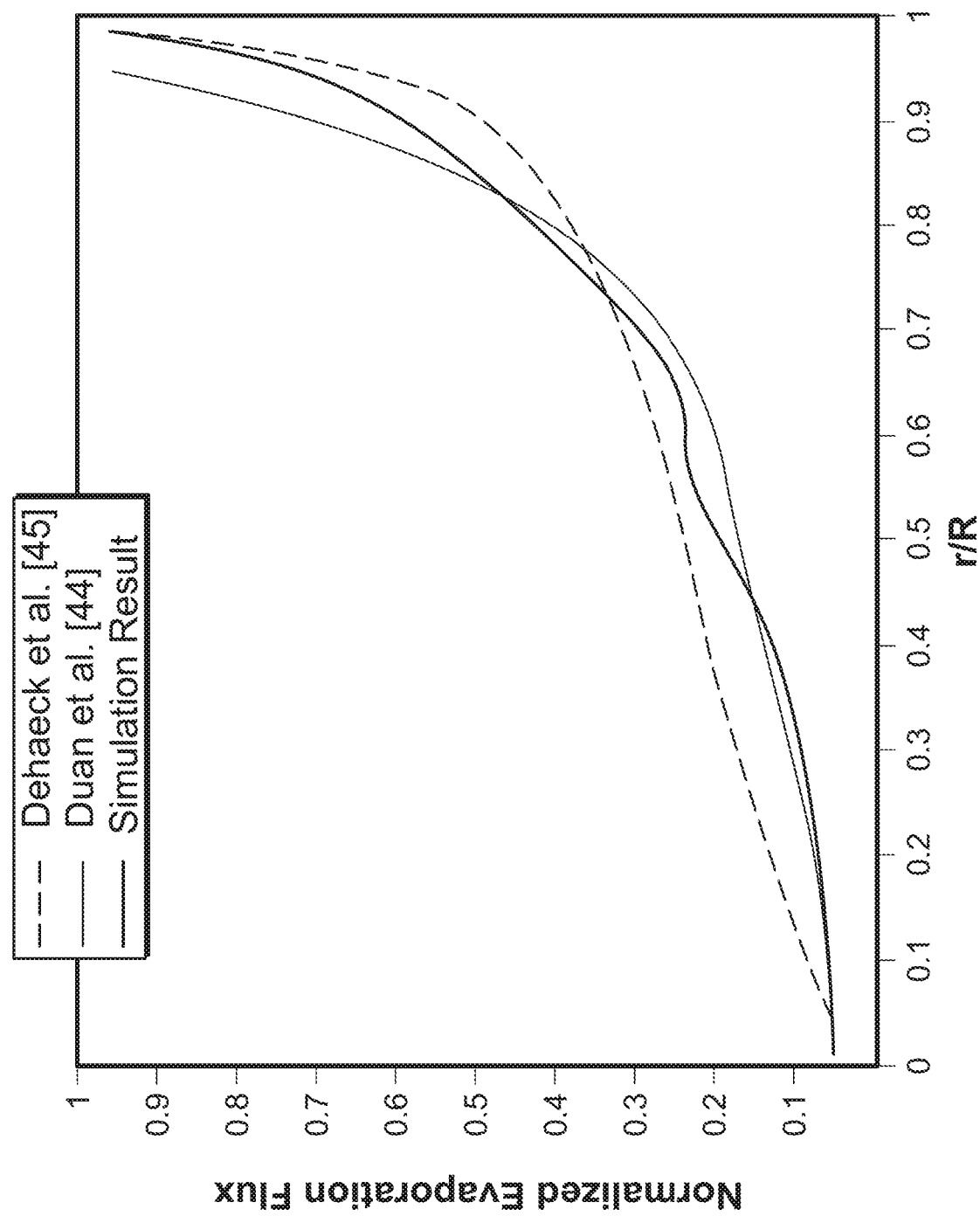
FIG. 38 is a graph comparing the local evaporation flux along the liquid-vapor interface of droplets on circular micropillars.

Referring to Table 6, the evaporation rate of droplets on square micropillars was 5.4% larger than that on circular micropillars. Further, the evaporation rate of droplets on triangular micropillars was 20% larger than that on circular micropillars. FIG. 38 compares the local evaporation flux along the liquid-vapor interface of droplets on circular micropillars simulated as described above to corresponding results from existing experimental studies. To compare the distribution of local evaporation rate under different simulation and experimental conditions, all the data were normalized with respect to the maximum local evaporation rate obtained at r/R=1. Referring to FIG. 38, the local evaporation flux distributions of all three cases followed the same trend where the local evaporation rate increased monotonically from the center of the droplet towards the edge of the droplet. This trend was in accordance with the general evaporation characteristics observed for hydrophilic droplets (i.e., $\theta_e$<90°). However, the comparison illustrated in FIG. 38 revealed significant deviations between the local evaporation flux curves obtained from the different studies due to the variation in the evaporation conditions (e.g., working fluid, environmental condition, substrate profile). In particular, the simulation described above assumed evaporation of droplets deposited from vertical micropillars projecting from a substrate as described above, while the previous experimental results were obtained using droplets deposited on planar surfaces.

Without being limited to any particular theory, evaporation of droplets from planar substrates is thought to prohibit the diffusion of vapor in a downward direction, resulting in reduced total evaporation rate and reduced local evaporative flux near the triple phase contact line (TPL). By contrast, during evaporation off droplets on a vertical micropillar, the vapor is thought to diffuse partially in the downward direction at the TPL, yielding both an enhanced local evaporation rate at these regions and a higher total evaporation rate. At present, the relative contributions of meniscus curvature and wall confinement effects to evaporation enhancement remains uncharacterized.

The results of these experiments indicated that the evaporation characteristics of non-axisymmetric droplets deviated from the corresponding evaporation characteristics of symmetric spherical droplets, and further found that local evaporation rate was strongly dependent on the local curvature of the droplet. Specifically, it was found that the surface tends to curve more sharply near both the contact line region (i.e., r/R~1) and near the sharp corner regions (i.e., α~40° for a square micropillar, and α~60° for a triangular micropillar), and local evaporation rates were found to be highest near these regions. The curvature effect was also observed in the global transport characteristics, where the total evaporation rates from droplets with triangular and square contact areas were 14% and 8% higher than that from a capped spherical droplet, respectively. While by nature a sphere exhibits the smallest mean curvature with a fixed surface area, it was intriguing the droplets with pinned non-spherical contact areas had higher mean surface curvatures relative to capped spherical droplets, which promoted higher evaporation transport. Additional simulations of evaporation behavior of microdroplets with varied volumes, heated substrates, and complex geometries may further advance the characterization of curvature and wall confinement effects on evaporative cooling performance.

Example 2: Microscale Pinning/De-Pinning of Droplet Contact Lines Advancing Along Sharp Edges with Varying Angle and Roundness To assess the characteristics of microdroplet pinning and unpinning along sharp substrate edges on a microscale, the following experiments were conducted.

Figure 39:
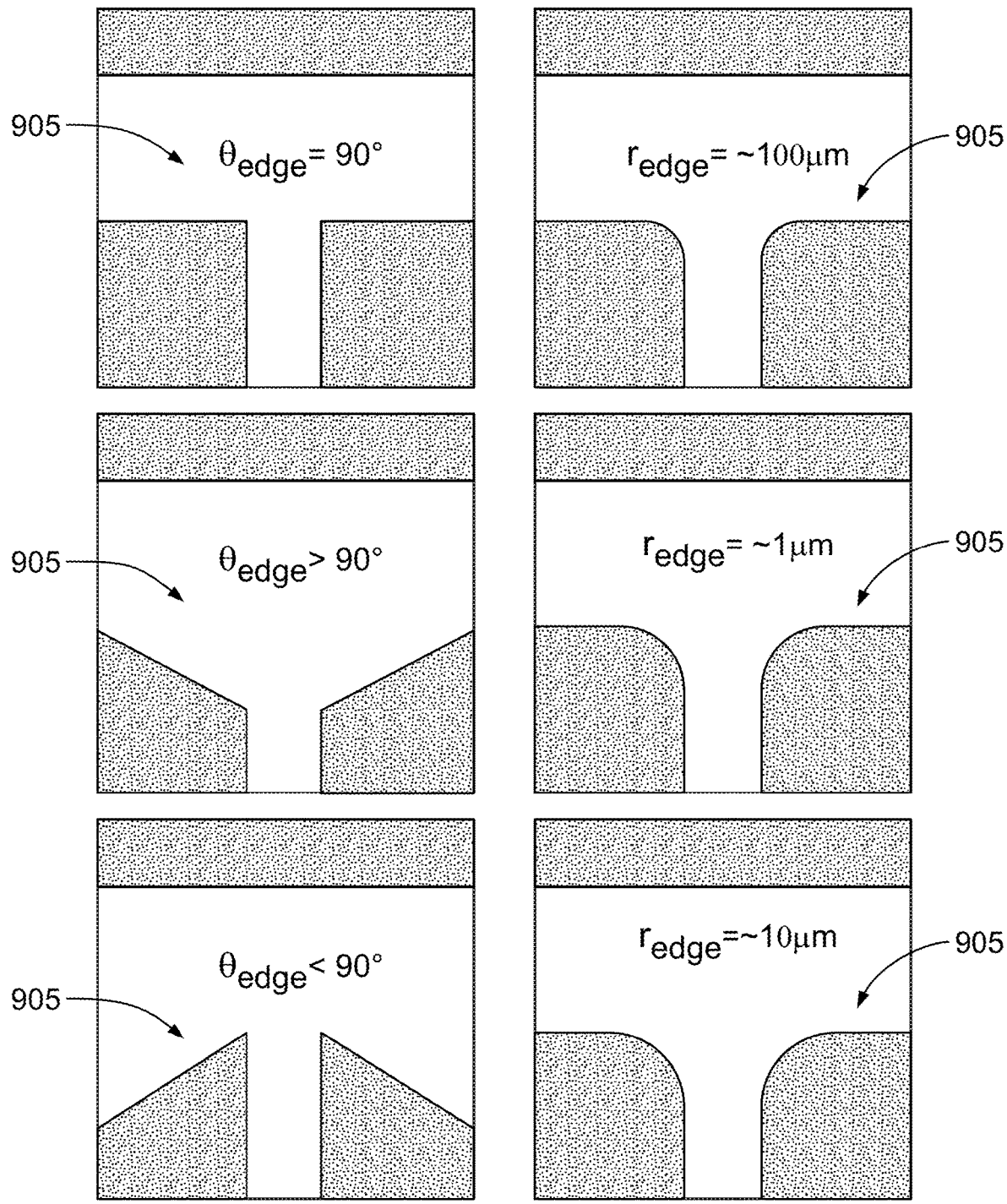
FIG. 39 is a series of schematic cross-sectional views of pillars with geometric edge features with different edge angles and roundness fabricated using lithography and etching techniques to produce different edge angle and roundness features.

Geometric edge features 905 with different edge angles and roundness were fabricated using lithography and etching techniques to produce different edge angle and roundness features. Specifically, T-shaped microchannels were fabricated on a plain silicon substrate with acute, right, or obtuse turning angles as shown in FIG. 39. The edge radius of curvature at these sharp edges was varied from ~100 nm, ~1 μm to ~10 μm by changing the photolithography mask and controlling the developing/etching process. In order to achieve the high resolution (<1 μm) to distinguish the different degrees of roundness, laser scanning lithography was used to produce the target feature on the deposited photoresist material. By employing a laser scanning confocal microscope, the photoresist was be aligned and patterned with an accuracy of up to 250 nm. After the microchannel was formed, the substrate surface was functionalized with different chemicals to achieve different surface characteristics (e.g., superhydrophilic and superoleophobic). The functional coatings are provided at a uniform thickness by a continuous and smooth deposition of corresponding chemicals at the evaporation interface. The geometry of the microchannels and the quality of the nanocoatings were examined under scanning electron microscope (SEM), transmission electron microscope (TEM), atomic force microscope (AFM), and Raman spectroscopes.

High-speed visualizations of liquid propagating through the microchannel were obtained using both an optical microscope in the ambient environment and an environmental scanning electron microscope (ESEM). The advantage of an ESEM compared to standard SEMs was that the pressure of the sample vacuum chamber could be separated from the pressure of the beam leading vacuum chamber, therefore providing for sufficiently high working pressure such that water can remain in a liquid state. For both visualization tests, the microchannel was assembled on a liquid feed manifold connected to a micro-injector that provided a continuous inlet flow. Three different flow rates were examined, which corresponded to capillary numbers (Ca) of 0.001, 0.01 and 0.1. Under high Ca, the meniscus exhibited distorted geometry in overcoming the edge structure. For open-air experiments, a pressure transducer was connected to the liquid feed manifold to capture the change in liquid pressure as the meniscus advanced through the edge features. For in-situ tests using ESEM, a customized testing manifold for capturing the contact line dynamics at nano-length scale as the contact line advances continuously along a highly curved edge with finite length was built. A Peltier cooling stage was embedded in the manifold to control the sample temperature below the water dew point at the working pressure. Contact line movement over edge geometry was observable regardless of the magnitude of the radius of curvature. In either case, the local contact angle remained constant along the local geometry.

Example 3: Microdroplet Evaporation from a Hollow Micropillar

Figure 40:
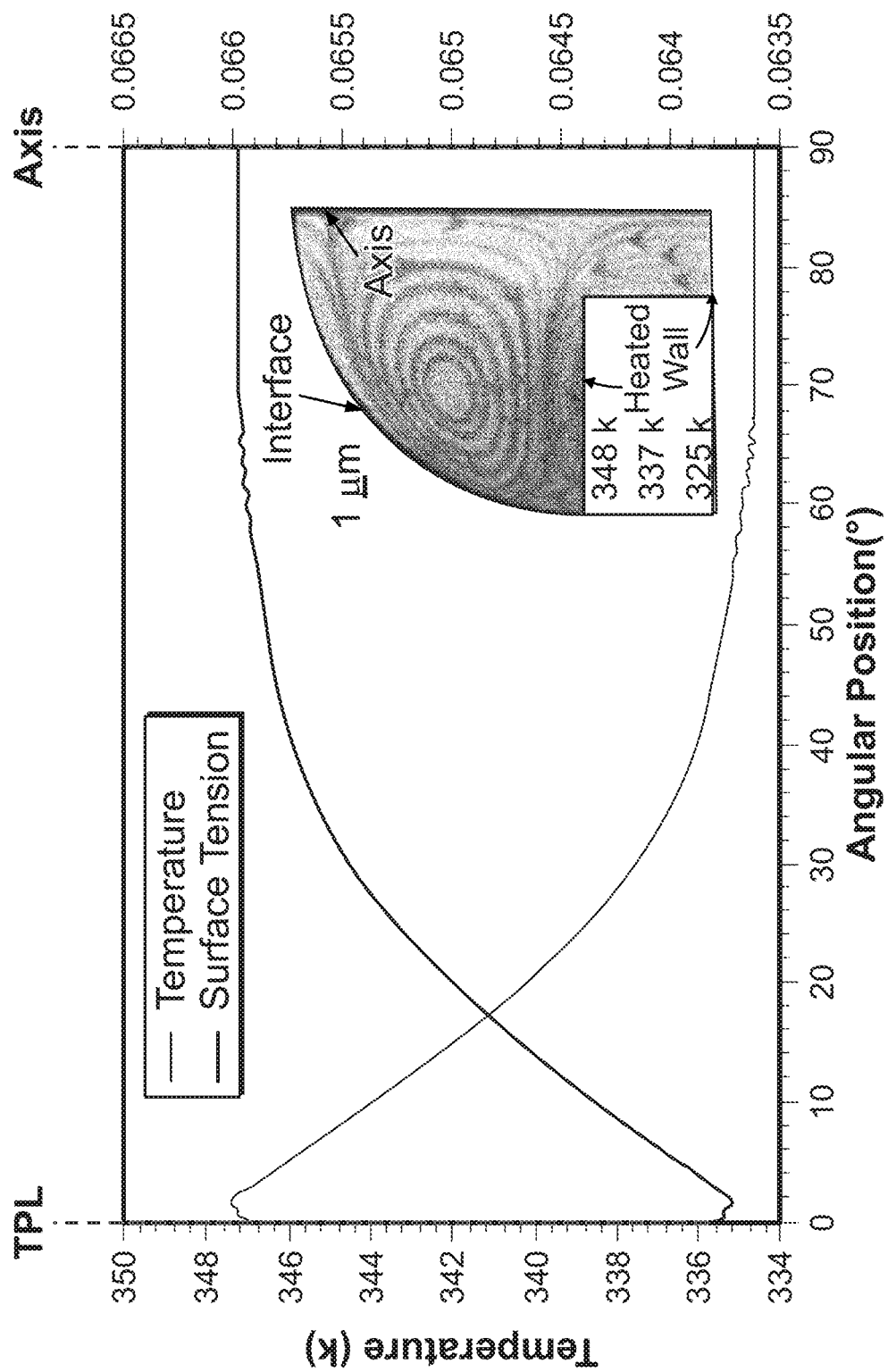
FIG. 40 is a graph comparing a triple-phase contact line (TPL) in to the axis of a micropillar.
Figure 41:
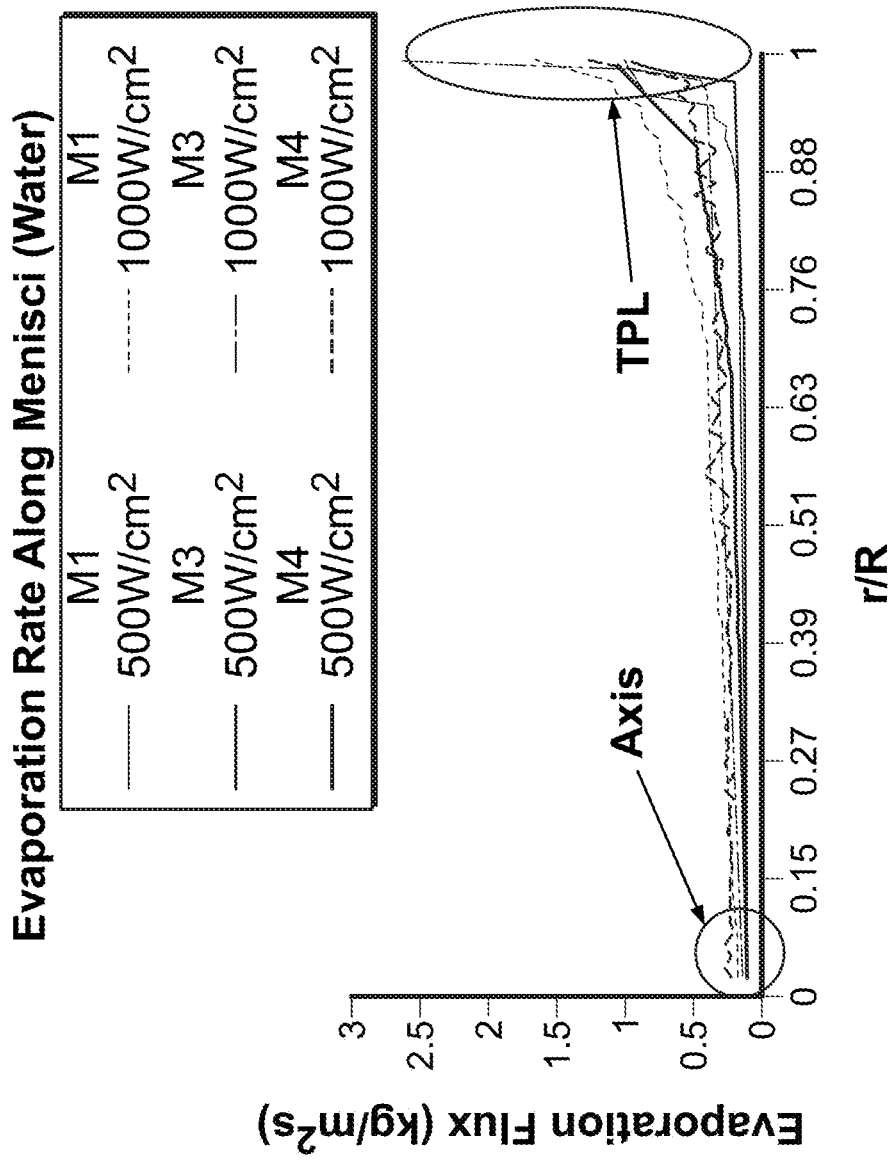
FIG. 41 is a graph of the evaporation rate along the menisci (water) and comparing the triple-phase contact (TPL) line to the axis of the micropillar.

A multiphase flow numerical simulation for observing microdroplet evaporation from a hollow micropillar was demonstrated. Factors in modeling droplets included vapor domain, liquid domain, pressure outlet, vapor diffusion, heat flux wall, axis, and the liquid-solid barrier. Measurements taken included temperature, surface tension, and angular position and observing the triple-phase contact line (TPL) in association to the axis of the micropillar (see FIG. 40). The evaporation rate along the menisci (water) was demonstrated observing the triple-phase contact (TPL) line in association to the axis of the micropillar as well (see FIG. 41). The average transfer coefficient versus the boundary heat flux were calculated (see FIG. 41). It was concluded that the evaporation from thin-film droplet allowed for average heat transfer coefficient exceeding $10^6$ W m$^{-2}$ K$^{-1}$ (table below). The highest rate of evaporation was located at the TPL. Models of different temperature contours for all the steps of evaporation including wicking, pivoting, retention, and expansion were created that demonstrate the interface as well as the TPL. Other types of simulations like molecular dynamics (MD) simulations were conducted to further demonstrate microdroplet evaporation.

TABLE 7

Average Heat Transfer Coefficient for Models

| Boundary | Average heat Transfer coefficient (W/m$^2$K) | | | |
|---|---|---|---|---|
| Heat Flux | Water M1 | Water M2 | Water M3 | Water M4 |
| 500 W/cm$^2$ | 1.64 × 10$^6$ | 4.40 × 10$^6$ | 1.29 × 10$^6$ | 3.99 × 10$^6$ |
| 1000 W/cm$^2$ | 7.68 × 10$^6$ | 9.77 × 10$^6$ | 4.65 × 10$^6$ | 5.13 × 10$^6$ |

Example 4: Macroscale Flow Behavior of Liquid Advancing Over Textured Surfaces and Through Porous Medium To explore the macroscale flow behavior of liquid advancing over textured surface and through porous medium, the following experiments will be conducted. The wetting resistance of liquids spreading on textured surfaces will be measured as described below.

The spread of liquids on surface provided with an ensemble of sharp edge features will be quantitatively measured. Textured surfaces patterned with arrays of square micropillars will be generated using existing positive photolithography techniques and deep reactive ion etching. FIG. 17 shows an example of a re-entrant nanopillar array fabricated on a silicon substrate with pillar diameter less than 500 nm following this technique. The surfaces will be functionalized with polyhedral oligomeric silsesquioxanes (POSS) to yield a superomniphobic wetting characteristic, or will be further treated with O$_2$ plasma to yield a superomniphilic wetting characteristic. Advancing and receding contact angles of water and oil on the textured surface will be measured with a goniometer by feeding and extracting the liquid with a syringe pump at different flow rates. The macroscale pinning/depinning forces will be measured using a tensiometer. The procedure will include first holding a liquid droplet with a fixed volume at one end of a force balance and then slowly lowering the drop onto a test surface until a small compressive force (e.g., 1 nN) is measured to indicate the onset of surface contact. The pinning force will then be measured by slowly pushing the droplet in a horizontal direction until an abrupt change in force is observed, indicating a detachment from the previous surface. A statistical mechanics model will be developed based on the wetting resistance observed over the single edge, to represent both the geometric and force measurements of liquid propagating on the micropillar array patterned surface.

A structured microchannel with well-defined sharp edge features to mimic a porous medium will be fabricated. The fabrication will follow the procedure described above to etch microchannel patterns into a silicon substrate. Subsequently, a poly-di-methyl-siloxane (PDMS) substrate will seal the front side of the etched silicon to form closed flow channels. The pore and microchannels will be initially filled with oil, and then water will be injected from one end of the test assembly, forcing the pre-wetted oil to exit through the outlet located at the opposite end of the test assembly. A dynamic imaging and pressure response of the displacement process will be captured using a high-speed camera and a pressure transducer, respectively. The transient behavior for fluid flow at pore-level, i.e., passing through a pore neck into a wider pore, will follow the same principles as described above for the contact line dynamics of liquid wetting through one single edge feature. The macroscopic transport behavior will modeled following a statistical analysis, where the mean flow resistance will be calculated by integrating the wetting resistance at each pore junction over the water-oil interface.

Example 5: Microscale Pinning/De-Pinning Behavior of Liquid Contact Lines of Microdroplets To investigate the microscale pinning/de-pinning behavior of liquid contact lines advancing along a sharp solid edge with varying wettability, angle and roundness, and to explore the macroscale flow behavior of liquid advancing over a textured surface modified with nanomaterials selected to modify the wetting profile, the following experiments will be conducted.

Artificial solid edge features with a range of wetting characteristics through surface engineering will be fabricated. The flow of aqueous and organic solvents over the edge feature with well-controlled velocity will be manipulated using a digital microfluidic (DMF) device, and the transient behavior of the liquid contact line wetting over a solid edge which occurs within a few microseconds at sub-micrometer length scale will be visualized. The experiments described below will advance the science of the complex TPL region of an advancing liquid droplet on a solid surface, will provide specific details for the characterization of such materials, and will potentially reveal additional methods for controlling wettability in technological applications.

The capability for in-situ liquid cell TEM enabling direct observation of the nano-scale pinning/depinning behavior of advancing liquid contact lines will be developed. Advanced contact angle experiments using digital microfluidics and the deposition of complex hybrid material interface structures will be conducted. Coating technologies compatible with microfabricated devices that can deposit a wide range of nanomaterials (e.g., graphene, self-assembled monolayers, and metal-organic chalcogenolate assemblies) will be developed for subsequent analysis. The deposition will be performed by chemical vapor deposition (CVD) or vapor solid growth (VSG), depending on the compound in will be tuned from ~37° to ~68° with graphene coatings of different thicknesses. The resulting materials will be characterized using standard static contact angle techniques.

T-shaped silicon microchannels with different geometries will be fabricated Exfoliated graphene will be deposited onto channel surfaces to produce a representative sample. Self-assembled monolayers will also be deposited within the channels, but the texture of the supporting metals may be incommensurate with measurements of advancing liquid contact lines. Deposition of MOCHA, a hydrophobic, layered semiconducting interface will be conducted. These MOCHA materials will be deposited directly by depositing silver metal, oxidizing it to the silver oxide, and converting it to the functional hybrid material subsequently using benzeneselenol vapor.

An optoelectrowetting digital microfluidic (DMF) device for manipulating the advancement of the liquid contact line along the solid edge will be fabricated. The evolution of the meniscus will be observed by the optical microscope. In this scheme, droplet actuation force will be determined from capacitive feedback from the DMF device from which the wetting characteristics of the interface will be extracted.

Example 6: Analytical Predictions

Figure 42:
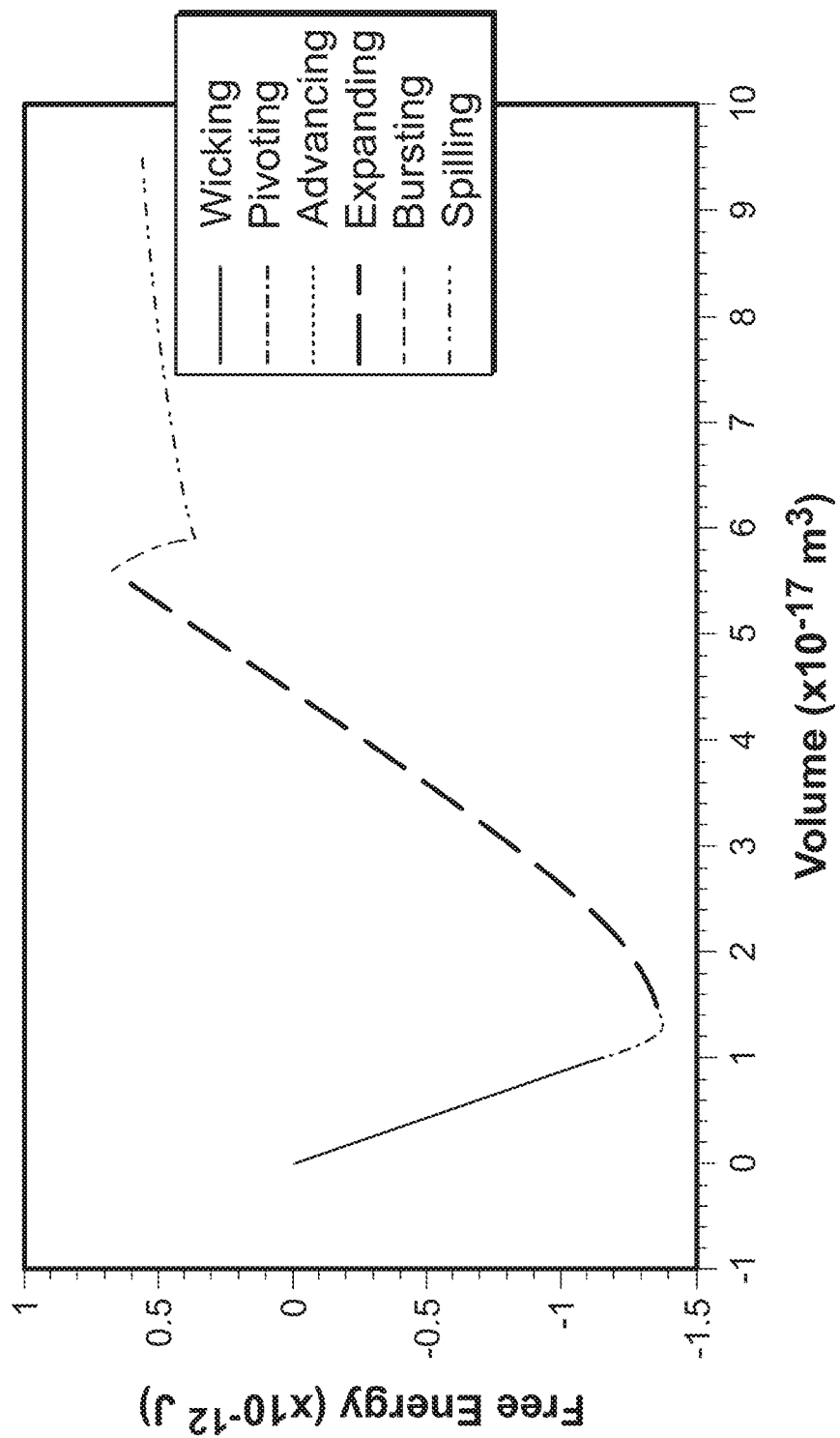
FIG. 42 is a graph of analytically predicted liquid free energy as liquid flows through a single hollow micropillar.

FIGS. 42 and 43 show the analytically predicted liquid free energy and pressure variation as liquid flows through a single hollow micropillar. The predictions were made based on a quasi-static assumption which neglects any viscous, gravitational, or other dynamic effects. The dotted red line represents the instantaneous bursting moment, accompanied by a sudden jump in liquid free energy and pressure. The main sections of FIG. 43 are wicking through the inner micropillar, pivoting from a concave to convex shape along the inner pillar edges, advancing along the top micropillar surface and pinning along the outer pillar edge, expansion of the meniscus beyond a hemisphere along the outer pillar edge, and bursting (i.e., droplet collapse). The meniscus initially wicks through the micropillar, which leads to a constant increase in the solid-liquid interfacial area and a decrease in the liquid-air interfacial area. Since the interfacial energy between the solid and liquid is far smaller than that between the liquid and air, there is a constant decrease in total free energy, which corresponds to a constant negative Laplace pressure (see FIG. 43, part i). As the meniscus flows to the top micropillar surface, it pins along the inner pillar edge with an inner diameter, d. At this point, the meniscus pivots from a concave to convex shape, which results in a transition from negative to positive Laplace pressure (see FIG. 43, part ii). After formation of the intrinsic contact angle, $\theta_y$, with respect to the top micropillar surface, a discernable pressure drop occurs. This pressure drop is attributed to the advance of the contact line from the inner edge toward the outer edge, during which an increase in the radius of curvature leads to reduced Laplace pressure across the liquid-vapor interface (see FIG. 43, part iii). Once liquid wets the edge, an increase in liquid pressure is observed due to the increase in the contact angle. The maximum pressure is obtained when the liquid forms a hemisphere (see FIG. 43, part iv). As liquid expands further beyond a hemisphere while being pinned on the edge, a slight decrease in pressure is observed due to increase in radius of curvature. Once the burst criterion is reached (see FIG. 43, part v), the liquid collapses spontaneously and a sharp decrease in pressure is observed. A small pressure is required to drive the liquid to spread freely on the substrate.

Example 7—Molecular Dynamics Model

In various aspects, molecular dynamics (MD) simulations explain the molecular origins of wetting barriers at sharp edges. In particular, MD simulations show a wetting barrier induced by the molecular interactions between the solid wall and a small amount of liquid in the vicinity of the contact line region. In the MD simulation, an initial molecular configuration is established by placing a small cubic water molecule on a solid substrate with a sharp edge. When the system is relaxed in an isobaric-isothermal ensemble, the liquid equilibrates itself by spreading on the substrate and forming a capped sphere pinned at the sharp edge. A small extra amount of liquid molecules may be added to the existing liquid domain, leading to an increase in the contact angle at the contact line region once the system reaches a new equilibrium state. With continuous addition of liquid molecules, the bulk liquid eventually breaks the edge boundary and flows toward the adjacent surface. During the MD simulation, the positions and velocities of each individual atom and molecule are numerically calculated by solving Newton's equation of motion. The forces between particles and the potential energy of the overall system are determined by using interatomic potentials or molecular force fields. The overall potential energy in the system includes bonded terms for inter-atomic interactions linked by covalent bonds, and non-bonded terms for inter-molecular forces:

$$E_{total}=E_{bonded}+E_{nonbonded} \quad \text{Eqn. (42)}$$

The bonded interactions of Eqn. (8) typically include stretching, bending, and torsional terms, which are expressed as follows:

$$E_{bonded}=k_s(r-r_0)^2+k_b(\theta-\theta_0)^2+k_t(1+d\cos(n\varphi)) \quad \text{Eqn. (43)}$$

The standard Lennard-Jones potential, along with Coulomb force interactions, is used for modeling the non-bonded interactions as expressed below:

$$E_{nonbonded} = C\frac{q_iq_j}{r^2} + 4\epsilon\left[\left(\frac{\sigma}{r}\right)^{12} - \left(\frac{\sigma}{r}\right)^6\right] \quad \text{Eqn. (44)}$$

In one aspect, an open-source molecular dynamics simulation software package "Large-scale Atomic/Molecular Massively Parallel Simulator (LAMMPS)" (Sandia National Laboratories) is used to perform the simulation and explore the pinning forces along sharp features with different edge angles.

In various other aspects, a hybrid simulation scheme; is used to investigate the bulk flow behavior over geometric edges. The hybrid simulation scheme solves the mass and momentum conservation equations in the larger liquid domain while solving the atomic trajectory in a smaller domain (near the contact line region), based on the atomic finite element method. A schematic illustration of the entire simulation domain, which is divided into three different regions: a continuum region (C), an atomic region (P), and an overlapped region (O) between the C and P regions. In the C region, the fluid flow is solved numerically based on the standard mass and momentum conservation equations given by:

$$\nabla \cdot u = 0 \qquad \text{Eqn. (45)}$$

$$\frac{\partial u}{\partial t} + \nabla \cdot (uu) = -\frac{1}{\rho}\nabla P + \frac{\mu}{\rho}\nabla^2 u \qquad \text{Eqn. (46)}$$

In the P region, the atomic trajectory is solved using the equations characterizing the MD simulation described above. In the O region, a coupling scheme is adopted to maintain conservation of momentum across the P and C regions. Specifically, the mean momentum in the P region is set equivalent to the instantaneous macroscopic momentum in the C region by applying an external force proportional to the momentum difference on each individual atom within the overlapping region, which is expressed as:

$$\frac{F_{i,ext}}{m_i} = \frac{1}{\left(\frac{n}{2}+1\right)}(u_{CFD} - u_{MD}) + \left[\frac{f_i}{m_i} - \frac{1}{N}\sum_{j=1, j \neq 1}^{N}\frac{f_j}{m_i}\right] \qquad \text{Eqn. (47)}$$

where n is the coupling interval, $u_{CFD}$ is the velocity obtained from computational fluid dynamics (CFD) simulation, $u_{MD}$ is the velocity obtained from the MD simulation, $f_i$ is the total intermolecular force experienced by the particle itself, and $f_j$ are the total forces experienced by all other molecules in the overlapping region. Such a simulation predicts the profile of the meniscus and the associated change in liquid pressure while the liquid advances along the solid surfaces with edge features.

The pinning and bursting behaviors of two different working fluids (water and FC-40) may be further assessed using a dynamic simulation method. Comparing the results from the different computational tools allows for determination of the flow regions under which the dynamic effect would impact the liquid retention performance of the hollow micropillar.

In some embodiments, a microstructure heat exchanger for thermal management of at least one power electric device includes an evaporation layer and a liquid delivery layer. The evaporation layer comprises microstructures such as a plurality of hollow micropillars. Each micropillar is configured to receive a continuous flow of a cooling fluid and to evaporate the continuous flow of the cooling fluid from a surface of a droplet maintained on each micropillar. The evaporation layer is configured to thermally couple to at least one electronic device.

Suitably, each micropillar has an non-axisymmetric cross-sectional shape. For example, in some embodiments, at least one of the micropillars is a triangle, a square, and/or any other suitable shape. In some embodiments, some of the micropillars may be circular in cross-section.

The micropillars may receive heat from a heat source such as the electronic device. As described further herein, the non-axisymmetric micropillars may have increased evaporation rates at increased temperatures. For example, in some embodiments, at least one micropillar is heated to a temperature of at least 90° Celsius.

The liquid delivery layer is coupled to the evaporation layer opposite the at least one electronic device. The liquid delivery layer may include, for example, a porous metal material which may include a thermally conductive metal defining a plurality of interconnected pores. The liquid delivery layer is configured to receive the cooling fluid from a source and to deliver the continuous flow of the cooling fluid to each micropillar of the plurality of micropillars.

In some embodiments, a method of evaporating a liquid includes providing a flow of cooling fluid to an evaporation layer comprising a plurality of porous, non-axisymmetric micropillars, and evaporating the continuous flow of the cooling fluid from a surface of a droplet maintained on each micropillar.

Definitions and methods described herein are provided to better define the present disclosure and to guide those of ordinary skill in the art in the practice of the present disclosure. Unless otherwise noted, terms are to be understood according to conventional usage by those of ordinary skill in the relevant art.

In some embodiments, numbers expressing quantities of ingredients, properties such as molecular weight, reaction conditions, and so forth, used to describe and claim certain embodiments of the present disclosure are to be understood as being modified in some instances by the term "about." In some embodiments, the term "about" is used to indicate that a value includes the standard deviation of the mean for the device or method being employed to determine the value. In some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the present disclosure are approximations, the numerical values set forth in the specific examples are reported as precisely as practicable. The numerical values presented in some embodiments of the present disclosure may contain certain errors necessarily resulting from the standard deviation found in their respective testing measurements. The recitation of ranges of values herein is merely intended to serve as a shorthand method of referring individually to each separate value falling within the range. Unless otherwise indicated herein, each individual value is incorporated into the specification as if it were individually recited herein.

In some embodiments, the terms "a" and "an" and "the" and similar references used in the context of describing a particular embodiment (especially in the context of certain of the following claims) can be construed to cover both the singular and the plural, unless specifically noted otherwise. In some embodiments, the term "or" as used herein, including the claims, is used to mean "and/or" unless explicitly indicated to refer to alternatives only or the alternatives are mutually exclusive.

The terms "comprise," "have" and "include" are open-ended linking verbs. Any forms or tenses of one or more of these verbs, such as "comprises," "comprising," "has," "having," "includes" and "including," are also open-ended. For example, any method that "*comprises," "has" or "includes" one or more steps is not limited to possessing only those one or more steps and can also cover other unlisted steps. Similarly, any composition or device that "*comprises," "has" or "includes" one or more features is not limited to possessing only those one or more features and can cover other unlisted features.

All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the present disclosure and does not pose a limitation on the scope of the present disclosure otherwise claimed. No language in the specification should be construed as indicating any non-claimed element essential to the practice of the present disclosure.

Groupings of alternative elements or embodiments of the present disclosure disclosed herein are not to be construed as limitations. Each group member can be referred to and claimed individually or in any combination with other members of the group or other elements found herein. One or more members of a group can be included in, or deleted from, a group for reasons of convenience or patentability. When any such inclusion or deletion occurs, the specification is herein deemed to contain the group as modified thus fulfilling the written description of all Markush groups used in the appended claims.

All publications, patents, patent applications, and other references cited in this application are incorporated herein by reference in their entirety for all purposes to the same extent as if each individual publication, patent, patent application or other reference was specifically and individually indicated to be incorporated by reference in its entirety for all purposes. Citation of a reference herein shall not be construed as an admission that such is prior art to the present disclosure.

Having described the present disclosure in detail, it will be apparent that modifications, variations, and equivalent embodiments are possible without departing the scope of the present disclosure defined in the appended claims. Furthermore, it should be appreciated that all examples in the present disclosure are provided as non-limiting examples.

Any non-limiting examples are provided to further illustrate the present disclosure. It should be appreciated by those of skill in the art that the techniques disclosed in the examples represent approaches the inventors have found function well in the practice of the present disclosure, and thus can be considered to constitute examples of modes for its practice. However, those of skill in the art should, in light of the present disclosure, appreciate that many changes can be made in the specific embodiments that are disclosed and still obtain a like or similar result without departing from the spirit and scope of the present disclosure.

What is claimed is:

1. A heat exchanger for thermal management of an electronic device, the heat exchanger comprising:
    a liquid delivery layer thermally coupled to the electronic device and configured to receive a liquid from a source; and
    an evaporation layer comprising hollow pillars configured to receive a continuous flow of the liquid from the liquid delivery layer and evaporate the continuous flow of the liquid from droplets maintained on the hollow pillars, wherein each of the hollow pillars has an evaporation surface and a pore, the pore is configured to channel the continuous flow of the liquid through q respective one of the hollow pillars to the evaporation surface, the evaporation surface being configured to maintain a corresponding one of the droplets on the respective one of hollow pillars within a contact line, wherein the evaporation surface has a wetting efficiency of at least 95% and the contact line has a length of less than 0.0314 mm,
    wherein the heat exchanger has a stacked configuration in which the liquid delivery layer is positioned between the evaporation layer and the electronic device.

2. The heat exchanger of claim 1, wherein at least one of the hollow pillars has a non-circular cross-sectional shape.

3. The heat exchanger of claim 1, wherein the liquid delivery layer is a first liquid delivery layer and the evaporation layer is a first evaporation layer, the heat exchanger further comprising a second liquid delivery layer and a second evaporation layer.

4. The heat exchanger of claim 1, wherein the liquid is a dielectric liquid.

5. The heat exchanger of claim 1, wherein the evaporation layer comprises:
    a first surface configured receive the continuous flow of the liquid from the liquid delivery layer; and
    a second surface opposite the first surface, wherein each of the hollow pillars extend from the second surface.

6. The heat exchanger of claim 5, wherein the evaporation surface has a non-circular cross-sectional shape.

7. The heat exchanger of claim 6, wherein at least one of the hollow pillars has a triangular cross-sectional shape.

8. The heat exchanger of claim 6, wherein at least one of the hollow pillars has a square cross-sectional shape.

9. The heat exchanger of claim 5, wherein at least one of the hollow pillars is heated to a saturation temperature of the liquid.

10. The heat exchanger of claim 5 further comprising a nanoparticle coating on the evaporation surface.

11. A method of evaporating a liquid, the method comprising:
    providing a liquid delivery layer thermally coupled to an electronic device, the liquid delivery layer configured to receive the liquid from a source;
    providing a continuous flow of the liquid to an evaporation layer comprising channeling the liquid through the liquid delivery layer toward the evaporation layer, the liquid delivery layer is positioned between the evaporation layer and the electronic device, the evaporation layer comprising hollow pillars, wherein each of the hollow pillars has an evaporation surface and a pore configured to channel the continuous flow of the liquid from the liquid delivery layer to the evaporation surface;
    maintaining a droplet on each of the hollow pillars, each evaporation surface configured to maintain the droplet on a respective one of the hollow pillars within a contact line, each evaporation surface having a wetting efficiency of at least 95%, the contact line having a length of less than 0.0314 mm; and
    evaporating the continuous flow of the liquid from a surface of the droplet maintained on each of the hollow pillars to remove heat from the electronic device.

12. The method of claim 11, wherein the pore is positioned in a center of the evaporation surface, the method further comprising wicking the liquid radially outward from the pore to an edge circumscribing the evaporation surface, wherein the evaporation surface has a non-circular shape.

13. The method of claim 11 further comprising transferring the heat through the hollow pillars to the droplet maintained on each of the hollow pillars, wherein each of the hollow pillars has a nanoparticle coating on the evaporation surface to increase heat transfer from the respective one of the hollow pillars to the droplet.

* * * * *